(12) United States Patent
Davies

(10) Patent No.: US 7,656,003 B2
(45) Date of Patent: Feb. 2, 2010

(54) ELECTRICAL STRESS PROTECTION APPARATUS AND METHOD OF MANUFACTURE

(75) Inventor: Robert Bruce Davies, Tempe, AZ (US)

(73) Assignee: HVVi Semiconductors, Inc, Phoenix, AZ (US)

(*) Notice: Subject to any disclaimer, the term of this patent is extended or adjusted under 35 U.S.C. 154(b) by 301 days.

(21) Appl. No.: 11/467,452

(22) Filed: Aug. 25, 2006

(65) Prior Publication Data

US 2008/0048215 A1    Feb. 28, 2008

(51) Int. Cl.
*H01L 29/47* (2006.01)

(52) U.S. Cl. .............. 257/484; 257/494; 257/E29.012; 257/E29.013

(58) Field of Classification Search .......... 257/264, 257/484, 494
See application file for complete search history.

(56) References Cited

U.S. PATENT DOCUMENTS

| | | | |
|---|---|---|---|
| 4,356,211 A * | 10/1982 | Riseman ................. 438/422 |
| 5,254,491 A | 10/1993 | Boland et al. |
| 5,519,250 A | 5/1996 | Numata |
| 5,541,132 A | 7/1996 | Davies et al. |
| 5,612,244 A | 3/1997 | Davies et al. |
| 5,625,522 A * | 4/1997 | Watt ....................... 361/111 |
| 5,640,041 A | 6/1997 | Lur et al. |
| 5,641,712 A | 6/1997 | Grivna et al. |
| 5,688,700 A | 11/1997 | Kao et al. |
| 5,792,706 A | 8/1998 | Michael et al. |
| 5,846,849 A | 12/1998 | Shaw et al. |
| 6,118,171 A | 9/2000 | Davies et al. |
| 6,180,995 B1 | 1/2001 | Hebert |
| 6,251,734 B1 | 6/2001 | Grivna et al. |
| 6,261,892 B1 | 7/2001 | Swanson |
| 6,271,106 B1 | 8/2001 | Grivna et al. |
| 6,307,247 B1 | 10/2001 | Davies |
| 6,455,393 B1 | 9/2002 | Swanson |
| 6,489,652 B1 | 12/2002 | Jeon et al. |
| 6,498,069 B1 | 12/2002 | Grivna |
| 6,503,838 B1 | 1/2003 | Swanson |
| 6,512,283 B2 | 1/2003 | Davies |
| 6,531,376 B1 | 3/2003 | Cai et al. |
| 6,586,833 B2 | 7/2003 | Baliga |
| 6,617,252 B2 | 9/2003 | Davies |
| 6,621,136 B2 | 9/2003 | Grivna |
| 6,661,068 B2 | 12/2003 | Durham et al. |

(Continued)

OTHER PUBLICATIONS

Erzgraber, H.B. et al., "A Novel Buried Oxide Isolation for Monolithic RF Inductors on Silicon", IEDM 98-535, IEEE 1998, (1998), pp. 535-539.

*Primary Examiner*—Lex Malsawma
*Assistant Examiner*—Robert Huber
(74) *Attorney, Agent, or Firm*—Cool Patent, P.C.; Kenneth J. Cool

(57) ABSTRACT

In various embodiments, circuits and semiconductor devices and structures and methods to manufacture these structures and devices are disclosed. In one embodiment, a bidirectional polarity, voltage transient protection device is disclosed. The voltage transient protection device may include a bipolar PNP transistor having a turn-on voltage of $V_{BE1}$, a bipolar NPN transistor having a turn-on voltage of $V_{BE2}$, and a field effect transistor (FET) having a threshold voltage of $V_{TH}$, wherein a turn-on voltage $V_{TO}$ of the voltage transient protection device is approximately equal to the sum of $V_{BE1}$, $V_{BE2}$, and $V_{TH}$, that is, $V_{TO} \approx V_{BE1} + V_{BE2} + V_{TH}$. Other embodiments are described and claimed.

37 Claims, 32 Drawing Sheets

U.S. PATENT DOCUMENTS

| | | |
|---|---|---|
| 6,759,746 B1 | 7/2004 | Davies |
| 6,764,918 B2 | 7/2004 | Loechelt |
| 6,803,317 B2 | 10/2004 | Grivna |
| 6,939,788 B2 | 9/2005 | Davies |
| 6,984,860 B2 | 1/2006 | Grivna et al. |
| 7,019,358 B2 | 3/2006 | Amato |
| 7,078,784 B2 | 7/2006 | Davies |
| 7,087,925 B2 | 8/2006 | Grivna |
| 7,098,509 B2 | 8/2006 | Zdebel et al. |
| 7,148,533 B2 | 12/2006 | Hsu et al. |
| 7,176,524 B2 | 2/2007 | Loechelt et al. |
| 7,202,152 B2 | 4/2007 | Davies |
| 7,253,477 B2 | 8/2007 | Loechelt et al. |
| 7,256,119 B2 | 8/2007 | Grivna et al. |
| 2002/0063259 A1* | 5/2002 | Usui et al. .................. 257/110 |
| 2002/0093094 A1* | 7/2002 | Takagawa et al. ........... 257/723 |
| 2004/0099896 A1 | 5/2004 | Zdebel et al. |
| 2006/0180858 A1 | 8/2006 | Loechelt et al. |
| 2006/0246652 A1 | 11/2006 | Grivna et al. |
| 2007/0034947 A1 | 2/2007 | Loechelt et al. |
| 2007/0075399 A1 | 4/2007 | Grivna |
| 2007/0093077 A1 | 4/2007 | Grivna |
| 2007/0148947 A1 | 6/2007 | Davies |
| 2007/0207582 A1 | 9/2007 | Grivna et al. |

* cited by examiner

ELECTRICAL STRESS PROTECTION APPARATUS AND METHOD OF MANUFACTURE

TECHNICAL FIELD

Embodiments disclosed in the present disclosure relate generally to electrical and semiconductor technology, and more specifically to circuits and semiconductor devices for reducing negative effects associated with electrical stresses and methods of their manufacture.

BACKGROUND

Active electronic components and integrated circuits are increasingly significant in modern controllers, communications equipment and related or compatible systems. Electronic component manufacturers are constantly striving to increase the performance of their products, while decreasing their cost of manufacture. Economic concerns and market forces driven by larger system and computation desires result in the desire for increasing circuit complexity and breadth of functionality. These concerns and forces, including size and power efficiency considerations, may place constraints on the elements and functions that are combined in realization of such circuitry.

Aligning these various factors, while effectuating cost containment and yet providing improved operational parameters, results in challenges that have spawned a variety of specialized approaches for individual sets of design/performance goals.

General trends towards progressively smaller devices and reduced power consumption per circuit element may result in increased susceptibility of these devices to catastrophic failure. One weakness or "Achilles' heel" presenting vulnerability for many types of devices results from electrical stresses, which may originate from a variety of different phenomena, including electrostatic discharge (ESD) from environmental sources, voltage stresses originating from switching and other electronic functions in such circuitry, or circuitry coupled thereto, and may be exacerbated by ringing in electrical signal and power distribution and coupling circuitry, ground or other power-supply conductor potential disturbances, or by failure or malfunction of portions of circuitry coupled to an affected component. Susceptibility of electrical components to effects of electrical stress may increase as size of individual elements decreases, in part because progressively lower power supply voltages are consistent with these trends, and, as a result, components in these circuits are increasingly voltage-sensitive. Accordingly, these concerns collectively present competing challenges, particularly in view of performance targets for robustness and reliability of resultant electronic circuits.

Different surge or transient suppressor devices and designs have been developed, responsive to long-felt needs within the industry. Some approaches require relatively large areas for formation or may require additional processing considerations or fabrication elements (such as elements or processing considerations for masking operations). Other approaches may present parasitic electrical effects that in turn may affect circuit performance adversely or have performance characteristics susceptible to degradation or catastrophic failure in their intended application. In some approaches, provision of capacity for carrying sufficient electrical current may also result in unwieldy footprint requirements or reduced switching speed or both.

Accordingly, it would be desirable to have an improved electrical stress protection apparatus and a method to manufacture the apparatus that is cost efficient.

Figure 1:
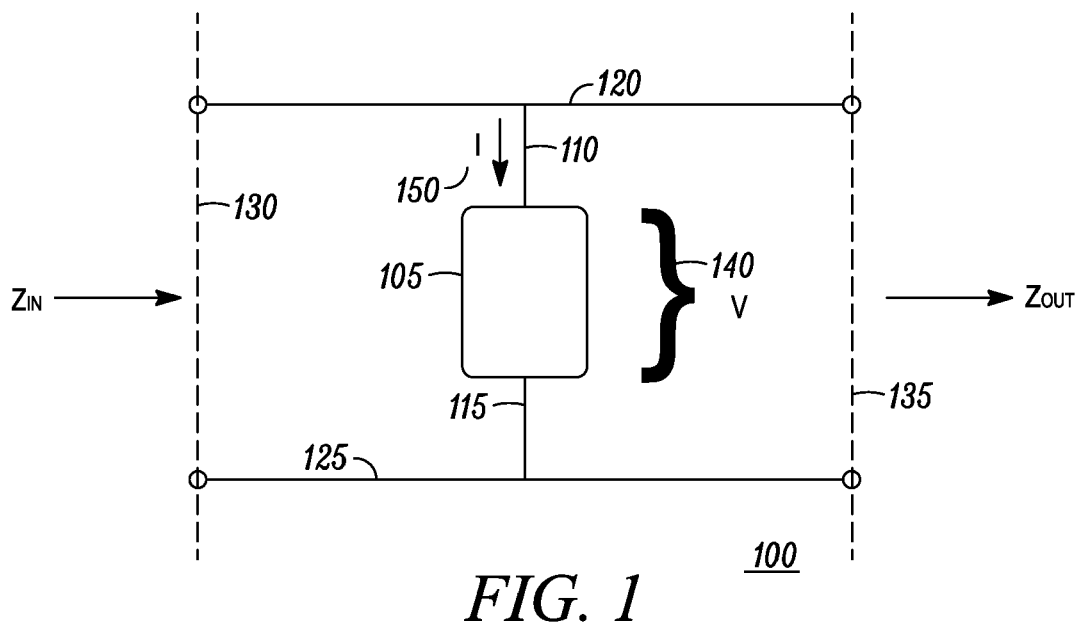
FIG. 1 is a block diagram of an electrical transient suppression device.

For simplicity of illustration and ease of understanding, elements in the various figures are not necessarily drawn to scale, unless explicitly so stated. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or the following abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. It should be understood that these terms are not necessarily intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are joined together via another element or intermediate elements.

Transistors may be referred to generally as active elements and resistors, inductors, and capacitors may be referred to generally as passive elements. As is generally understood, a bipolar transistor includes a collector region, a base region, and an emitter region and a field effect transistor (FET) includes a gate, a drain region, a source region, and a channel region. The drain region, the source region, the channel region, or the gate of a FET may each be referred to as a portion, a part, a component, or an element of the FET, and similarly, the collector region, the base region, and the emitter region of a bipolar transistor may each be referred to as a portion, a part, a component, or an element of the bipolar transistor.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source electrodes provides the conduction path which is controlled in accordance with the magnitude of the control signal. In addition, the conduction path of a MOS transistor can be enabled by applying a voltage in excess of the drain-to-source breakdown voltage of the FET. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

The following disclosure describes improved apparatus, techniques and processes for design and fabrication of circuit elements for reducing destructive aspects of electrical stress effects. The disclosure focuses on such in the context of such devices formed using monolithic single crystal silicon substrates, however, it will be appreciated that the concepts contained herein have application for other types of circuit elements and are useful in the context of other types of conductive or dielectric substrate materials such as, for example, gallium arsenide (GaAs).

Architectures and methodologies relevant to microelectronic apparatus are disclosed. In a first aspect, the present disclosure contemplates a voltage clipping mechanism. The voltage clipping mechanism includes a bipolar multilayer switching region and a metal-oxide-semiconductor field effect transistor (MOSFET) region. The MOSFET region has a predetermined threshold voltage $V_{TH}$. A turn-ON voltage $V_{ON}$ of the voltage clipping mechanism is given by: $V_{ON}=V_{TH}+2V_{BE}$, where $V_{BE}$ represents turn-ON voltage for p-n junctions in the multilayer switching region.

In another aspect, the disclosed concepts include a voltage stress protection structure. The device includes a semiconductive substrate doped to provide a relatively high conductivity and a clamp circuit formed over the substrate. The clamp circuit includes first and second electrodes and in some embodiments, is capable of being configured to provide a clamp voltage in a range of about six or about seven volts, or less, with respect to a voltage difference between the first and second electrodes. In some embodiments, the clamp circuit includes clamping characteristics that are symmetric about a predetermined or an arbitrarily-chosen voltage as is described below.

The following section, including FIGS. 1 through 4, addresses an overview of an architecture for utilization of improved electrical stress reduction structures or voltage clipping mechanisms, including such structures when integrated in conjunction with electrical and/or semiconductive devices, in accordance with the teachings of the disclosure. The disclosed apparatuses are designed to fulfill multiple areas of functionality and to satisfy a plurality of performance targets simultaneously, while also conforming with many other criteria (e.g., manufacturability). In various embodiments, the disclosed apparatuses are non-linear elements intended to ensure that undesirable electrical stress such as, for example, undesirable voltages (such as voltages induced by electrostatic discharge, electromagnetic fields, or other voltage, current or charge transients) are not impressed on vulnerable elements. In some embodiments discussed below, a non-linear element is disclosed that provides a relatively high-speed conduction path for such charge or electrical stress and yet does not provide undesirable RF characteristics, such as relatively high shunt impedance. The concepts disclosed herein are capable of voltage clamping characteristics over a broad range of voltages, and in some embodiments, also provide effective voltage stress protection in a range of six or seven volts or less, together with appropriately low OFF state parasitic effects and clamping characteristics that are symmetric about an arbitrarily-chosen voltage. In many situations, some of the apparatuses disclosed herein may pass relatively little quiescent current until a voltage threshold is reached, and then may pass substantially greater currents, as will be explained below in more detail.

FIG. 1 is a block diagram 100 of an electrical transient suppression device 105 coupled to an environment via a first terminal 110 and a second terminal 115 and/or to electronic circuitry (not illustrated in FIG. 1). In various embodiments, terminals 110 and 115 may be referred to as conductors and device 105 may be referred to as an electrical stress protection apparatus or element, electrical stress reduction structure, electrical stress relief structure, voltage clipping mechanism, voltage stress protection device, transient suppression device, surge or transient suppressor device, voltage transient surge protection device, voltage transient protection device, clamp circuit, clipper circuit, limiter circuit, or a non-linear element. In addition, in some embodiments, device 105 may be referred to as an ESD protection device, structure, circuit, or component and may be a relatively fast, bidirectional ESD protection device in some embodiments.

Device 105 has two terminals 110 and 115 respectively coupled to a first electrical conductor 120 and a second electrical conductor 125. The first and second conductors 120 and 125, in turn, may form at least one electrical port, such as port 130, and may also form a second port 135 (each represented in part by a dashed vertical line), labeled as presenting impedances $Z_{IN}$ and $Z_{OUT}$, respectively.

Although the scope of the present disclosure is not limited in this respect, electrical conductors 120 and 125 may be power distribution or other conductors formed in monolithic circuitry, interconnections employed in hybrid circuitry multi-chip technologies, where multiple devices are connected together to form a module, or may be external signal conduction paths or other electrical conductors. For example, device 105 may be coupled between two traces formed in a circuit, where the traces comprise a portion of a path for coupling a signal from one portion of circuitry to another or be associated with input/output structures. These signals may be switched signals, as in clock distribution schemes, or may be radio frequency (RF) signal conduction paths or may serve other purposes. In such instances, both the input impedance $Z_{IN}$ and the output impedance $Z_{OUT}$ may be needed for accurate RF modeling of circuit performance, and device 105 may be modeled as a two-port component, as illustrated in FIG. 1.

Alternatively, device 105 may be coupled in shunt with another circuit element, for example to protect an amplifier input stage, or in shunt with an input/output (I/O) port such as a bond pad or conductive bump interfacing an electrical component or integrated circuit with other elements or may be coupled in shunt with internal but vulnerable points within a device or component. In such cases, one or both of the ports 130, 135 would represent the electrical connections to the device 105, and one or both of the port impedances $Z_{IN}$, $Z_{OUT}$ may be needed for accurate RF modeling of circuit performance.

When a voltage V 140 is developed across the terminals 110 and 115, a current I 150 results through the device 105. This is described in more detail below with reference to FIGS. 2, 3 and 4.

Figure 2:
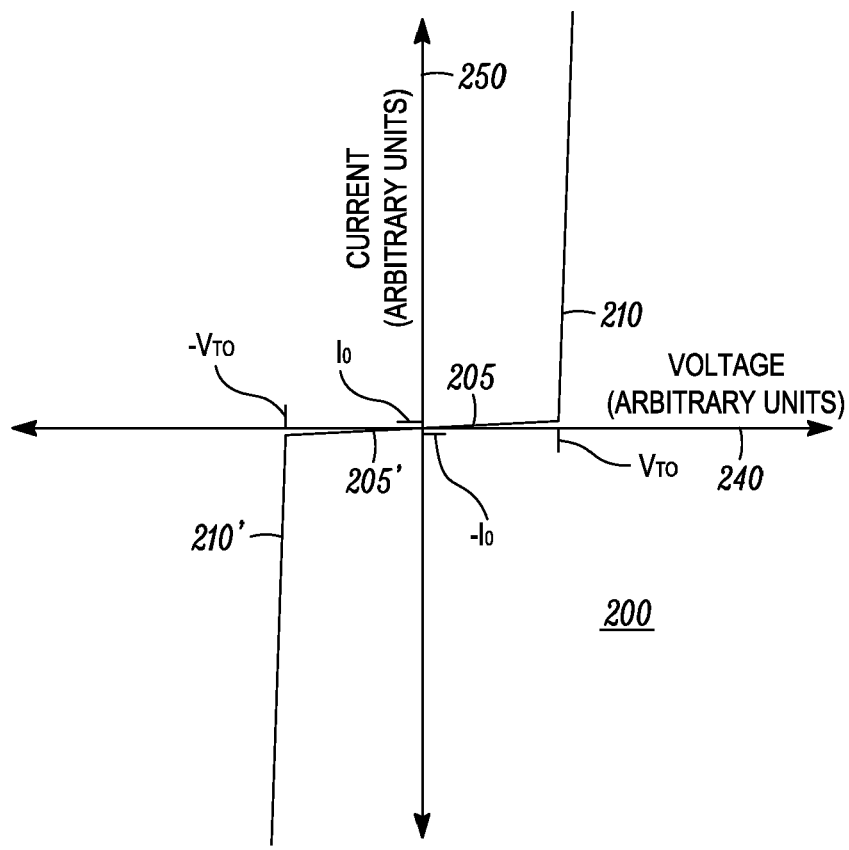
FIG. 2 is a graph displaying a piecewise-linear approximation to current (ordinate) versus voltage (abscissa) for the transient suppression element of FIG. 1.

FIG. 2 is a graph 200 displaying a piecewise-linear approximation to a current-voltage (IV) curve applicable to device 105 of FIG. 1. The IV curve representation consists of linear line segments 205, 205', 210 and 210', depicted with respect to voltage 240 and current 250. It will be appreciated that although the IV curve representation of FIG. 2 is symmetric about the origin, this curve also represents a family of similar curves having symmetry about a point corresponding to zero current together with an arbitrary or predetermined voltage offset. The device 105 is assumed to be characterizable in terms of a turn-ON voltage $V_{TO}$. For relatively small values of voltage V 240, that is, a voltage V having a magnitude of $V_{TO}$ or less, the line segments 205 and 205' correspond to a current I 250 through device 105 having a magnitude of $I_0$ or less. These segments also correspond to relatively high effective direct current (DC) and RF impedance between the terminals 110 and 115.

When the voltage V 140 increases above a voltage of $V_{TO}$ volts (or decreases below a voltage of $-V_{TO}$ volts), current I 250 through the transient suppression device 105 abruptly increases to values much greater than $I_0$ (or much more negative than $-I_0$). In these conduction regimes, the effective impedance decreases extremely sharply in the vicinity of $V_{TO}$, as represented by the line segments 210 and 210'. The turn-ON voltage $V_{TO}$ thus provides a sharp discrimination between voltages greater and/or smaller than the turn-ON voltage $V_{TO}$.

The graph 200 of FIG. 2 displays an IV curve for a transient suppression device 105 having symmetric characteristics. It will be appreciated, however, that other combinations of positive and negative characteristics are possible, and are included within the scope of the present disclosure. Although the scope of the present disclosure is not limited in this respect, in some embodiments, the turn-ON voltage $V_{TO}$ may be a voltage of less than about seven volts. For example, in various embodiments, the turn-ON voltage $V_{TO}$ may be about five volts, two volts, 1.8, or 1.5 volts. Accordingly, device 105 provides a relatively low voltage transient suppression device that may be used in low voltage applications or devices.

Figure 3:
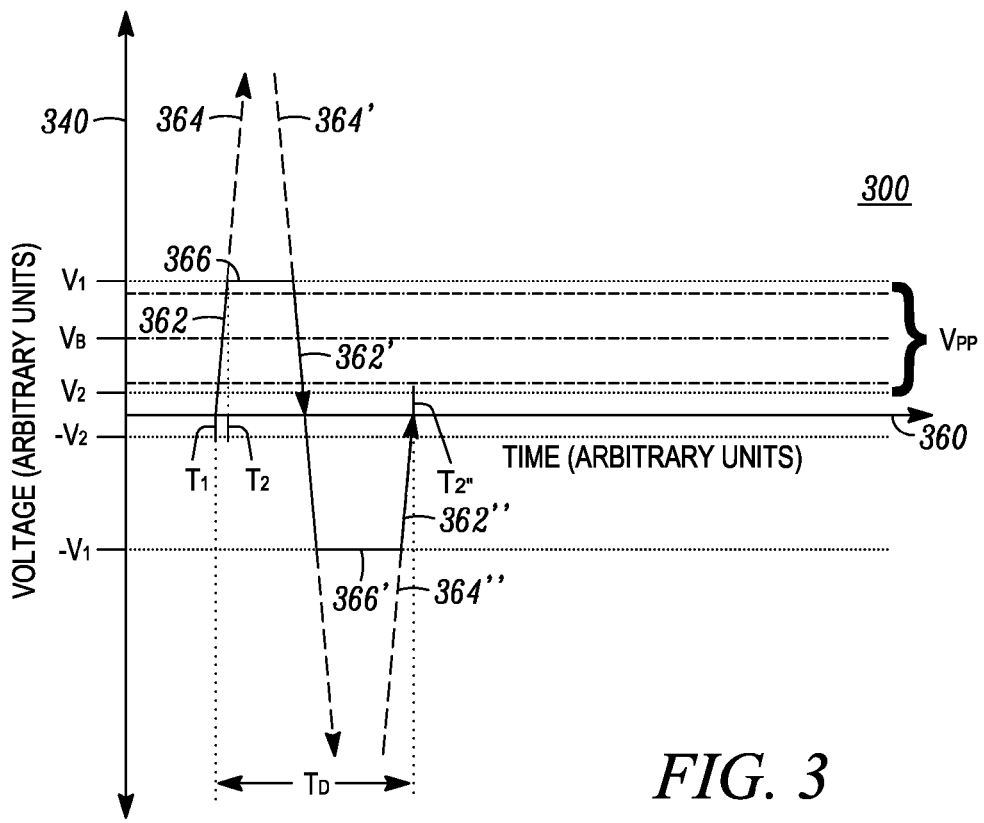
FIG. 3 is a graph displaying a piecewise-linear approximation of voltage (ordinate) versus time (abscissa) relevant to the environment of FIG. 1.
Figure 4:
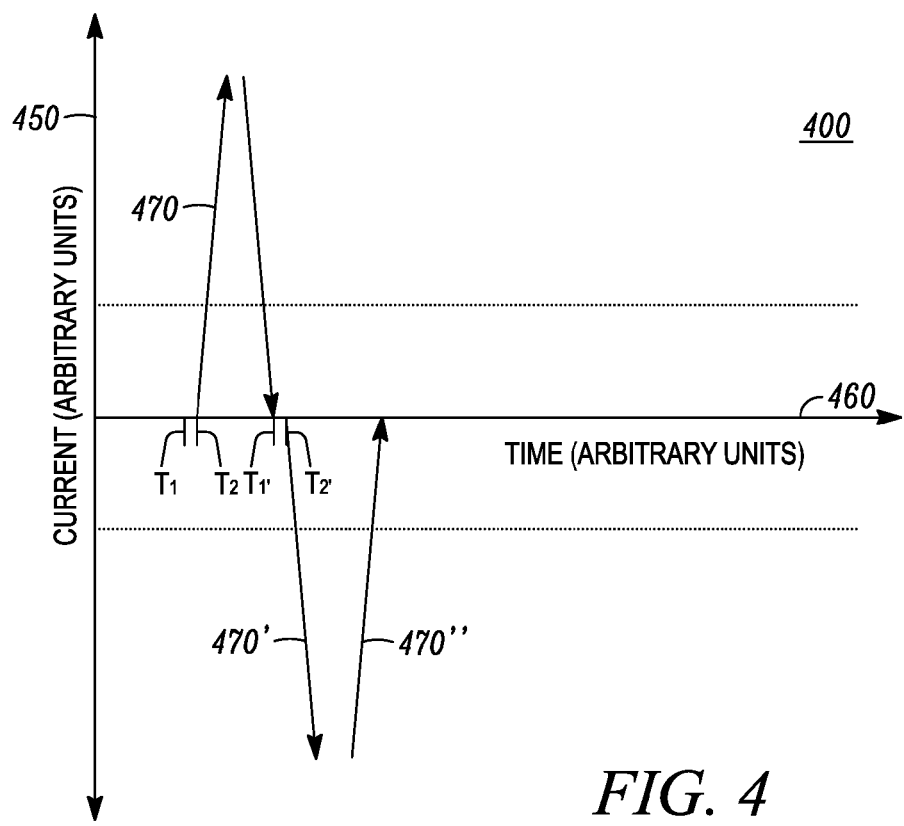
FIG. 4 is a graph displaying a piecewise-linear approximation of current (ordinate) versus time (abscissa) relevant to the environment of FIG. 1.

FIG. 3 is a graph 300 displaying voltage 340 (ordinate) versus time 360 (abscissa), and FIG. 4 is a graph 400 displaying current 450 (ordinate) versus time 460 (abscissa), relevant to the description of the operation of device 105 of FIG. 1. Voltage 340 of FIG. 3 is analogous to, and can correspond to, voltages 140 of FIG. 1 and 240 of FIG. 2, and likewise, current 450 of FIG. 4 is analogous to, and can correspond to, current 150 of FIG. 1. In addition, time 360 of FIG. 3 is analogous to, and can correspond to, time 460 of FIG. 4.

FIG. 3 combines representations of several different conditions for the purpose of ready comparison. One condition corresponds to a situation where the transient suppression device 105 is combined with several other elements, while a second condition corresponds to an "open circuit" electrical event and hypothetical voltages for a case where the transient suppression device 105 is absent, and it is assumed that the other elements do not significantly alter the open-circuit voltage.

FIG. 3 illustrates an example, wherein voltage 340 is zero until time $T_1$. For the first condition, after the time $T_1$, when an electrical transient is assumed to initiate, the voltage 340 initially increases (solid trace 362), at least until a desired turn-ON value $V_1$ is reached at time $T_2$. Under open-circuit conditions, the voltage 340 also increases and is also represented by the line segment 362 at values below the turn-ON value $V_1$. Voltage $V_1$ of FIG. 3 is analogous to, and can correspond to, voltage $V_{TO}$ of FIG. 2. Similarly, Voltage $-V_1$ of FIG. 3 is analogous to, and can correspond to, voltage $-V_{TO}$ of FIG. 2. The voltage 340 is such as might occur from electrostatic discharge, switching transients, power distribution circuitry effects, or a number of causes.

Referring to FIGS. 1-3, however, when the voltage 340 (140, 240) across the transient suppression element 105 reaches the value $V_1$ and attempts to increase past the turn-ON voltage $V_1$ ($V_{TO}$) of the transient suppression device 105, the transient suppression device 105 abruptly begins to switch to a relatively lower-resistance state, and the voltage 340 is effectively clamped at the value of $V_1$, as represented by the solid horizontal trace 366, for example, and current through the transient suppression device 105 begins to abruptly increase, as shown by solid trace 470 in FIG. 4. In other words, when the transient suppression device 105 is included, the voltage excursion that would otherwise occur, represented by dashed traces 364, 364', 364", is precluded, with the result that the voltage at the terminals 1 10 and 115 may be as represented by the solid traces 362, 366, 362', 366', 362" and the corresponding currents represented by the solid traces 470, 470' and 470" with timing relationships as illustrated in FIGS. 3 and 4.

In many applications, including some applications in high frequency amplifiers, a direct-current steady-state bias voltage, such as is represented by $V_B$ in FIG. 3, may be impressed across the terminals 110 and 115. In RF amplifier input applications, a DC input bias voltage $V_B$ of one to several volts may be desired. In some other applications, such as where a transient suppression device 105 is employed to dissipate power distribution circuitry transients, a power signal (such as $V_{DD}$) may be impressed on one of the terminals 110, while a ground connection or signal return path may be supplied via the other terminal 115.

It may be desirable to provide an automatic resetting capability for the transient suppression device 105, thus limiting disruption of normal circuit operation to an interval determined primarily by the duration $T_D$ (FIG. 3) of the transient electrical disturbance. In the scenario depicted in FIG. 3, a superposition of the bias voltage $V_B$ and a signal peak-to-peak voltage $V_{PP}$ as applied to the terminals 110 and 115 of the transient suppression device 105 is represented by the bracketed region that is vertically bisected by the horizontal trace associated with the bias voltage $V_B$, as shown in FIG. 3.

In order for a high frequency signal such as an input signal to an amplifier to provide resetting capability, some factors may be significant, for example: (i) control of the threshold or thresholds at which transient suppression operation begins and ends, and (ii) an absence of "snap-back" in the operating characteristics of the transient suppression device 105. In a context relevant to many applications, stress responsive elements such as device 105 providing resetting capability unresponsive to voltages within a first range of voltages (such as exemplified via $V_{PP}$ in FIG. 3) but having reset capabilities (manifesting return to the OFF mode) associated with voltages adjacent to that first voltage range, and also coinciding with a range of voltages falling within a range associated with substantially less risk of electrically-related stress yet adjacent to the first voltage range and having a narrowly-defined breadth outside that of the first voltage range by a factor such as, for example, ten percent or less, may be desirable. In this scenario, where resetting responsive to signal conditions relevant to design and operation are considerations, but where simplified operation is also desirable, transient suppression apparatus requiring resetting operations to obviate latching phenomena resulting from negative resistance, or snap-back, may be undesirable and may present performance limitations inconsistent with intended purposes. In some embodiments, device 105 described herein, is configured or adapted to provide a current-voltage characteristic exhibiting only positive effective direct current resistance at the terminals 110 and 115 so that there is an absence of "snap-back" in the operating characteristics of the transient suppression device 105.

Referring again to FIGS. 1-4, snap-back is a phenomenon wherein a first characteristic voltage $V_1$ applied across terminals 110 and 115 initiates conduction of relatively significant current 150 in the transient suppression device 105, and a second, relatively lower characteristic voltage $V_2$ is relevant to describing a later portion of conduction of the transient suppression device 105. For example, in some types of transient suppression devices 105, the first characteristic voltage $V_1$ may be approximated as $2V_{FB}+V_{THRES}$, while the second characteristic voltage $V_2$ may be approximated as $V_{FB}+V_{SAT}$, where $V_{FB}$ represents a voltage drop typical of a forward-biased diode, $V_{THRES}$ represents a threshold voltage of a switching element within the transient suppression device 105 and $V_{SAT}$ represents a saturated voltage associated with the switching element, and where $V_{SAT}$ may be substantially less than $V_{THRES}$. Other types of voltages descriptive of the transient suppression element 105 may lead to the same net situation, where the steady-state voltage or second characteristic voltage $V_2$ is substantially less than the initial or first characteristic voltage $V_1$.

In a situation where the transient suppression device 105 is coupled in shunt with an input to a high-frequency amplification element, the input signal excursions may be on the order of about one volt, and have frequencies in a range including several tens of gigahertz (GHz) or even higher frequencies. In this scenario, the portion of an RF signal having an amplitude of about one volt which could automatically turn off or reset the transient suppression device 105 to a non-conducting state may have a time duration of picosecond or less. Thus, as an example, when an RF device such as an amplifier requires a DC bias of one and a half volts, the first characteristic voltage $V_1$ may be several volts, for example, about three volts, and the second characteristic voltage $V_2$ may be substantially less, for example, about nine-tenths of a volt or less, once the transient suppression device 105 has been triggered, the input signal alone likely will not automatically reset the transient suppression device 105 to the non-conducting state.

Alternatively, even when the voltage requirements are met, turn-OFF speed of the transient suppression device 105 may be grossly inadequate for purposes of resetting the transient suppression device 105 to a non-conducting or OFF state. When the turn-OFF switching speed for the transient suppression device 105 requires substantially greater time than a duration of the portion of the RF signal having appropriate voltage excursion characteristics, the transient suppression device 105 very likely cannot be automatically reset to the non-conducting state by the RF signal, even when a bottom edge of the superposed bias voltage $V_B$ plus signal voltage $V_{PP}$ includes excursions below the voltage $V_2$.

In such cases, either the ensemble of components must be reset by resetting, for example, removing, the power supply signals or voltages, including the DC bias component, or the transient suppression device 105 must be reset via activation of additional suitable circuitry. Neither of these options is attractive from the perspectives of added device complexity and footprint or of robust and automatic circuit operation.

In summary, the preceding section describes an environment in which a transient suppression device 105 finds utility, and describes properties of the transient suppression device 105 as observed via the terminals to the transient suppression device. The terminal properties described include nonlinear current vs. voltage characteristics and voltage and current versus time performance of at least one type of transient suppression device 105. The description focuses on how the terminal properties interact with the environment, and particularly on how turn-ON and turn-OFF characteristics, as well as I-V characteristics, affect performance and range of useful application for transient suppression devices 105. Electrical circuit embodiments oriented towards realization of these terminal properties are described in the following section.

Figure 6:
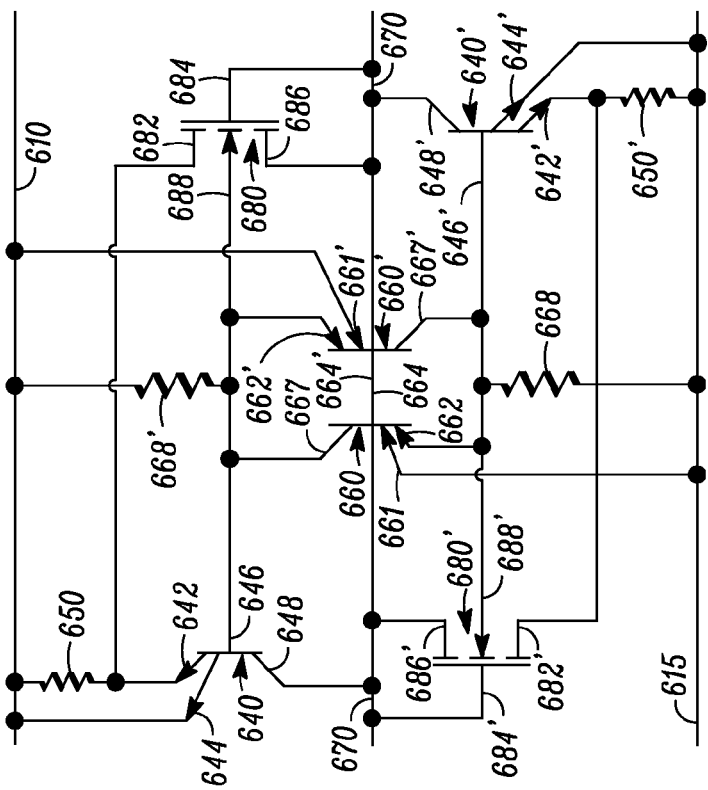
FIG. 6 is a schematic diagram of an embodiment of the transient suppression device of FIG. 1.
Figure 5:
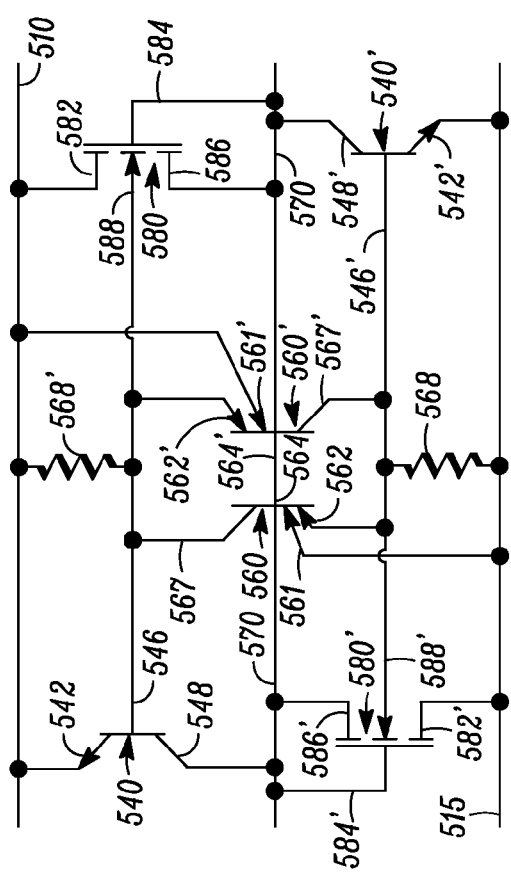
FIG. 5 is an exemplary schematic diagram of an embodiment of the transient suppression element of FIG. 1.

In FIGS. 5 and 6, two different circuit embodiments of a transient suppression device 105 (FIG. 1) are described. FIGS. 5 and 6 provide schematic diagrams of an embodiment 500 and an embodiment 600, respectively, of the transient suppression device 105 of FIG. 1.

The embodiment 500 depicted in FIG. 5 includes a first conductor 510 and a second conductor 515, analogous to the terminals 110 and 115 of FIG. 1, for example. In FIG. 5, elements share the same numbers with primes to illustrate analogous elements in circuit 500. For example, the NPN transistors 540 and 540' of embodiment 500 share the same or similar characteristics, and are symmetrical in some ways, for example, in terms of their structure, electrical properties (for example, current gain) and in the way these transistors are connected to other elements. Similarly, resistor 568, transistor 560, and transistor 580 are respectively analogous to resistor 568', transistor 560', and transistor 580'.

The embodiment 500 includes a NPN transistor 540, and a NPN transistor 540', each depicted as having a power electrode or emitter 542 and 542', respectively, and each having an associated current gain, $\beta_{NPN}$. The current gain $\beta$ of a transistor differs from current gain of a transistor amplifier, which is represented as $A_f$. Current gain $\beta$ of a transistor in a common-emitter configuration is defined as collector current $I_C$ divided by base current $I_B$, or $I_C/I_B$.

The NPN transistor 540 also includes a base or control electrode 546 and a collector or second power electrode 548, while the NPN transistor 540' includes similarly-numbered elements bearing primes, that is, NPN transistor 540' includes a control electrode 546' and collector electrode 548'. The emitter 542 of the NPN transistor 540 is connected directly to the conductor 510, with the NPN transistor 540' being analogously connected to the conductor 515, that is, the emitter 542' of the NPN transistor 540' is connected directly to the conductor 515.

The embodiment 500 also includes a PNP transistor 560 and a PNP transistor 560', each depicted as having multiple emitters 562 and 561, and 562' and 561', respectively, and each having an associated current gain $\beta_{PNP}$. The PNP transistor 560 includes an emitter or first power electrode 562, a base or control electrode 564 and a collector or second power electrode 567. A conductor 570, represented as a horizontal central line in FIG. 5, couples the bases 564, 564' of the two PNP transistors 560, 560' together. The collector 567 of the PNP transistor 560 is coupled to the base 546 of the NPN transistor 540, and both are coupled via a resistor 568' to the conductor 510. Similarly, the collector 567' of the PNP transistor 560' is coupled to the base 546' of the NPN transistor 540', and both are coupled via a resistor 568 to the conductor 515. The emitter 561 of PNP transistor 560 is connected to conductor 515 and the emitter 561' of PNP transistor 560' is connected to conductor 510.

A MOSFET 580 and a MOSFET 580' are also included in the embodiment 500 of FIG. 5, and are depicted in FIG. 5 as being enhancement mode n-channel MOSFETs, that is, for example, having a p-type semiconductor body and operating in an enhancement mode. The MOSFET 580 includes a source or power electrode 582 that is coupled to the emitter 542 of the NPN transistor 540, and the MOSFET 580' includes a source or power electrode 582' that is coupled to the emitter 542' of the NPN transistor 540'. The MOSFET 580 includes a gate or control electrode 584 and a drain or second power electrode 586 which are coupled together and to the conductor 570, and the MOSFET 580' has a gate or control electrode 584' and a drain or second power electrode 586' that are coupled together and to the conductor 570.

The MOSFET 580 also includes a body electrode 588 that is coupled to the base 546 of the NPN transistor 540, to the collector 567 of the PNP transistor 560, to the emitter 562' of the PNP transistor 560', and to the resistor 568'. The MOSFET 580' also includes a body electrode 588' that is coupled to the base 546' of the NPN transistor 540', to the collector 567' of the PNP transistor 560', to the emitter 562 of the PNP transistor 560, and to the resistor 568. Each MOSFET 580, 580' has a characteristic threshold voltage $V_{TH}$, and a characteristic transconductance $g_m$, often specified in terms of transconductance per unit of control electrode width. The MOSFET threshold voltages $V_{TH}$ are assumed to be approximately equal in magnitude, and are determinable via factors including doping levels employed during fabrication, as will be subsequently explained in more detail.

In operation, the embodiment 500 has a continuum of stable states, including at least two primary or characterizing operating modes. These primary modes are: (i) an OFF mode, corresponding to trace 205 or 205' of FIG. 2, and (ii) an ON mode, corresponding to trace 210 or 210' of FIG. 2.

In the OFF mode, there is essentially zero volts applied across conductors 510 and 515, and therefore, the transistors 540, 540', 560, 560' and 580, 580' are all OFF, that is, relatively little, to no electrical current is conducted via any of the power electrodes. In some embodiments, in the OFF mode, a relatively small amount of current such as quiescent current or leakage current may flow in or through circuit 500. The OFF mode may be referred to as a non-conduction mode, low-conduction mode, or low current mode of operation.

For the ON mode, the operation will be described in terms of a first polarity (for example, positive polarity) of voltage 140 (FIG. 1), 240 (FIG. 2), 340 (FIG. 3) that is presented across the conductors 510 and 515. As will be described in more detail below, in the first polarity example wherein voltage present on the conductor 510 increases relative to a voltage present on the conductor 515 to provide a voltage increase with respect to time, the transistors having primed reference characters, that is, transistors 560', 580', and 540', will be turned on and active during this mode of operation. In the second polarity example wherein voltage present on the conductor 515 increases relative to a voltage present on the conductor 510 to provide a voltage increase with respect to time, the transistors having reference numbers without the primed reference characters, that is, transistors 560, 580, and 540, will be turned on and active during this mode of operation. Accordingly, the circuit in embodiment 500 has bidirectional and symmetrical characteristics in that it can respond to electrical transients of either polarity applied across conductors 510 and 515.

After a "turn-on" voltage is reached, that is, after the magnitude, or the absolute value of, the voltage difference of $V_{TO}$ is applied across conductors 510 and 515, circuit 500 will be in the ON mode of operation, wherein a relatively large amount of electrical current may flow in or through circuit 500, for example, the amount of electrical current flowing in circuit 500 is greater than, and in many cases, substantially greater than, leakage or quiescent current amounts. The ON mode may be referred to as a high-conduction mode or high current mode of operation. Accordingly, the amount of electrical current flowing through the device 105 is less, and in many cases, substantially less, in the OFF mode compared to the amount of electrical current flowing through the device 105 in the ON mode. In some embodiments, the amount of electrical current flowing through the device 105 in the OFF mode is approximately zero amperes, or less than about ten microamperes is some cases, and the amount of electrical current flowing through the device 105 in the ON mode is greater than approximately 200 milliamperes (mA), and in some cases may range from about 200 milliamperes (mA) to several amperes, depending on the size of elements of structure 800 described herein.

As an example, as the voltage presented on conductor 510 relative to conductor 515 rises towards the positive turn-ON voltage $V_{TO}$ of the transient suppression device 105, this will initiate some relatively small electrical current flow through the emitter 561'—base 564' junction of the PNP transistor 560', and through resistor 568' and then through the emitter 562'—base 564' junction of the PNP transistor 560'. As will be described in more detail below, in some embodiments, the current gain of transistor 560' is relatively small compared to, for example, the current gain of NPN transistor 540', and as a result most of the current through PNP transistor 560' is base current. As current begins to flow from the base 564', then electrical current will begin to flow through n-channel MOSFET 580', that is through the drain 586' and the source 582' of MOSFET 580'. The relatively small current flow through PNP transistor 560' and MOSFET 580' may be referred to as "leakage current." As a result, a voltage on conductor 570 will begin to rise toward the threshold voltage of MOSFET 580', and a voltage $V_{DS}$ developed across the MOSFET 580', from joined drain 586' and gate 584', to the source 582', also begins to increase. This drain-source voltage $V_{DS}$ will saturate as it reaches the threshold voltage $V_{TH}$ for the MOSFET 580'.

There is a relatively small amount of current through MOSFET 580' until the threshold voltage $V_{TH}$ of MOSFET 580' is attained. After the threshold voltage $V_{TH}$ of MOSFET 580' is attained, MOSFET 580' will turn on more significantly to increase the amount of current through MOSFET 580'.

The current through the emitter 562'—base 564' junction of the PNP transistor 560' and the emitter 561'—base 564' junction of the PNP transistor 560' gives rise to a current through the collector 567' ($I_C = \beta_{PNP} * I_B$) and the current from collector 567' flows to the resistor 568. As a result, a voltage will be generated and applied to the base 546' of NPN transistor 540' and to the body electrode 588' of MOSFET 580', and this voltage will rise, resulting in an increase of the threshold voltage $V_{TH}$ of MOSFET 580' since increasing bias voltage applied to the body electrode 588' acts to increase the effective threshold voltage $V_{TH}$ of the MOSFET 580'. The voltage developed across the resistor 568 saturates at a voltage that is determined by the voltage drop across the base 546'—emitter 542' junction ($V_{BE}$) of the NPN transistor 540', which in some embodiments, is a voltage $V_{BE}$ ranging from about 0.6 volts to about 0.7 volts.

A relatively small amount of current is flowing through circuit 500 at this time prior to the time when the voltage difference across conductors 510 and 515 reaches a value approximating a turn-ON voltage $V_{TO}$ of the transient suppression device 105, which is the summation of the threshold voltage $V_{TH}$ of MOSFET 580' and the turn-ON voltages $V_{BE}$ of bipolar transistors 560' and 540'. Accordingly, the turn-ON voltage $V_{TO}$ of circuit 500 or device 105 may be represented by the equation $2*V_{BE}+V_{TH}$.

The embodiment 600 illustrated in FIG. 6 is similar in structure and operation to the embodiment 500 (FIG. 5) discussed above. Differences between embodiments 500 and 600 include circuit 600 having NPN transistors 640 and 640', both of which include multiple emitters 642 and 644, and 642' and 644', respectively. In addition, circuit 600 includes resistors 650 and 650'.

The embodiment 600 depicted in FIG. 6 includes a first conductor 610 and a second conductor 615, analogous to the terminals 110 and 115 of FIG. 1, for example. In FIG. 6, elements share the same numbers with primes to illustrate analogous elements in circuit 600. For example, the NPN transistors 640 and 640' of embodiment 600 share the same or similar characteristics, and are symmetrical in some ways, for example, in terms of their structure, electrical properties (for example, current gain) and in the way these transistors are connected to other elements. Similarly, resistor 668, resistor 650, transistor 660, and transistor 680 are respectively analogous to resistor 668', resistor 650', transistor 660', and transistor 680'.

The embodiment 600 includes a NPN transistor 640 and a NPN transistor 640', each depicted as having multiple emitters 642 and 644, and 642' and 644', respectively, and each having an associated current gain, $\beta_{NPN}$. Here, the common-emitter current gain is less precisely definable, for reasons that will become apparent as operation of the circuit is discussed, but the symbol $\beta_{NPN}$ for NPN transistors 640 and 640' will be used to mean "base current divided by the sum of emitter currents in a common-emitter configuration" unless otherwise stated. The NPN transistor 640 also includes a base or control electrode 646 and a collector or second power electrode 648, while the NPN transistor 640' includes similarly-numbered elements bearing primes, that is, a base or control electrode 646' and a collector or second power electrode 648'. A resistor 650 is shown as being connected to the conductor 610 and to the emitter 642 of the NPN transistor 640, and emitter 644 is connected directly to the conductor 610. The NPN transistor 640' being analogously coupled to the conductor 615 and including the resistor 650' in similar fashion. Specifically, a resistor 650' is connected to the conductor 615 and to the emitter 642' of the NPN transistor 640', and emitter 644' is connected directly to the conductor 615.

The embodiment 600 also includes a PNP transistor 660 and a PNP transistor 660', each depicted as having multiple emitters 662 and 661, and 662' and 661', respectively, and each having an associated current gain $\beta_{PNP}$. The PNP transistor 660 also includes a base 664 and a collector 667. A conductor 670, represented as a horizontal central line in FIG. 6, connects the bases 664, 664' of the two PNP transistors 660 and 660' together. The collector 667 of the PNP transistor 660 is connected to the base 646 of the NPN transistor 640, and both are connected via a resistor 668' to the conductor 610. Similarly, the collector 667' of the PNP transistor 660' is connected to the base 646' of the NPN transistor 640', and both the collector 667' and the base 646' are coupled via a resistor 668 to the conductor 615. The emitter 661 of PNP transistor 660 is connected to conductor 615 and the emitter 661' of PNP transistor 660' is connected to conductor 610.

MOSFETs 680 and 680' are also included in the embodiment 600 of FIG. 6. The MOSFETs 680, 680' are depicted in FIG. 6 as being enhancement mode n-channel MOSFETs, that is, for example, having a p-type semiconductor body and operating in an enhancement mode. The MOSFET 680 includes a source or first power electrode 682 that is connected to a node at the juncture of the resistor 650 and the emitter 642 of the NPN transistor 640, and the MOSFET 680' includes a source or first power electrode 682' that is connected at the juncture of the resistor 650' and the emitter 642' of the NPN transistor 640'.

The MOSFET 680 includes a gate or control electrode 684 and a drain or second power electrode 686 which are connected together and to the conductor 670, with the MOSFET 680' having a gate or control electrode 684' and a drain or second power electrode 686' that are connected together and to the conductor 670.

The MOSFET 680 also includes a body electrode 688 that is connected to the base 646 of the NPN transistor 640, to the collector 667 of the PNP transistor 660, to the emitter 662' of the PNP transistor 660', and to the resistor 668'. The MOSFET 680' also includes a body electrode 688' that is connected to the base 646' of the NPN transistor 640', to the collector 667' of the PNP transistor 660', to the emitter 662 of the PNP transistor 660, and to the resistor 668. Each MOSFET 680, 680' has a characteristic threshold voltage $V_{TH}$. The threshold voltages $V_{TH}$ for the MOSFETs 680, 680' are assumed to be approximately equal in magnitude and are determinable via factors including doping levels employed during fabrication, as will be explained in more detail with reference to FIG. 8, infra. In alternate embodiments, the threshold voltages $V_{TH}$ for MOSFETs 680 and 680' may be formed to be different by, for example, doing additional doping implants.

In operation, the embodiment 600 has a continuum of stable states, including at least two primary or characterizing operating modes. These two primary operation modes are: (i) an OFF mode, corresponding to trace 205 or 205' of FIG. 2, and (ii) an ON mode, corresponding to trace 210 or 210' of FIG. 2.

In the OFF mode, there is essentially zero volts applied across conductors 610 and 615, and therefore, the transistors 640, 640', 660, 660' and 680, 680' are all turned OFF, that is, relatively little, to no current is conducted via any of the power electrodes. In some embodiments, in the OFF mode, a relatively small amount of current such as quiescent current or leakage current may flow in or through circuit 600. The OFF mode may be referred to as a non-conduction mode, low-conduction mode, or low current mode of operation.

For the ON mode, the operation will be described in terms of a first polarity (for example, positive polarity) of voltage 140 (FIG. 1), 240 (FIG. 2), 340 (FIG. 3) that is presented across the conductors 610 and 615. As will be described in more detail below, in the first polarity example wherein voltage present on the conductor 610 increases relative to a voltage present on the conductor 615 to provide a voltage increase with respect to time, the transistors having primed reference characters, that is, transistors 660', 680', and 640', will be turned on and active during this mode of operation. In the second polarity example wherein voltage present on the conductor 615 increases relative to a voltage present on the conductor 610 to provide a voltage increase with respect to time, the transistors having reference numbers without the primed reference characters, that is, transistors 660, 680, and 640, will be turned on and active during this mode of operation. Accordingly, the circuit in embodiment 600 has bidirectional and symmetrical characteristics in that it can respond to electrical transients of either polarity applied across conductors 610 and 615.

After a "turn-on" voltage is reached, that is, after the magnitude, or the absolute value of, the voltage difference of $V_{TO}$ is applied across conductors 610 and 615, circuit 600 will be in the ON mode of operation, wherein a relatively large amount of electrical current may flow in or through circuit 600, for example, the amount of electrical current flowing in circuit 600 is greater than, and in many cases, substantially greater than, leakage or quiescent current amounts. The ON mode may be referred to as a high-conduction mode or high current mode of operation. Accordingly, the amount of electrical current flowing through the device 105 is less, and in many cases, substantially less, in the OFF mode compared to the amount of electrical current flowing through the device 105 in the ON mode. In some embodiments, the amount of electrical current flowing through the device 105 in the OFF mode is approximately zero amperes, or less than about ten microamperes is some cases, and the amount of electrical current flowing through the device 105 in the ON mode is greater than approximately 200 milliamperes (mA), and in some cases may range from about 200 milliamperes (mA) to several amperes, depending on the size of elements of structure 800 described herein.

As an example, as the voltage presented on conductor 610 relative to conductor 615 rises towards the positive turn-ON voltage $V_{TO}$ of the transient suppression device 105, this will initiate some relatively small electrical current flow through the emitter 661'—base 664' junction of the PNP transistor 660', and through the resistor 668' and then through the emitter 662'—base 664' junction of the PNP transistor 660'. As will be described in more detail below, in some embodiments, the current gain of transistor 660' is relatively small compared to, for example, the current gain of NPN transistor 640', and as a result most of the current through PNP transistor 660' is base current. As current begins to flow from the base 664', then electrical current will begin to flow through n-channel MOSFET 680', that is through the drain 686' and the source 682' of MOSFET 680'. The relatively small current flow through PNP transistor 660' and MOSFET 680' may be referred to as "leakage current." As a result, a voltage on conductor 670 will begin to rise toward the threshold voltage of MOSFET 680', and a voltage $V_{DS}$ developed across the MOSFET 680', from joined drain 686' and gate 684', to the source 682', also begins to increase. This drain-source voltage $V_{DS}$ will saturate as it reaches the threshold voltage $V_{TH}$ for the MOSFET 680'. $V_{TH}$ depends on bias applied to the body electrode 688' of the MOSFET 680' (that is, $V_{TH}$ increases with increasing body bias voltage applied to body electrode 688'). The bias on the body electrode 688' saturates at an effective base-emitter voltage $V_{BE}$ for the NPN transistor 640'. This base-emitter voltage may be referred to as the turn-ON voltage of NPN transistor 640'.

There is a relatively small amount of current through MOSFET 680' until the threshold voltage $V_{TH}$ of MOSFET 680' is attained. After the threshold voltage $V_{TH}$ of MOSFET 680' is attained, MOSFET 680' will turn on more significantly to increase the amount of current through MOSFET 680'. In some embodiments, the threshold voltage $V_{TH}$ of MOSFET 680' may range from about 500 millivolts (mV) to about five volts depending on factors including doping levels and thicknesses of materials employed during fabrication.

The current through the emitter 662'—base 664' junction of the PNP transistor 660' and the emitter 661'—base 664' junction of the PNP transistor 660' gives rise to a current through the collector 667' ($I_C=\beta PNP*I_B$) and the current from collector 667' flows to the resistor 668. As a result, a voltage will be generated and applied to the base 646' of NPN transistor 640' and to the body electrode 688' of MOSFET 680', and this voltage will rise, resulting in an increase of the threshold voltage $V_{TH}$ of MOSFET 680' since increasing bias voltage applied to the body electrode 688' acts to increase the effective threshold voltage $V_{TH}$ of the MOSFET 680'. The voltage developed across the resistor 668 saturates at a voltage that is determined by the voltage drop across the effective base—emitter junction ($V_{BE}$) of the NPN transistor 640', which in some embodiments, is a voltage $V_{BE}$ ranging from about 0.6 volts to about 0.7 volts depending on factors including doping levels employed during fabrication.

A relatively small amount of current is flowing through circuit 600 at this time prior to the time when the voltage difference across conductors 610 and 615 reaches a value approximating a turn-ON voltage $V_{TO}$ of the transient suppression device 105, which is the summation of the threshold voltage $V_{TH}$ Of MOSFET 680' and the turn-ON voltages $V_{BE}$ of bipolar transistors 660' and 640'. Accordingly, the turn-ON voltage $V_{TO}$ of circuit 600 or device 105 may be represented by the equation $2*V_{BE}+V_{TH}$. In some embodiments, the turn-ON voltage $V_{TO}$ of the transient suppression device 105 may range from about 1.5 volts to about seven volts.

Current through the emitter 642' of the NPN transistor 640' also results in a voltage that develops across the emitter resistor 650'. That voltage, in turn, tends to reduce current gain $A_I$ associated with at least the portion of the circuit 600 that includes the NPN transistor 640'. In other words, the resistors 650, 650' provide voltage feedback acting to degenerate the effective current gain β of the transistors 640 or 640', respectively, as current I 150, 250, 450 through the transient suppressor device 105 increases, and the reduction in effective transistor gain β as the circuit 600 goes towards the ON mode also tends to stabilize the performance of the embodiment 600. The operation and structure of circuit 600 will be described further below with reference to FIGS. 7, 8, 9 and 10.

Figure 7:
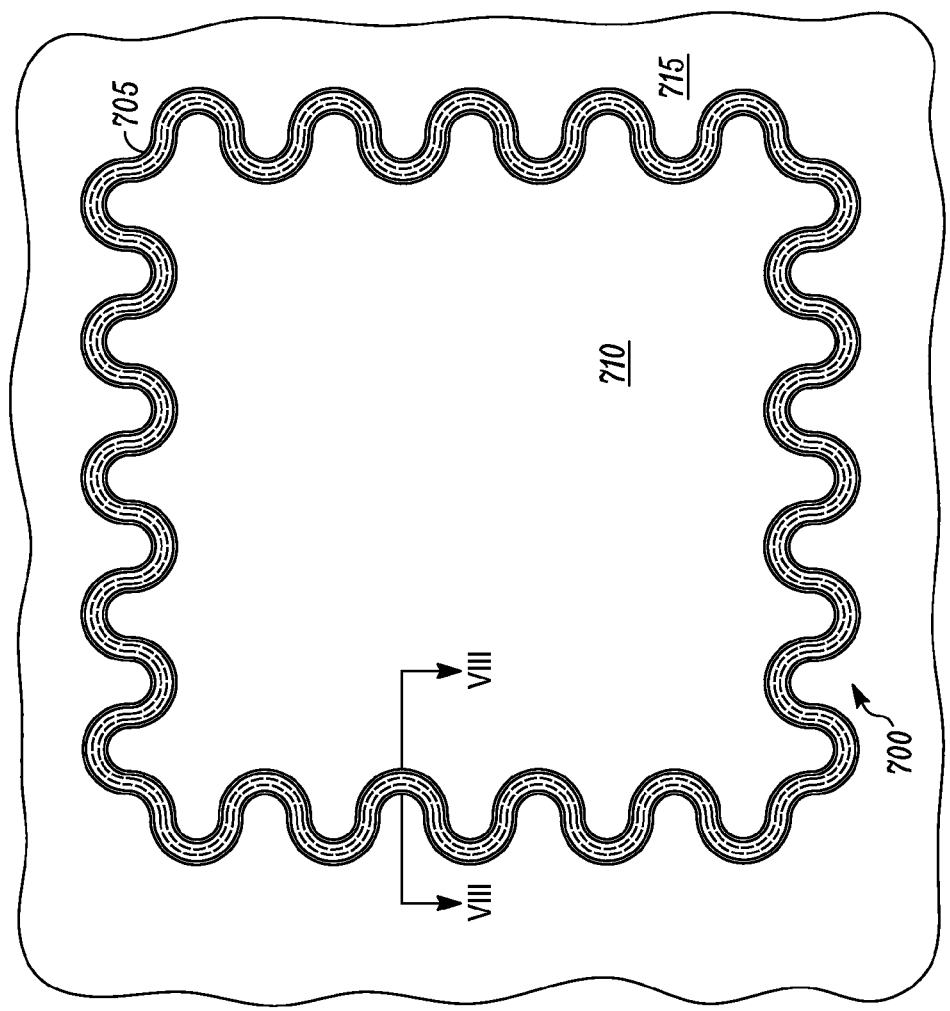
FIG. 7 is a plan view of an embodiment of a circuit layout capable of use with the transient suppression device of FIG. 1.
Figure 8:
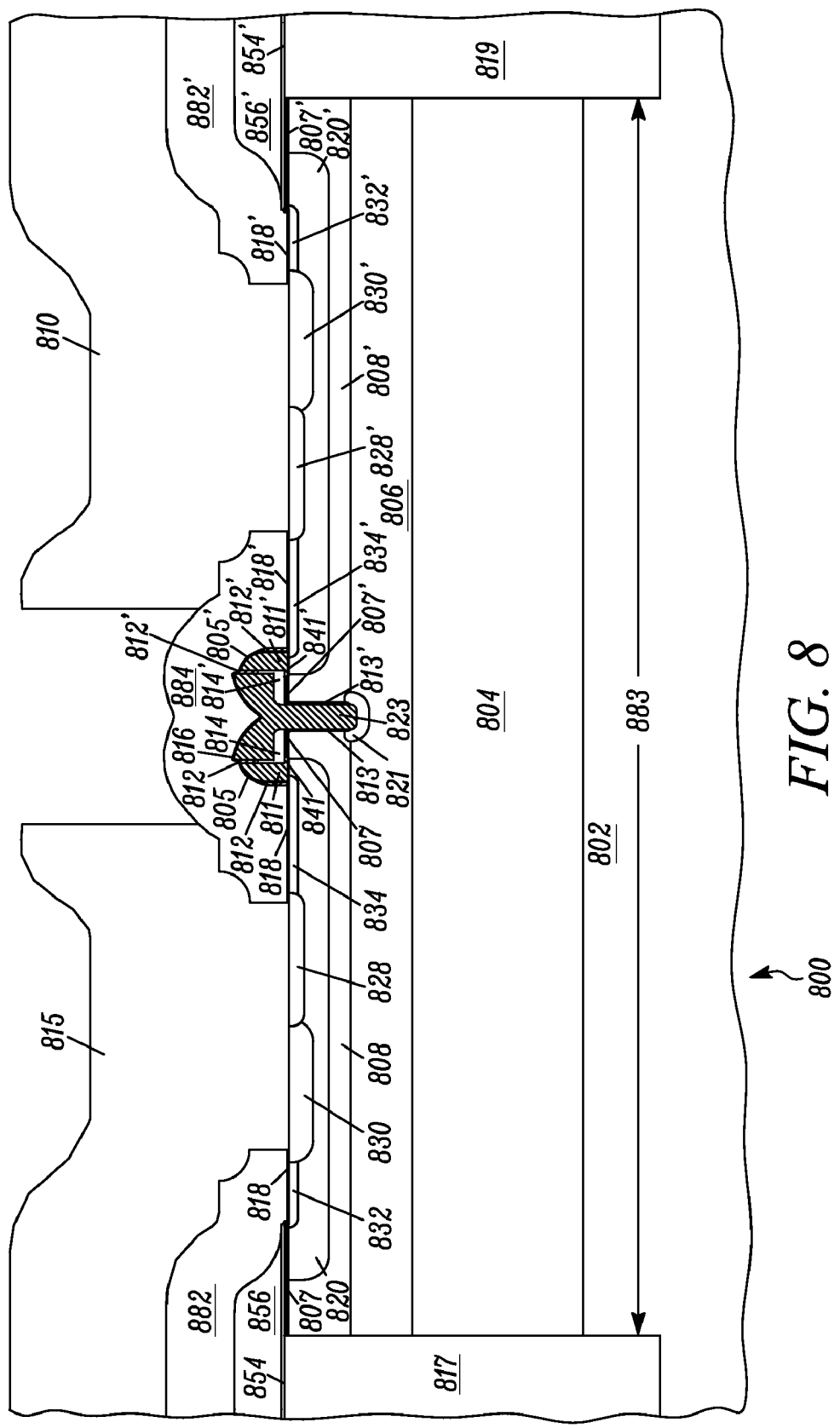
FIG. 8 is a cross section view taken along section lines VIII-VIII of FIG. 7, of a realization of the embodiment depicted schematically in FIG. 6.
Figure 9:
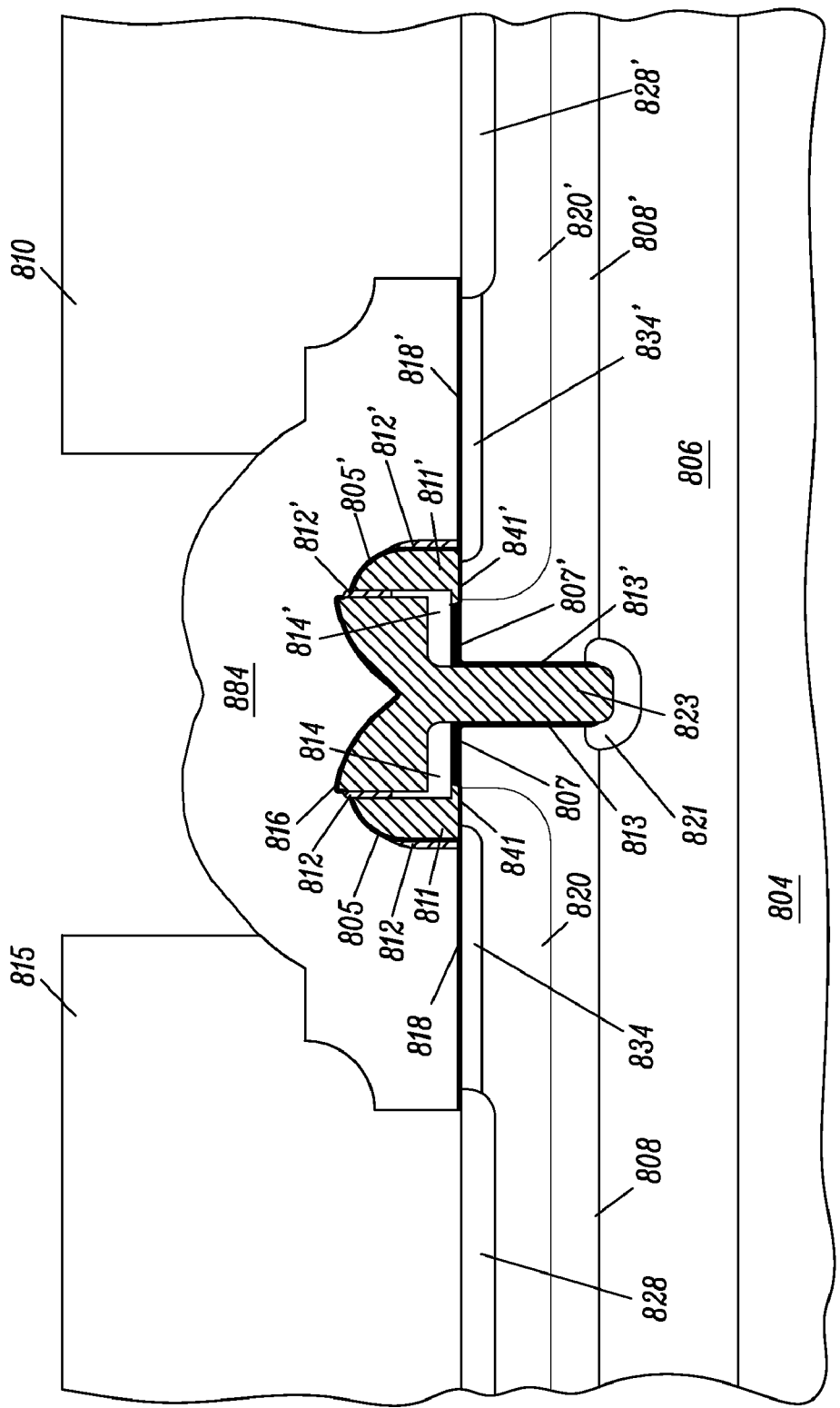
FIG. 9 is an enlarged side view of a portion of the view of FIG. 8.
Figure 10:
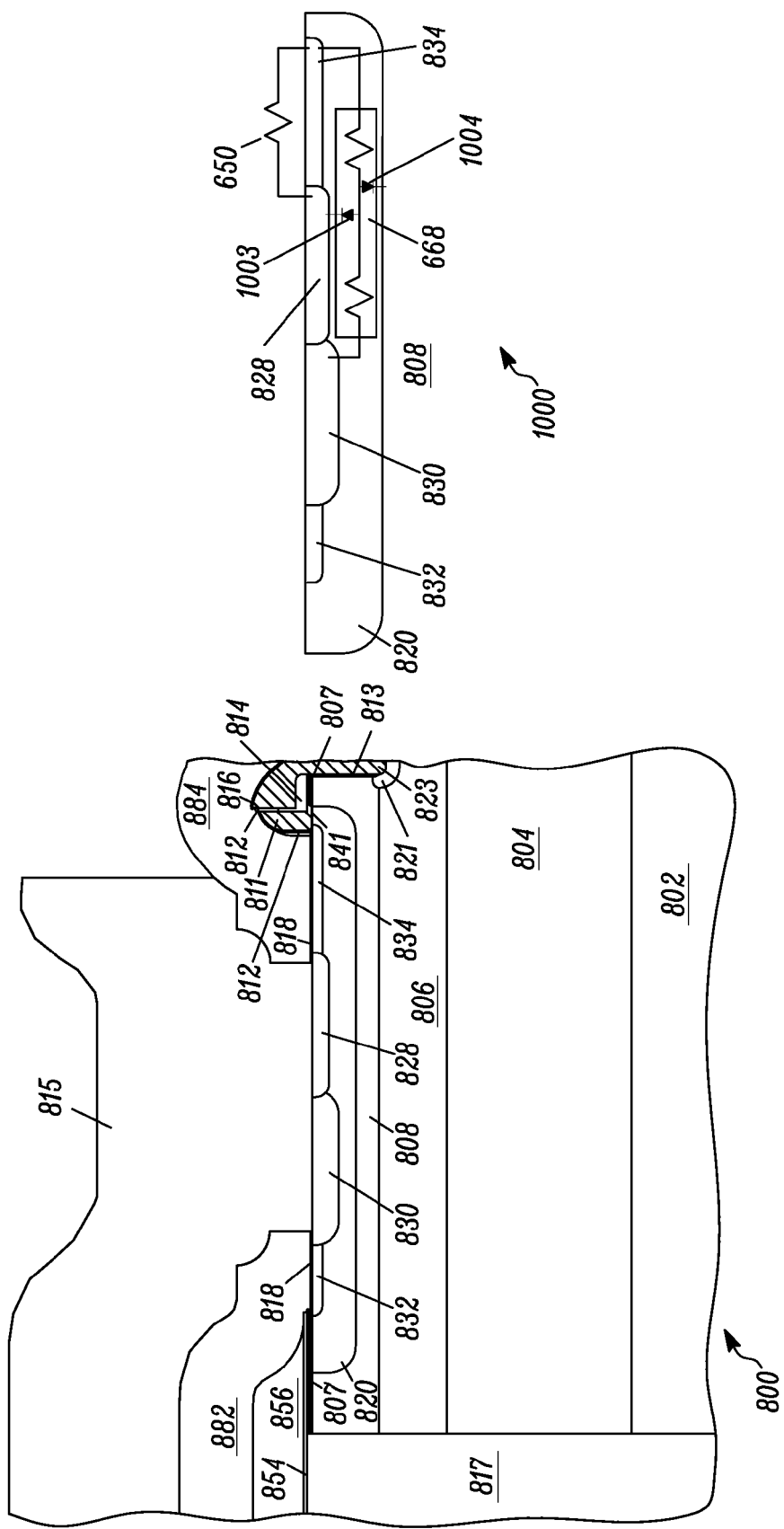
FIG. 10 is a composite physical and schematic diagram of a portion of the structure in FIG. 8.

The following description including a plan view in FIG. 7, and cross sectional views, or side views in section, shown in FIGS. 8 and 9, together with a hybrid cross sectional/schematic diagram of FIG. 10, describes exemplary physical embodiments of the concepts described in the present disclosure. FIG. 7 is a plan view of an embodiment 700 of a circuit layout capable of use with the transient suppression device 105 of FIG. 1. The plan view shown in FIG. 7 finds broad applicability in the relevant arts. The description of FIGS. 8 and 9 corresponds to a physical embodiment of the schematic circuit diagram 600 of FIG. 6.

The diagram 700 includes an active region 705 that finds application in the context of the transient suppression device 105 of FIG. 1, the exemplary schematic diagram 600 of FIG. 6 and the view of FIG. 8, infra. The diagram 700 also illustrates contact regions or pads 710, 715.

The contact region or pad 710 is formed along an interior edge of the active regions and, in this example, surrounded by, the active region 705. Contact region or pad 715 is formed along an exterior edge of the active region 705. The contact regions 710, 715 of FIG. 7 are analogous to conductors 510, 515 of FIG. 5, the conductors 610, 615 of FIG. 6 and the terminals 110, 115 of FIG. 1, for example.

In the embodiment depicted in FIG. 7, the contact regions 710 and 715 may be configured to accept a bond wire coupling the active region 705 to an external circuit that is to be protected from voltage transient effects. In the embodiment of FIG. 7, the active region 705 is arranged in a roughly square configuration, which might have a surface area comparable to a conventional bond pad, for example, or which may be larger or smaller than such, depending on the desired application that the transient suppression device is intended for. The contact regions 710 and 715 may be formed to be compatible with bump technology, and intended for input/output (I/O) transient protection for an integrated circuit or RF amplifier. In one embodiment, the contact regions 710 and 715 have a generally square footprint comprising a contact area on the die of about 400 micrometers on a side, for example.

In configurations intended for high power applications, the contact regions 710 and 715 may be formed using a layered series of conductive materials and/or metals to provide metallurgical compatibility with the various relevant concerns. The squared shapes and serpentine outline shown in FIG. 7 increase the surface area of the active region 705 within the footprint of the overall squared outline, directly increasing the current-carrying capacity of the transient suppression element 105, without substantial increase in overall footprint. These shapes also may provide favorable thermal contact (high thermal conductivity) from the transient suppression device 105, and the substrate from which the transient suppression device 105 is formed, to an external heatsink (not illustrated), if desirable.

A further desire in many applications is that the transient suppression device 105 provides relatively little OFF-state DC or RF loading of the circuitry to which it is coupled. One facet of this is favorably influenced by designing the transient suppression device 105 to be co-integrable with high-speed circuitry. For example, forming device 105 integrated with complementary metal oxide semiconductor devices on the same semiconductor substrate may reduce or eliminate parasitic capacitance issues associated with abutting two circuit elements and then joining them with via I/O pads, conductors such as bond wires and the like. Parasitic inductance and RC transmission characteristics and effective switching speeds may be negatively influenced by physical separation and by use of conductive traces, bond wires, pins and/or other inter-element interconnections that may be needed to join elements together.

Capacitance within transient suppression devices 105 themselves, coupled with need for any significant DC current draw in the OFF state, also limit applications for such transient suppression devices 105 and tend to compromise performance characteristics realized through inclusion of transient suppression devices 105 in many circuit applications. The examples of FIGS. 5, 6 and 8 result in relatively low OFF-state capacitance and thus relatively low OFF-state capacitive loading. In view of the low OFF-state capacitance of these embodiments, a further benefit may be afforded by routing conductors (such as the terminals 110 and 115 of FIG. 1) over dielectric areas such as, for example, dielectric regions 817 and 819 discussed below in FIG. 8, to provide relatively low capacitance between the substrate and the conductors 110 and 115.

Accordingly, in one embodiment, relatively large portions of the contact regions 710 and 715 are formed over relatively thick dielectric structures that, in turn, are formed to have a relatively low coefficient of permittivity. For example, the contact regions 710 and 715 may be formed over dielectric regions (not illustrated in FIG. 7) analogous to regions 817 and 819 of FIG. 8, but having broader lateral extent away from edges of the active area. In some embodiments, the dielectric regions may extend from a top surface of the substrate into the substrate approximately 10 microns (μm), but might be formed to have a different depth, such as a depth in a range of between about 3 microns to about 30 microns. In some embodiments, dielectric regions 817 and 819 may each have a width ranging from approximately five microns to approximately 300 microns. In alternate embodiments, the width of dielectric regions 817 and 819 may be about five microns or about ten microns.

Forming such dielectric regions to have a relative dielectric constant $\in_R$ of that of silicon dioxide (for example, about 3.9) or less may be desirable, and in some instances a dielectric structure incorporating sealed voids to provide a relative dielectric constant $\in_R$ as low as 1.5 or lower may be desired (for example, see FIGS. 11, 12, and 13 for an example of a dielectric structure including sealed voids that may be used for dielectric structures 817 and 819), or a dielectric region having effective relative dielectric constant $\in_R$ of approximately 2.5 may be employed, provided that such dielectric region also conforms with thermal coefficient of expansion, mechanical stability and other concerns applicable in the relevant context.

Use of such dielectric regions realizes relatively low parasitic capacitance in structure 800. As such, the overall RF impedance of the composite transient suppressor element 105 that includes such dielectric regions may be reduced, improving high-frequency performance of the transient suppressor device 105 by leveraging the beneficial OFF-state shunt impedance of, for example, the embodiment 600 depicted in schematic form in FIG. 6.

In some applications, the transient suppressor device 105 may be fashioned as a stand-alone or discrete component that is intended to be attached to other circuitry via a conductive bump. In some applications, one or more of the transient suppressors 105 may be integrated into a more complex circuit, with one or more of the transient suppressor devices 105 being associated with input/output interconnections of the composite integrated circuit to other circuitry external to the die on which the composite device is realized. In such applications, a height (not illustrated) may be used for the contact regions 710 and 715 to extend above the substrate and the height may be selected that is compatible with any voltage stand-off requirements associated with elements co-integrated with transient suppressor device(s) 105.

FIG. 8 is a cross section view, or side view, in section, taken along section lines VIII-VIII of FIG. 7, of a structure 800 providing a physical realization of the embodiment 600 depicted schematically in FIG. 6. FIG. 8 shows a substrate 802, which in some embodiments, may be a silicon substrate 802 that is doped to have a p-plus (p+) or p-conductivity type. In some embodiments, the substrate 802 is doped to have an acceptor concentration $N_A$ in a range of from $10^{18}$ acceptors/cm$^3$ to $10^{20}$ acceptors/cm$^3$, corresponding to a resistivity of 0.001 Ω-cm to 0.02 Ω-cm, although greater or lesser doping concentrations may be employed. Substrates such as substrate 802 are typically much thicker than structures, regions, or layers such as epitaxial layers that are formed atop, over or as part of the substrate, and substrate 802 that is heavily doped to be p-type is also compatible with many standard CMOS and RF circuitry processes.

The structure 800 of FIG. 8 includes a layer 804 formed over or above the substrate 802, a layer 806 formed atop the layer 804, a layer 808 formed overlying the layer 806, and surface dielectric layers or regions 807, 807', 841, and 841'. The structure 800 also includes a contact region 810, a contact region 815, isolation structures or regions 817 and 819, doped regions 820, 820' and a doped region 821 formed in the layer 806 and which may extend into the layer 808. The structure 800 also includes a conductive plug 823 extending from above a top surface of the layer 808 down to, and providing electrical contact to, the doped region 821 and the layer 806. Dielectric layers 807 and 807' each have an upper or top surface and a lower or bottom surface. In some embodiments, the lower surface of dielectric layer 807 is substantially coplanar to a top surface of doped region 820 and is substantially coplanar to a top surface of semiconductor layer 808. The top surface of dielectric layer 807 is substantially coplanar to a top surface of dielectric structure 817, however, in alternate embodiments, dielectric structure 817 may be formed so that the top surface of dielectric structure 817 is above or below a plane that is substantially coplanar to the top surface of dielectric layer 807.

Turning briefly to FIG. 9, a central portion of the structure 800 illustrated in FIG. 8, is shown in an enlarged view in FIG. 9. Referring to FIG. 8 and/or FIG. 9, structure 800 also includes dielectric regions 813, 813', doped regions 828, 828' and doped regions 830, 830', and includes doped regions 832, 832', 834 and 834', each being disposed in the regions 820 and 820', respectively. In some embodiments, the doped region 830 is connected to the doped region 828; the doped region 828 is connected to the doped region 834; the doped region 828 is in between the doped region 834 and the doped region 830; the doped region 830' is connected to the doped region 828'; the doped region 828' is connected to the doped region 834'; and the doped region 828' is in between the doped region 834' and the doped region 830'. Further, in some embodiments, wherein a depth of the doped region 828 is less than a depth of the doped region 830; a depth of the doped region 834 is less than a depth of the doped region 828; a depth of the region 828' is less than a depth of the doped region 830'; and a depth of the doped region 834' is less than a depth of the doped region 828'.

Structure 800 also includes dielectric region 841 and includes dielectric region 856 formed over a portion of layer 808 and over a portion of the isolation structure 817. Similarly, structure 800 also includes dielectric region 841' and includes dielectric region 856' formed over a portion of layer 808' and over a portion of the isolation structure 819. In addition, structure 800 includes dielectric region 882 formed over the dielectric region 856, and over a portion of the layer 808. Similarly, structure 800 includes dielectric region 882' formed over the dielectric region 856', and over a portion of the layer 808'. In some embodiments, FIG. 8 depicts a transient suppression device 105 having a width 883 of the active electronic elements or active area (the area between the isolation structures 817, 819) of about twenty micrometers or less, achieving a relatively compact result consistent with real estate constraints of high density microelectronics devices, such as are employed in realization of communications and computations apparatuses. Accordingly, in these embodiments, layers 804 and 806 have a width of about twenty microns or less, and layers 808 and 808' each have a width of less than ten microns.

In some embodiments, the layers 804, 806 and 808 are formed as epitaxial layers of semiconductor material, such as silicon. However, it will be appreciated that doped regions or layers such as 804, 806 and 808 may be realized via other conventional practices, such as ion implantation. In one embodiment, the layer 804 is a p-type epitaxial layer 804 having relatively light doping, also known as a mu layer, and is formed atop the substrate 802. In one embodiment, the layer 804 is formed to have a thickness in a range of about two to about four micrometers (μm), although thicker or thinner layers may be employed. For example, a layer 804 having a thickness of about ten micrometers could be employed. The layer 804 typically incorporates an acceptor concentration $N_A$ in a range of from $10^{13}$ to about $10^{15}$ acceptors/cm$^3$, corresponding to a resistivity of about 4 Ω-cm.

In some embodiments, the layer 806 is an n-type layer 806, and is formed over the layer 804 by ion implantation into the surface of the mu layer 804 and prior to any further epitaxial layer growth, to have a thickness of on the order of about one and one-half micrometers to about two micrometers, although other thicknesses may be usefully employed. Alternatively, the n-type layer 806 may be formed subsequent to formation of epitaxial layers above the p-type layer 804, by high energy ion implantation. In either case, the n-type layer 806 may be more heavily doped than the underlying mu layer 804 in some embodiments. In one embodiment, the layer 806 is formed to have a donor concentration $N_D$ in a range of from about $5 \times 10^{18}$ donors/cm$^3$ to about $5 \times 10^{20}$ donors/cm$^3$.

In some embodiments, the layer 808 is an n-type epitaxial layer 808, and is formed is formed over the layer 806. In some embodiments, the layer 808 has a thickness of about one micrometer. In some embodiments, the layer 808 is formed to have a donor concentration $N_D$ of about $2 \times 10^{16}$ donors/cm$^3$, corresponding to a resistivity of on the order of about 0.3 Ω-cm. The regions 820, 820' are doped to provide p-type areas, and also are referred to as "p-tubs."

Layers or regions 802, 804, 806, and 808 may each be referred to as a semiconductor material in some embodiments. It will be appreciated that all of the regions 802, 804, 806 and 808 may formed using other doping concentrations and thickness and that other combinations of doping and thickness may be used. In addition, in some embodiments, p-type regions 802 and 804 may be optional. For example, in embodiments wherein device 105 is a discrete device that will be bump attached, epitaxial layer 808 could be formed on a heavily doped n-type substrate. In these embodiments, contact to device 105 would be through contact regions 810 and 815 and there would be no contact or attaching to the back of the die as the n-type substrate would be floating. In embodiments wherein the die includes more than one transient suppressor device, then structure 800 of FIG. 8, having p-type substrate 802 and p-type region 804, may be used and also structure 800 may be used when device 105 is integrated with other types of devices.

Contact structures or regions 810 and 815 are formed over the ensemble of layers 804, 806 and 808 comprising the structure 800. Contact regions 810 and 815 are respectively analogous to terminals 110, 115 of FIG. 1, conductors 610, 615 of FIG. 6, contact or pad regions 710, 715 of FIG. 7, and conductors 510, 515 of FIG. 5. The contact regions 810, 815, may also be referred to as "ohmic" contacts, and provide relatively low resistance bidirectional electrical contact to selected portions of the transient suppressor device 105 of FIG. 1, for example. In one embodiment, the contact region 810 may extend over the isolation structure 819 and the contact region 815 may extend over the isolation structure 817.

Isolation structures 817, 819 provide lateral electrical isolation of the structures 804, 806 and 808, and may provide edge termination mitigating effects of depletion region curvature, and also provide capacitive isolation of the conductive contacts 810 and 815 from the substrate 802, among other things. In some embodiments, the dielectric structure 817 is between substantially all of the interconnect 815 and the semiconductor substrate 802 to reduce parasitic capacitance between the interconnect 815 and the semiconductor substrate 802, and similarly, the dielectric structure 819 is between substantially all of the interconnect 810 and the semiconductor substrate 802 to reduce parasitic capacitance between the interconnect 810 and the semiconductor substrate 802.

In some embodiments, the dielectric structure 817 is between at least a portion of, or a majority of, the interconnect 815 and the semiconductor substrate 802 to reduce capacitance between the interconnect 815 and the semiconductor substrate 802.

In some embodiments, the isolation structures 817 and 819 may be formed to have a depth extending through the epitaxial or counter-doped layers 804, 806 and 808 and extending into the substrate 802, as illustrated in FIG. 8, or may be formed to have a different depth in other embodiments. It is also noted that in some embodiments, dielectric structures 817 and 819 may be optional, that is, structure 800 may be formed without dielectric structures 817 and 819. In other words, in some embodiments, other isolation means may be used to isolate the active region of structure 800. Further, in some embodiments, dielectric structures 817 and 819 may be separate discrete structures formed substantially simultaneously, or formed at different times, an in other embodiments, dielectric structures 817 and 819 may be a unitary structure that surrounds the active region of structure 800.

The structure 800 also includes a region 821, which may be an n-type doped region 821 adjacent and electrically coupled to a heavily n-type doped polycrystalline silicon plug 823 formed in an opening or trench above the region 821. The region 821 and the plug 823 collectively form a low-resistance electrical contact to the layer 806. An n-type doped region 828 is in the p-tub region 820, and an analogous n-type doped region 828' is formed in the doped p-tub region 820'.

Referring to FIGS. 8 and 9, structure 800 includes conductive sidewall gate portions 811 and 811', conductive portions 812 and 812', dielectric structures 814 and 814', dielectric layer or region 816, and dielectric layers 818 and 818', dielectric layers 841 and 841', and dielectric regions 882, 882', and 884.

Referring to FIGS. 5, 6, 8, and 9, regions 806, 808, and 808' correspond to conductor 570 of FIG. 5 and to conductor 670 of FIG. 6. That is, conductor 670 of FIG. 6 corresponds to n-type buried layer 806 and n-type epitaxial layers 808 and 808' which together form a common contact, node, or bus, within device 105, that is attached to the collectors of NPN transistors 640' and 640, the gates and drains of n-channel MOSFETs 680 and 680', and the base electrodes of PNP transistors 660 and 660'.

Referring to FIGS. 6, 8, and 9, the n-type region 828 corresponds to the emitter 644' of the NPN transistor 640' of FIG. 6. Similarly, the n-type region 828' corresponds to the emitter 644 of the NPN transistor 640 of FIG. 6. The portion of the p-type region 820 underlying the region 828 corresponds to the base 646' of the NPN transistor 640'. Similarly, the portion of the p-type region 820' underlying the region 828' corresponds to the base 646 of the NPN transistor 640. The portion of the n-type layer 808 and the n-type layer 806 underlying the n-plus (n+) region 828 corresponds to the collector 648' of the NPN transistor 640'. Similarly, the portion of the n-type layer 808' and the n-type layer 806' underlying the n-plus (n+) region 828' corresponds to the collector 648 of the NPN transistor 640.

The structure 800 further includes heavily p-type doped or p-plus (p+) regions 830 and 830' disposed in the p-type regions 820 and 820', respectively. In addition, structure 800 includes n-type, doped regions 832 and 834 formed in p-type region 820 and includes n-type, doped regions 832' and 834' formed in p-type region 820'. As will be discussed below, in some embodiments, n-type doped regions 832, 832', 834 and 834' may be more lightly doped than n-type doped regions 828 and 828'. Further, doped regions 832, 832', 834 and 834' may be formed during the same ion implant step, and doped regions 832 and 832' may be floating regions, and therefore, are essentially inactive during the operation of device 105.

Structure 800 may be referred to as a merged structure. In the context of the disclosed structure, a merged structure refers to a semiconductor device which has regions that independently can perform as different elements of a schematic representation of the device. In other words, the structure 800 of FIG. 8 can be represented or correspond to circuit 600 of FIG. 6, and regions or elements of structure 800 can correspond to multiple elements of circuit 600 so that regions or elements of structure 800 perform multiple functions of circuit 600. For example, the n-type doped region 834 corresponds to the source 682' of the MOSFET 680' and the n-type doped region 834' corresponds to the source 682 of the MOSFET 680. In addition, the n-type doped region 834 also corresponds to the resistor 650' and to the emitter 642' of the NPN transistor 640'. Similarly, the n-type doped region 834' also corresponds to the resistor 650 and to the emitter 642 of the NPN transistor 640.

The dielectric layer 841 corresponds to the gate dielectric or gate oxide layer for the MOSFET 680'. Conductive gate structure 811 overlies the dielectric layer 841 and functions as the gate electrode 684' of MOSFET 680' and that portion of the p-type region 820 under the dielectric layer 841 functions as the channel region for the MOSFET 680'. Similarly, the dielectric layer 841' corresponds to the gate dielectric or gate oxide layer for the MOSFET 680. Conductive gate structure 811' overlies the dielectric layer 841 and functions as the gate electrode 684 of MOSFET 680 and that portion of the p-type region 820' under the dielectric layer 841' functions as the channel region for the MOSFET 680. The portion of region 808 adjacent to the channel region of MOSFET 680' corresponds to the drain 686' of MOSFET 680' and the portion of region 808' adjacent to the channel region of MOSFET 680 corresponds to the drain 686 of MOSFET 680.

Region 830' and the portion of p-type region 820' under p-type region 830' corresponds to the emitter 661' of PNP transistor 660'; the base 664' of PNP transistor 660' corresponds to portions of layers 808', 806, and 808, and the collector 667' of PNP transistor 660' corresponds to the portion of p-type region 820 under p-type region 830. Similarly, region 830 and the portion of p-type region 820 under p-type region 830 corresponds to the emitter 661 of PNP transistor 660; the base 664 of PNP transistor 660 corresponds to portions of layers 808, 806, and 808', and the collector 667 of PNP transistor 660 corresponds to the portion of p-type region 820' under p-type region 830'. As will be described below with reference to FIG. 10, resistor 668 is a pinch resistor formed in the portion of region 820 under regions 828 and 834, and similarly resistor 668' is a pinch resistor formed in the portion of region 820' under regions 828' and 834'. The emitter 662 of PNP transistor 660 is in series with resistor 668 and the emitter 662 corresponds to a portion of region 820 that is under a portion of region 828 and/or a portion of region 834, and similarly, the emitter 662' of PNP transistor 660' is in series with resistor 668' and the emitter 662' corresponds to a portion of region 820' that is under a portion of region 828' and/or a portion of region 834'.

In some embodiments, the conductors 810 and 815 may be formed using an initial layer of titanium having a thickness of about 600 Angstroms to form a titanium silicide surface layer with the surfaces of the doped regions 828, 830, 828' and 830' of the embodiment of FIG. 8 of the transient suppression device 105 and this layer of titanium may be overlaid with a layer of titanium nitride having a thickness of about 800 Angstroms. Titanium is one of many materials useful in forming high electrical conductivity or "ohmic" contacts to silicon devices and may also be formed atop silicon dioxide or other materials employed in the transient suppression device 105. It will be appreciated that many different selections of materials may be used in this capacity and that a variety of formation techniques may be useful. As an example, in some embodiments, a layer of titanium sufficiently thick to provide the desired thicknesses may be annealed in dry nitrogen, for example via rapid thermal annealing, to form a strongly-bonded, conductive titanium nitride layer that also is capable of functioning as a chemical and metallurgical barrier.

The contact regions 810 and 815 may be further formed using, for example, a layer of 14,000 Angstroms of suitable metals or alloys, such as, for example, aluminum, aluminum-copper alloy, tungsten or any other suitable metal formed over the metallurgical barrier layer and that conform to the outlines of the active region 705 (FIG. 7). Other materials or metals may be employed, to provide suitable electrical and thermal conductivity, physically and metallurgically robust contacts, and surfaces capable of interconnection to circuitry external to the substrate 802 from which the transient suppressor device 105 is formed over, when such interconnection is anticipated.

FIG. 10 is a composite physical and schematic diagram 1000 of a portion of structure 800. The composite diagram 1000 corresponds to several blended or distributed elements of the merged structure 800, including the multiple-emitter NPN transistor 640' of FIG. 6, portions of the multiple-emitter PNP transistors 660 and 660' of FIG. 6, the resistors 650' and 668, and the MOSFET 680'.

As discussed above with reference to FIGS. 8 and 9, resistor 650' corresponds to n-type region 834, which is more lightly doped than n-type region 828. Resistor 650' extends from the end of region 828 that is connected to region 834, though region 834 to the end of the region of 834 that corresponds to the source 682' of MOSFET 680' and is adjacent to the channel region of MOSFET 680'.

As is illustrated in composite diagram 1000, resistor 668 is a pinch resistor formed in the portion of region 820 under regions 828 and 834, that is, resistor 668 is formed in the region of p-type region 820 that is pinched between n-type regions 828 and 834 and underlying n-type region 808 so that n-type regions are on both sides of the p-body region 820 to form pinch resistor 668. As is illustrated in composite diagram 1000, resistor 668 is formed in region 820, extending from the end of region 830 that is connected to region 828 to the end of region 834 that is next to the channel region of MOSFET 680'. Pinch resistor 668 is further illustrated by showing a diode 1003 that represents the p-n junction between the regions 820 and 828 and a diode 1004 that represents the p-n junction between the regions 820 and 808. Resistor 668 is defined by the amount of p-type dopant that is in region 820, and as is discuss6ed below, the region 820 is formed through a triple implant or chain implant process. In addition, this implant process may be used to establish the threshold voltages of MOSFETs 680 and 680', the forward voltage drops or turn-on voltages $V_{BE}$ and current gains of the bipolar transistors of circuit 600.

Referring to FIGS. 6, 8, 9, and 10, resistor 668 is a resistor that may be used to prevent latch-up by providing a current path to remove charge from the base-emitter junction of NPN transistor 640' so that when a transient voltage applied across conductors 610 and 615 falls, the base drive current available to the base 646' of NPN transistor 640' is reduced so that NPN transistor 640' will not remain on. Latch-up is a condition wherein the only way to turn off the devices of circuit 600 may be by removing the applied drive voltages to circuit 600 which may be undesirable in many applications.

In the OFF state, internal portions of the circuit 600 provide relatively high impedances, which can result in internal charge buildup or accumulation, when a relatively large voltage has been applied to the power electrodes. As a result, fluctuations in the voltage applied to the power electrodes can lead to "false triggering" of circuit 600. One way of reducing probability of false triggering is to include bleed resistors, that is, resistors that permit stored charge to bleed away from areas in which it can contribute to such false triggering.

One function that is fulfilled via the resistors 668 and 668' of the embodiment 600 of FIG. 6, and by the resistors 558 and 558' of the embodiment 500 of FIG. 5, is to facilitate such bleeding of stored charge. Accordingly, these embodiments of transient suppression devices, acting in the role of the transient suppression device 105 of FIG. 1, are less vulnerable to false triggering than some examples from the prior art.

Resistors 650 and 650' provide temperature compensation in circuit 600. The resistors 650 and 650' of the circuit 600 of FIG. 6 provide a thermal ballast in circuit 600 when the transient suppression device 105 experiences an electrical stress that is sufficient to result in significant temperature excursion. Resistors 650 and 650' have positive temperature coefficients, meaning that as the temperature rises, the resistance of resistors 650 and 650' increases. On the other hand, MOSFETs 680 and 680' each have a negative temperature coefficient meaning that as the temperature rises, the threshold voltages $V_{TH}$ of MOSFETs 680 and 680' decrease. Similarly, bipolar transistors 640, 640', 660, and 660' each have a negative temperature coefficient, meaning that as the temperature rises, the forward base-emitter voltage drop or turn-on voltages $V_{BE}$ of transistors 640, 640', 660, and 660' decrease. Therefore, by having resistors 650 and 650' present, the clamp voltage of circuit 600 may be regulated to a better degree than a circuit that does not include resistors 650 and 650'. As energy is dissipated within structure 800, the temperature of structure 800 will rise, and therefore, the turn-on voltage $V_{TO}$, or clamp voltage, of structure 800, would be reduced as more energy is dissipated due to the negative temperature coefficients of transistors 640, 640', 660, 660', 680, and 680'. Resistors 650 and 650', having positive temperature coefficients, will at least partially counteract or counterbalance the effect of the negative temperature coefficients of transistors 640, 640', 660, 660', 680, and 680', to provide thermal compensation or temperature compensation in circuit 600 to reduce variations in the clamp voltage of circuit 800 due to temperature excursions.

Emitter 642 is a distributed type emitter since towards the center of structure 800 (that is, toward an area including conductive plug 823) the gain of the emitter decreases since there is more degeneration. In other words, as discussed above, resistor 650 is also formed as part of region 834' which is the region where emitter 642 is formed. Accordingly, toward the center of structure 800, the gain of emitter 642 is reduced and the resistance of resistor 650 increases.

When NPN transistor 640' is turned ON, current through the emitter 642' of the NPN transistor 640' also results in a voltage that develops across the resistor 650'. The voltage across the resistor 650', in turn, tends to reduce current gain $A_I$ associated with at least the portion of the circuit 600 that includes the NPN transistor 640'. In other words, the resistors 650, 650' provide voltage feedback acting to degenerate the effective current gain β of the transistors 640 or 640', respectively, as current (150, 250, 350) through the transient suppressor device 105 increases, and the reduction in effective transistor gain β as the circuit 600 goes towards the ON mode also tends to stabilize the performance of the circuit 600.

As discussed above, structure 800 (FIGS. 8, 9, 10) is a merge structure, wherein regions, or portions of regions, of structure 800 may perform more than one function, or correspond to more than one element, of circuit 600 (FIG. 6). For example, as discussed herein, p-type region 820 performs more than one function, in that, portions of region 820 serve as a portion of resistor 668, as the base 646' of NPN transistor 640', as the collector 667' of PNP transistor 660', as the emitter 662 of NPN transistor 660, as a portion of the emitter 661 of the PNP transistor 660, and as the channel of MOSFET 680'.

Referring again to FIGS. 6, 8, 9, and 10, the operation of circuit 600 in view of structure 800 will be explained with the following example beginning with the application of a voltage present on conductor 810 increasing relative to a voltage present on the conductor 815. As the voltage on conductor 810 rises with respect to the voltage on conductor 815, electrical current flow is initiated through resistor 668', which is formed within region 820' as a pinch resistor. The current flows from region 830' to region 820', and as discussed herein, these regions correspond to emitters 661' and 662' of PNP transistor 660'.

Emitter 661' is a distributed emitter in that it is distributed throughout region 820', however, the portion of region 820' that is below region 830' will be the lowest resistance portion, and therefore, will be the most active portion of emitter 661' meaning that when the current starts to flow from region 830' a majority of the current will flow through the portion of region 820' below region 830'. The current will then flow into region 808', region 806, and then region 808, wherein these regions correspond to the base 664' of PNP transistor 660' and the conductor 670. As is illustrated in structure 800, PNP transistor 660' has a relatively wide base width since base 664' corresponds to regions 808', 806, and 808, and therefore, PNP transistor 660' may be a relatively low gain transistor since the heavily doped n-type buried layer 806 has a relatively large amount of charge in this region. In other words, PNP transistor 660' has a relatively low current gain since the base regions 808', 806, and 808 have a relatively large amount of charge due to the relatively high doping concentration in region 806. With current flow in the emitter-base region of PNP transistor 660', this will give rise to current flow into the collector 667' of PNP transistor 660' which corresponds to p-type region 820. Accordingly, the collector 667' and the emitters 661' and 662' of PNP transistor 660' are on opposite sides of polysilicon plug 823. Similarly, the collector 667 and the emitters 661 and 662 of PNP transistor 660 are on opposite sides of polysilicon plug 823.

With current flow in regions 806 and 808 (corresponding to the base 664' of PNP transistor 660' and the conductor 670), this will initiate current flow through n-channel MOSFET 680'. That is, current will flow between the source 682' (corresponding to region 834) and the drain 686' (corresponding to a portion of region 808) of MOSFET 680'. This current will be relatively low until the threshold voltage $V_{TH}$ of MOSFET 680' is reached.

The current from collector 667' will flow to resistor 668 (corresponding to a portion of region 820), which will result in an increasing voltage applied to the base 646' (corresponding to a portion of region 820) of NPN transistor 640' and the body electrode 688' (corresponding to a portion of region 820), which will result in an increase of the threshold voltage $V_{TH}$ Of MOSFET 680' until NPN transistor 640' turns on. As may be appreciated, PNP transistor 660' and NPN transistor 646' provide a four-layer silicon controlled rectifier (SCR) structure, which is a four-layer PNPN structure wherein the emitter-base PN junction of PNP transistor 660' corresponds to one PN junction and the collector-base PN junction of NPN transistor 640' corresponds to the other PN junction.

If the voltage difference across conductors 610 (corresponding to conductor 810) and 615 (corresponding to conductor 815) reaches a value approximating a turn-ON voltage $V_{TO}$ of the transient suppression device 105, which is the summation of the threshold voltage $V_{TH}$ of MOSFET 680' and the turn-ON voltages $V_{BE}$ of bipolar transistors 660' and 640' ($2*V_{BE}+V_{TH}$), then the voltage across conductors 610 and 615 clamps at a voltage of about $V_{TO}$ and then significantly more current can flow through circuit 600. This mode of operation may be referred to as the ON mode or a high current mode of operation, and in this mode of operation, transistor 640, having emitters 644 (corresponding to region 828') and 642 (corresponding to a portion of region 834'), base 646 (corresponding to a portion of region 820'), and collector 648 (corresponding to portions of regions 808', 806 and 808), operates in an inverse mode or reverse mode of operation, wherein the collector of NPN transistor 640 operates as the emitter of NPN transistor 640, and wherein the emitters 642 and 644 of NPN transistor 640 operate as a collector of NPN transistor 640 to conduct current after a voltage difference of $V_{TO}$ is applied across conductors 610 and 615.

With NPN transistor 640 operating in a reverse mode of operation to conduct current, this results in a five-layer $N\beta_{NPN}$ structure in circuit 600, which can handle relatively more current than a four-layer SCR structure since it has an n-type region at both ends of the five-layer structure. The five-layer NPNPN structure corresponds to n-type region 828' (layer 1), p-type region 820' (layer 2), combined n-type regions 808', 806, and 808 (layer 3), p-type region 820 (layer 4), and n-type region 828 (layer 5). Therefore, when the voltage difference of $V_{TO}$ is applied across conductors 610 and 615 and circuit 600 is in a high current mode of operation, a majority of the current through the circuit 600 passes through PNP transistor 660', through the NPN transistor 640' and through the NPN transistor 640 which is operating in a reverse mode. Further, with such a five-layer structure, the predominant current through structure 800 is electrons. Switching speed, particularly the turn-OFF speed, and peak current-carrying capacity are often direct functions of the mobility of the charge-carrying elements, that is, electrons or holes. Since electrons have 2.3 times the mobility compared to holes, that means the structure 800 can for the same size handle 2.3 times more current, compared to a ESD structure that is primarily based on hole-conduction.

The switching speed, and thus the turn-ON and turn-OFF speeds, are related to the carrier diffusion velocity for sweeping charge carriers out of the relevant regions in the transient suppression device 105. Thus, when a voltage surge suppression device is formed that is based on hole-conduction mechanisms and carrier diffusion, the turn-OFF speed suffers by a factor of 2.3 in comparison to analogous electron-conduction devices, particularly in devices relying on diffusion and/or minority-carrier phenomena in depletion regions. As a result, both area requirements and switching speeds are strongly related to charge-carrier mobility and both are favorably influenced via usage of higher-mobility charge carriers, such as electrons, in at least some types of applications. In some embodiments, the response time, or turn-on and turn-off times, may be about one nanosecond or less. In other words, referring briefly back to FIGS. 3 and 4, the turn-on time ($T_1$ to $T_2$) of the device 105 is less than about one nanosecond and the turn-off time ($T_1$ to $T_2$) of the voltage clamp circuit is less than about one nanosecond in some embodiments.

In some embodiments, the current gain of transistor 660' is less than the current gain of transistor 640'. Similarly, to maintain structure 800 as a symmetrical device, the gain of transistor 660 is less than the current gain of transistor 640. To avoid issues with latching or snapback, and to promote rapid switching and relatively low effective ON mode resistance (the inverse of the slope, dI/dV, of the line segments 210, 210' of FIG. 2), the product of the current gains of the NPN transistor 640' and the PNP transistor 660' is less than, or near or slightly less than unity, that is, $\beta_{NPN}*\beta_{PNP}<1$. Similarly, in these embodiments, the product of the current gains of the NPN transistor 640 and the PNP transistor 660 is near or slightly less than unity.

Current gain $\beta$ of a bipolar transistor is a function of the amount of charge that is stored in the base region, and numerous other design variables, as is understood in the relevant arts. Doping levels are parameters amenable to adjustment as a portion of the fabrication process, without requiring re-tooling of mask sets and the like. Structuring the current gain product to be less or slightly less than unity also provides latitude with respect to fabrication variations and for temperature excursions.

Accordingly, the overall current gain, or current gain product, of transistors 660' and 640' of circuit 600 may be set by establishing the doping levels in structure 800 so that the current gain product is less than one. For example, if the current gain of transistor 640' is about 100, then the current gain of transistor may be set to be about 0.009 so that the current gain product is slightly less than one, that is, about 0.9 in this example. If the current gain product is greater than one, structure 800 may go into a latch mode in response to a voltage transient applied across contact regions 810 and 815. If structure 800 goes into a latch mode, or if snapback occurs, then it may be relatively difficult to return circuit 600 to an OFF mode or reset circuit 600. For example, turning the transistors of circuit 600 off may require removing the applied signals or voltages that are applied to circuit 600. By setting the current gain product of transistors 640' and 660' to be less than one, this will allow circuit 600 to reset, or return or transistor to an OFF mode from an ON mode without having to remove the signal, or whatever voltage difference, is applied across the conductors 610 and 615. With the current gain product of transistors 640' and 660' less than one, this will enable circuit 600 to operate as illustrated in FIGS. 2, 3, and 4. For example, circuit 600 may operate as follows: in response to a voltage transient applied across conductors 610 and 615, as the voltage difference rises to a voltage level greater than the turn-on $V_{TO}$ or clamp voltage of circuit 600, this voltage will be clamped at the turn-on voltage $V_{TO}$, then after the voltage transient drops to a level below the clamp voltage the circuit 600 with return to an OFF mode.

Accordingly, the structures, devices, and circuits disclosed herein, for example, device 105, circuits 500 and 600, and structure 800, provide in some embodiments a device or circuit configured to arrest electrical transient events responsive to a voltage excursion manifested between the first and second terminals, wherein the circuit provides a characteristic voltage-current response having symmetry about a predetermined voltage of less than ten volts, the circuit being configured to provide a positive low ON-mode DC effective resistance, to provide little OFF-mode loading of ancillary elements, presenting an absence of distortion of modulation bearing information that is impressed upon a carrier wave coupled to the circuit, and to exhibit capacity for switching from the ON mode to an OFF mode responsive to an a voltage excursion resulting from the modulation manifesting a time duration within a range of voltages relevant to such switching of less than one nanosecond. In other embodiments, the structures, devices, and circuits disclosed herein, for example, device 105, circuits 500 and 600, and structure 800, provide a clamp circuit formed on a semiconductive substrate and having first and second conductors, the clamp circuit being configured to provide a clamp voltage of about seven volts or less with respect to a voltage difference between the first and second conductors, the clamp circuit including clamping characteristics that are symmetric about a predetermined voltage, wherein the clamp circuit is configured to provide a current-voltage characteristic exhibiting only positive effective direct current resistance at the first and second conductors.

Further, in some embodiments, an electrical device is disclosed, wherein the electrical device comprises a bidirectional polarity, voltage transient protection device such as device 105 described herein. The voltage transient protection device may include a first terminal and a second terminal and may have at least two modes of operation comprising an OFF mode and an ON mode, wherein the amount of electrical current flowing through the voltage transient protection device is less in the OFF mode compared to the amount of electrical current flowing through the voltage transient protection device in the ON mode. In some embodiments, The voltage transient protection device may include a PNP bipolar transistor such as transistor 660 or 660' having a turn-on voltage of $V_{BE1}$ and a first current gain, $\beta_1$, and include a NPN bipolar transistor such as transistor 640 or 640' having a turn-on voltage of $V_{BE2}$ and a second current gain, $\beta_2$, wherein the product of the current gains of the PNP transistor and the NPN transistor is less than unity, that is, $\beta_1*\beta_2<1$. In some embodiments, the current gain of the PNP bipolar transistor, $\beta_1$, is less than the current gain of the NPN bipolar transistor, $\beta_2$.

The transient protection device may further include a field effect transistor (FET) such as MOSFET 680 or 680' having a threshold voltage of $V_{TH}$. The voltage transient protection device may transition from the OFF mode to the ON mode if a voltage difference approximately equal to, or greater than, a predetermined turn-on voltage such as $V_{TO}$ is applied across the first and second terminals of the voltage transient protection device and the voltage transient protection device may transition from the ON mode to the OFF mode if a voltage difference less than the predetermined turn-on voltage such as $V_{TO}$ is applied across the first and second terminals of the voltage transient protection device. In some embodiments, the predetermined turn-on voltage ($V_{TO}$) is approximately equal to the sum of $V_{BE1}$, $V_{BE2}$, and $V_{TH}$, that is, $V_{TO} \cong V_{BE1}+V_{BE2}+V_{TH}$, wherein the magnitude of the predetermined turn-on voltage is symmetric about a predetermined reference voltage such as, for example, a reference voltage of zero volts.

In the following portion of the disclosure, exemplary processes for realizing the structure 800 of FIGS. 8 through 10, respectively, are described with reference to FIGS. 11 through 28. Those of skill in the art will appreciate that variations from the parameters and materials described herein are also possible, and within the scope and spirit of the present disclosure.

Figure 11:
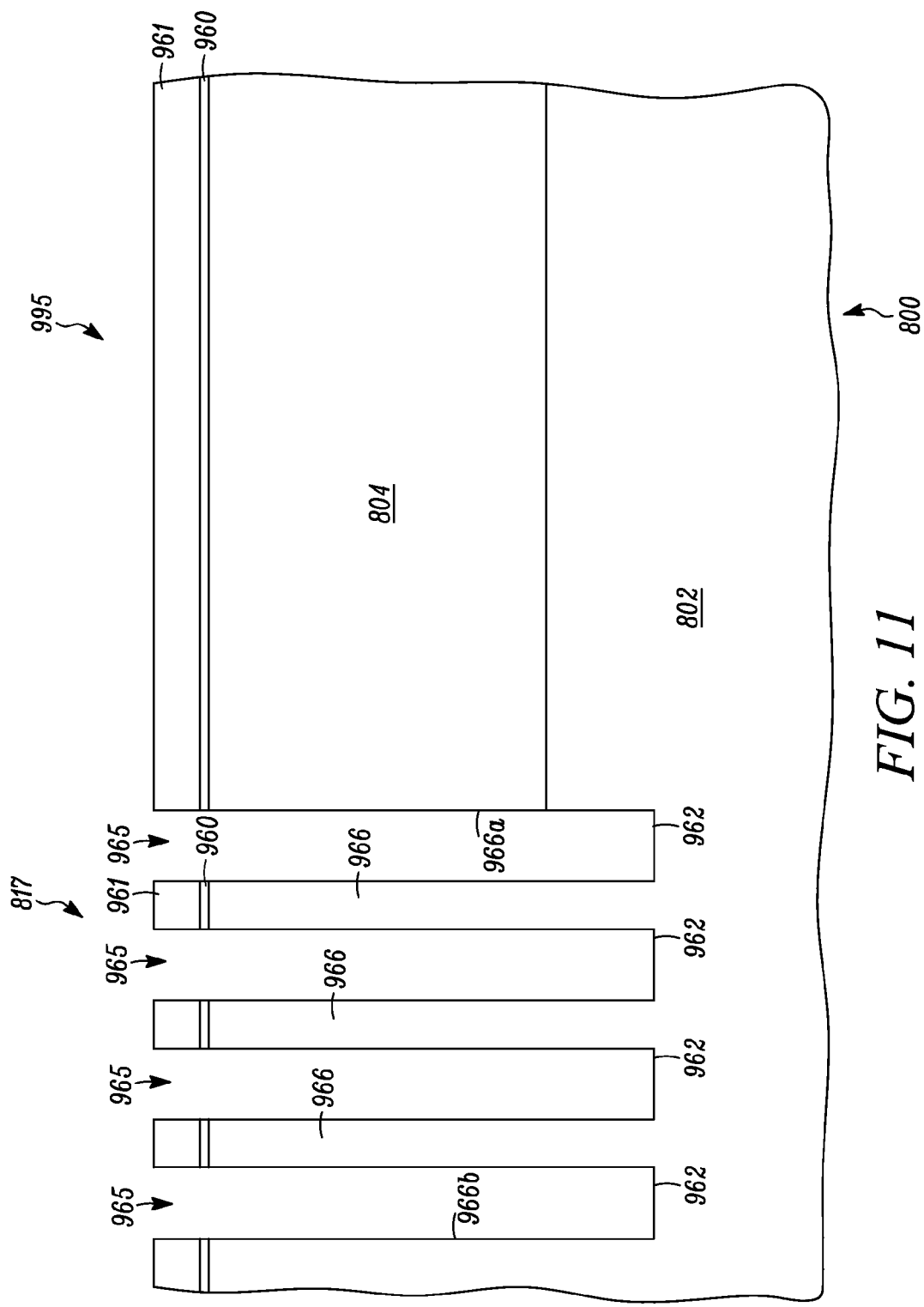
FIG. 11 is a cross section view of a portion of a structure at one stage during manufacturing in accordance with an embodiment of the present disclosure.
Figure 12:
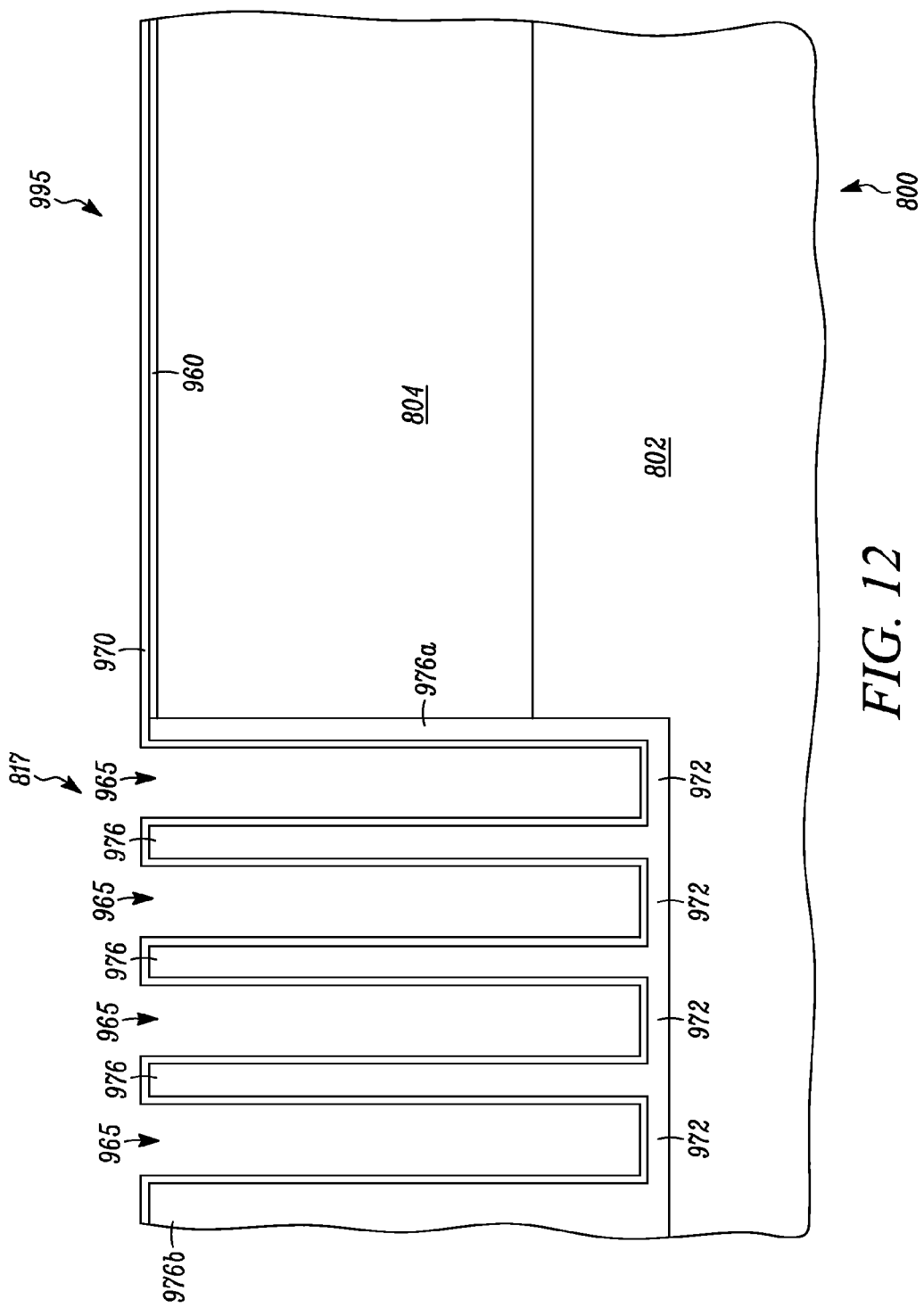
FIG. 12 is a cross section view of the structure shown in FIG. 11 at a subsequent stage of manufacturing in accordance with an embodiment of the present disclosure.
Figure 13:
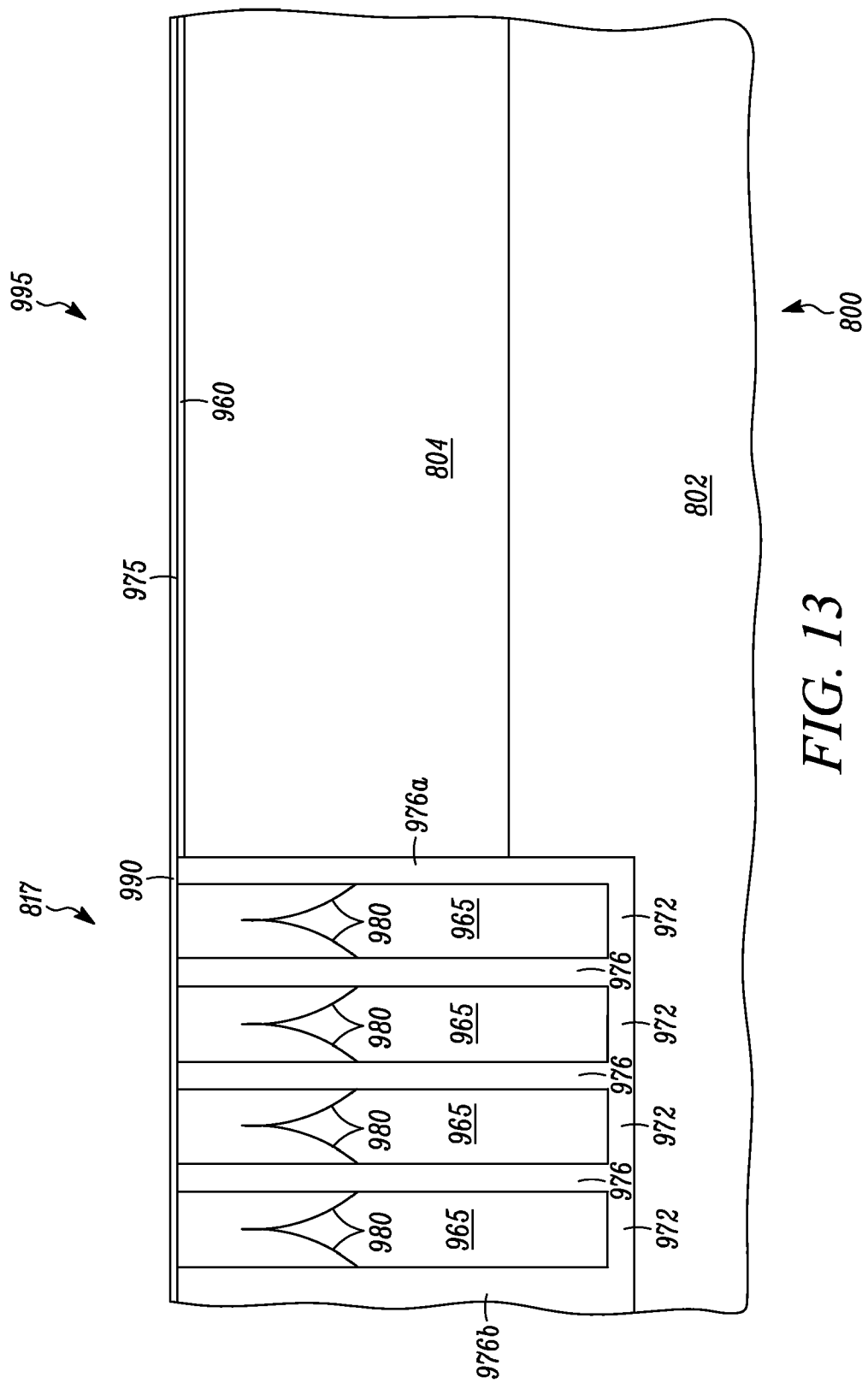
FIG. 13 is a cross section view of the structure shown in FIG. 12 at a subsequent stage of manufacturing in accordance with an embodiment of the present disclosure.

FIGS. 11 to 13 are used to describe at least one embodiment of dielectric structure 817, and a method of making dielectric structure 817. FIG. 11 is a cross section view of a portion of structure 800 at one stage during manufacturing in accordance with an embodiment of the present disclosure. Structure 800 includes p-type substrate 802 and p-type layer 804 described in the discussion of FIG. 8 above.

A dielectric layer 960 overlies layer 804. In an embodiment of the wafer process, dielectric layer 960 comprises silicon dioxide ($SiO_2$). The layer of $SiO_2$ is thermally grown overlying layer 804 having a thickness ranging from approximately 500 Angstroms to approximately 5000 Angstroms (Å). A masking layer 961 is formed overlying dielectric layer 960. Masking layer 961 is patterned exposing portions of dielectric layer 960. The exposed portions of dielectric layer 960 are removed revealing the underlying epitaxial layer 804. Masking layer 961 is then removed. An etching process is then performed to form, for example, a matrix of hexagonal vertical hollow wells, openings, or cavities 965. In particular, an anisotropic etching process is used to etch substantially vertically through at least the epitaxial layer 804 and, preferably, at least part way into substrate 802. In this embodiment, vertical cavities 965 are approximately 2.0 microns wide and spaced 0.4 microns apart from one another and define a matrix of vertically extending structures or walls. Using the anisotropic etching process, vertical cavities 965 are etched through epitaxial layer 804 and into substrate 802 to a depth ranging from approximately 3 microns to approximately 30 microns. The etching of vertical cavities 965 creates silicon pillars or walls 966 between the cavities 965. The innermost wall 966a is adjacent to an outer portion of the active area 995 of device 105. The active area 995 may also be referred to as an active region. Silicon walls 966 are approximately 0.4 microns wide. Dielectric layer 960 is affected by the above wafer process steps such that dielectric layer 960 is reduced in thickness, in some embodiments, from a thickness of about 5000 Å to approximately 3000 Å.

An optional process act may be performed that removes material from silicon walls 966. For example, in some embodiments, a silicon etch is performed that etches exposed portions of silicon walls 966, epitaxial layer 804, and substrate 802. In these embodiments of the wafer process, the silicon etch thins silicon walls 966 to a width or thickness of approximately 0.2 μm.

Referring to FIG. 12, a thermal oxidation process is performed that forms silicon dioxide on any exposed silicon area. In particular, the silicon of silicon walls 966 of FIG. 11 may be substantially completely converted to silicon dioxide forming silicon dioxide walls 976 in the form of a matrix of vertically extending dielectric structures. In other words, the silicon between the sidewalls of walls 966 may be substantially converted to silicon dioxide. In addition, as shown in FIG. 12, during the thermal oxidation process, the exposed silicon surface of the innermost wall (labeled 966a in FIG. 11), the bottom of cavities 965 (labeled 962 in FIG. 11) and the outermost wall (labeled 966b in FIG. 11) are likewise converted to thermal oxide material 976a, 972 and 976b, respectively. Depending on the application, it may be desirable to form, for example, deposit, further dielectric material to increase the thickness of the thermal oxide dielectric material. A further consideration is the time required to form the dielectric material and stress applied to the structure. For example, an additional deposition of a polysilicon layer 970 is performed. Then, a thermal oxidation step oxidizes the polysilicon layer 970 forming a dielectric layer that increases the amount of dielectric material on silicon dioxide walls 976, 976a, 976b and the bottom portions 972 of cavities 965. After these thermal oxidation processes are performed, the silicon dioxide material formed on the sidewalls of openings 965 may be represented as a homogeneous dielectric silicon dioxide material in subsequent figures, wherein the portions of dielectric structure 817 between openings 965 are labeled 976 in subsequent figures, the portion of dielectric structure 817 nearest the active area 995 is labeled 976a, the bottom portions of dielectric structure 817 is labeled 976, and the portion of dielectric structure 817 furthest from the active area 995 is labeled 976b. In addition, the portion of polysilicon layer 970 formed overlying layer 215 is converted to silicon dioxide and may be illustrated as a homogeneous dielectric structure over p-type layer 804 that is labeled 960 in subsequent figures. In other words, the thickness of layer 960 may be increased through this additional optional polysilicon deposition and thermal oxidation processes in some embodiments.

Referring to FIG. 13, a dielectric material is applied to the die. In some embodiments of the wafer process, a low-pressure deposition of TEOS (tetra-ethyl-ortho-silicate) oxide 980 is applied at the surface of structure 800. Some of the deposited material builds up in each opening of vertical cavities 965 gradually reducing the size of the opening until the opening is closed forming a dielectric plug or layer in the upper portions of cavities 965. The remaining lower portions of cavities 965 are not filled in this embodiment. In alternate embodiments, the lower portions of the cavities 965 could be filled with a dielectric material, such as a material comprising oxide or nitride, if so desired, to form a solid, filled dielectric structure 817. Note that a continuous layer of dielectric material is formed in each cavity 965 by way of dielectric layer 980 and dielectric portions 976, 976a, 976b, and 972. This structure of dielectric material, including air gaps 965, is denoted as dielectric structure 817. In some embodiments of the wafer process, approximately 11,000 Å of TEOS 980 is deposited such that an upper region of vertical cavities 965 are sealed to form a plurality of sealed air gaps 965. A thermal oxidation process may follow that densifies the TEOS that is part of dielectric structure 817. Sealed air gaps 965 may also be referred to as a plurality of closed cells, wherein the closed cells may include the air gaps 965, the vertical silicon dioxde structures 976, and the dielectric structures 980.

In some embodiments, an oxide CMP (chemical mechanical planarization) step is then performed to planarize the oxide over the top surface of structure 800 after the dielectric material deposition. The CMP step removes from the top surface portions of TEOS layer 980 and dielectric layer 960 and creates a substantially planar surface 975 over the top surface. It should be noted that although vertical cavities 965 are sealed at the upper surface by dielectric layer 980, vertical cavities 965 are not filled with solid material and comprise a substantial amount of empty space or air gaps. A protective layer 990 is then applied overlying the oxide on the top surface. In some embodiments of the wafer process, a layer of silicon nitride 990 approximately 500 Å thick overlies planar surface 975. As mentioned previously, an alternate process flow that does not require an oxide CMP step could be developed should CMP not be desired or available. The surface should be sufficiently planar to prevent step coverage problems with subsequent wafer processing steps.

In some embodiments, dielectric structure 817 may be referred to as a dielectric platform or dielectric region, and may be formed greater than 10 microns wide and greater than 3 microns deep. Passive devices and/or electrical interconnects, electrodes, or contacts may be formed overlying dielectric structure 817. In some embodiments, dielectric structure 817 is formed to a depth greater than 4 microns. Moreover, dielectric structure 817 can be formed at these dimensions or greater without significant stress being added to the die. Also, it should be understood that various different manufacturing processes can be employed to form the dielectric structure. For example, the cavities 965 may be filled forming a solid dielectric structure 817. In addition, in some embodiments, dielectric structure 819 (FIG. 8) may be formed at the same time that dielectric structure 817 is formed, and dielectric structure 819 (FIG. 8) may be formed using similar, or the same, processes used to form dielectric structure 817.

As mentioned previously, optional polysilicon deposition and thermal oxidation processes may be performed to increase the thickness of the dielectric material of dielectric structure 817. In some embodiments, prior to forming dielectric capping layer 980, polysilicon is deposited into vertical cavities 965 forming a polysilicon layer on the bottom and sidewalls. For example, 1000 Å of polysilicon may be deposited into vertical cavities 965. The polysilicon may then be oxidized to form a 2200 Å thermal oxide layer in vertical cavities 965. A second, 1000 Å of polysilicon may then be deposited and oxidized to form a second 2200 Å oxide layer in vertical cavities 965. The combination forms a 4400 Å oxide layer in vertical cavities 965. Other techniques known to one skilled in the art can also be applied that increase the amount of dielectric material. For capping the cavities 965, the upper portions of cavities 965 should not be made so large that they cannot be closed by a process step such as the low pressure TEOS deposition.

In general, the dielectric structure 817 is a non-conductive structure having a relatively low dielectric constant. From a structural perspective, the oxide formed on the bottom portions of cavities 965 and the sidewall 965a adjacent to the active area 995 should not be formed to a thickness where stress is induced into the substrate that produces warpage or dislocation defects in the wafer. Thus, the dielectric structure 817 is designed to reduce stress imparted to the wafer when the dielectric structure comprises a substantial portion of the die area.

The dielectric structure 817 may serve as a support structure that has sufficient structural strength to allow the formation of interconnect, passive components, or active devices over the dielectric structure 817. To achieve this, in some embodiments, vertical support structures such as walls 976 are formed that support a top surface layer such as layer 980. The vertical support structures and top surface layer comprise a dielectric material. In one embodiment, empty compartments underlying the top surface layer are formed between the vertical support structures to form air gaps that lower the dielectric constant of the dielectric platform. Conversely, a solid or filled dielectric structure 817 could be formed which would have a relatively higher dielectric constant if desired. In some embodiments, dielectric structure 817 may be an array of hexagonal cells having vertical walls formed of silicon dioxide when viewed looking down on the top surface. The center region of each hexagonal cell is an empty void or space. A cap or top surface layer is formed to seal each hexagonal cell. The diameter of a cell in dielectric structure 817 may be determined by the capping process. The diameter of the cell may be selected to allow the build up of deposited dielectric material near the opening near the top surface which closes off and seals the cell without filling the cell up (with the deposited dielectric material such as TEOS). Similar spacing constraints would apply to other air gap dielectric structures that utilize a capping process.

The dielectric structure 817 may also reduce parasitic capacitances of devices formed using the wafer, thereby extending the frequency response of the devices. The dielectric structure 817 separates conductive regions from one another thus a low dielectric constant is preferred to minimize the capacitance. The lowest dielectric constant for a dielectric structure may be achieved by maximizing the volume of empty space in the dielectric structure between conductive regions which form the parasitic capacitance. In particular, the number of cells in dielectric structure 817 or the area of the die that dielectric structure 817 comprises is related to reducing the parasitic capacitances.

Figure 14:
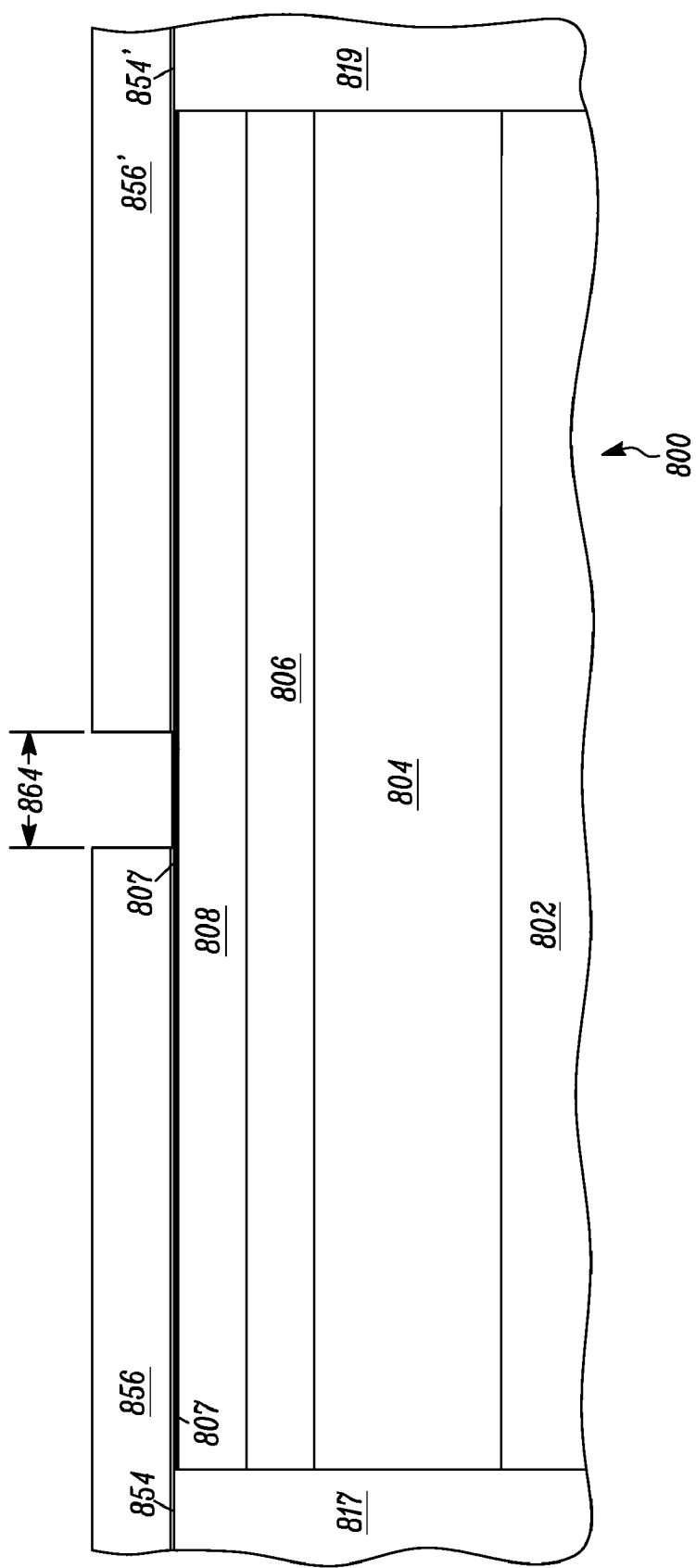
FIG. 14 is a cross section view of a portion of a structure at one stage during manufacturing in accordance with an embodiment of the present disclosure.

FIG. 14 is a cross section view of structure 800 at a subsequent stage in the manufacturing or the processing of structure 800. Structure 800 includes substrate 802 and layers 804, 806 and 808, described in the discussion of FIG. 8 above, wherein layers 804, 806, and 808 are prepared to provide a substantially planar top surface, which supports a layer 807. FIG. 14 also shows dielectric structures 817 and 819, wherein embodiments of dielectric structures 817 and 819 are described above.

In some embodiments, a layer 807 is formed as an initial or pad layer of silicon dioxide having a thickness ranging from about 600 to about 700 Angstroms via thermal oxidation of a portion of the silicon material at the top surface of layer 808. In some embodiments, the thickness of thermal oxide layer 807 is about 670 Angstroms.

Structure 800 includes layers 854 and 854', providing chemical selectivity with respect to the layer 807, formed on the layer 807 and extending over dielectric structures 817 and 819 as shown in FIG. 14. In some embodiments, the layers 854 and 854' may be formed from $Si_3N_4$ (silicon nitride) by conventional plasma techniques to have a thickness ranging from about 250 Angstroms to about 1,500 Angstroms. Layers 856 and 856' are formed on layers 854 and 854', respectively. In some embodiments, the layers 854 and 854' may be formed from $Si_3N_4$ (silicon nitride) to have a thickness of about 250 Angstroms, by conventional plasma techniques, and the layers 856 and 856' may be formed of silicon dioxide via conventional TEOS (tetra ethyl ortho silicate) deposition techniques, to have a thickness of about 11,000 Angstroms. For example, a layer of $Si_3N_4$ may be deposited using a chemical vapor deposition (CVD) process, then a layer of TEOS may be deposited on the $Si_3N_4$ layer, and then these layers may be patterned using photolithography and etching processes to form an opening 864 and layers 854, 854', 856, and 856'. The photolithography and etching may include forming a layer of a radiation-sensitive material, such as photoresist (not shown), over the deposited TEOS layer, then exposing the photoresist using UV radiation to form a mask, and then etching through the TEOS layer and the $Si_3N_4$ layer using the photoresist mask, stopping at or in oxide layer 807 to form opening 864 and layers 854, 854', 856, and 856'. Opening 864 extends down to, but not penetrating, the layer 807, and dividing the layers 854, 854', 856, 856'. In some embodiments, the opening 864 has a width of about 1.7 micrometers, for example. Photolithography processes or operations may sometimes be referred to as masking operations or acts.

The layers 807, 854, 854', 856, and 856', provide protection of the top surface of layer 808 from chemical contamination during fabrication, and also provide selective etching capabilities such that the layers 854, 854', 856, and 856' may be etched without substantially etching the layer 807 and vice versa.

Figure 15:
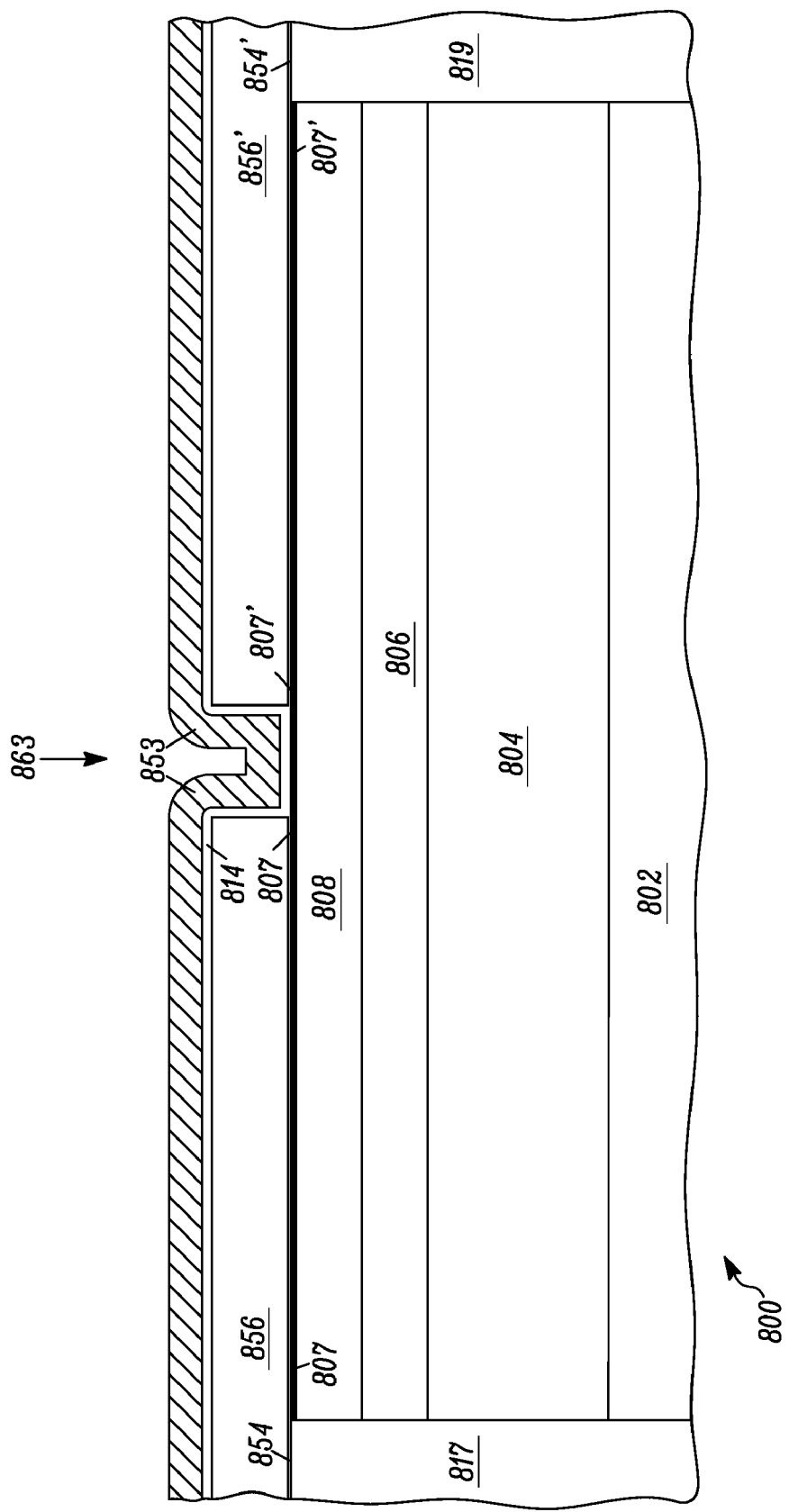
FIG. 15 is a cross section view of the structure shown in FIG. 14 at a subsequent stage of manufacturing in accordance with an embodiment of the present disclosure.

FIG. 15 is a cross section view of structure 800 at a subsequent stage in the manufacturing or the processing of structure 800. FIG. 15 shows a layer 814, which may be formed from $Si_3N_4$ atop the resultant structure shown in FIG. 14, and within the opening 864 (FIG. 14) to have a thickness of about 1500 Angstroms, and formed by conventional plasma techniques, for example. In various embodiments, the thickness of layer 814 may range from about 1000 Angstroms to about 1500 Angstroms.

A layer 853 is formed atop the layer 814. In some embodiments, the layer 853 may comprise polycrystalline silicon or polysilicon, and may have a thickness ranging from about 3,000 Angstroms to about 5,000 Angstroms. As a result, an opening 863 is formed within the opening 864 (FIG. 14), wherein opening 863 is narrower than the opening 864 and is self-aligned to the opening 864. The opening 863 may have a width that is less than that of the opening 864 by approximately twice the thickness of the layer 853.

Figure 16:
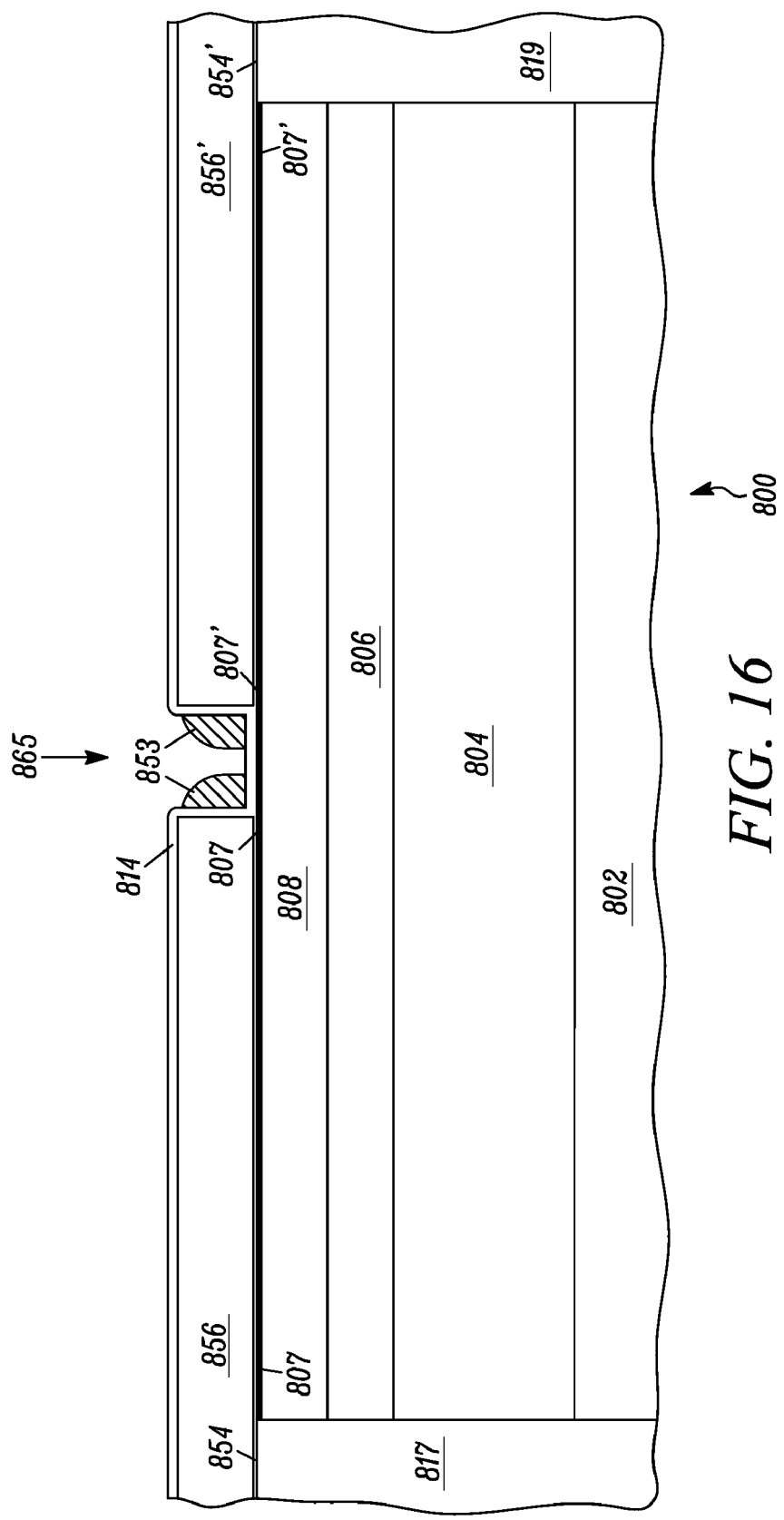
FIG. 16 is a cross section view of the structure shown in FIG. 15 at a subsequent stage of manufacturing in accordance with an embodiment of the present disclosure.

FIG. 16 is a cross section view of structure 800 at a subsequent stage in processing. FIG. 16 shows a result of conventional anisotropic etching of the layer 853, to form an opening 865 that is similar in size to the opening 863 (FIG. 15), but extending to the layer 814, and which is masked within the opening by residual portions of the layer 853. These residual portions may be referred to as sidewall spacers 853.

Figure 17:
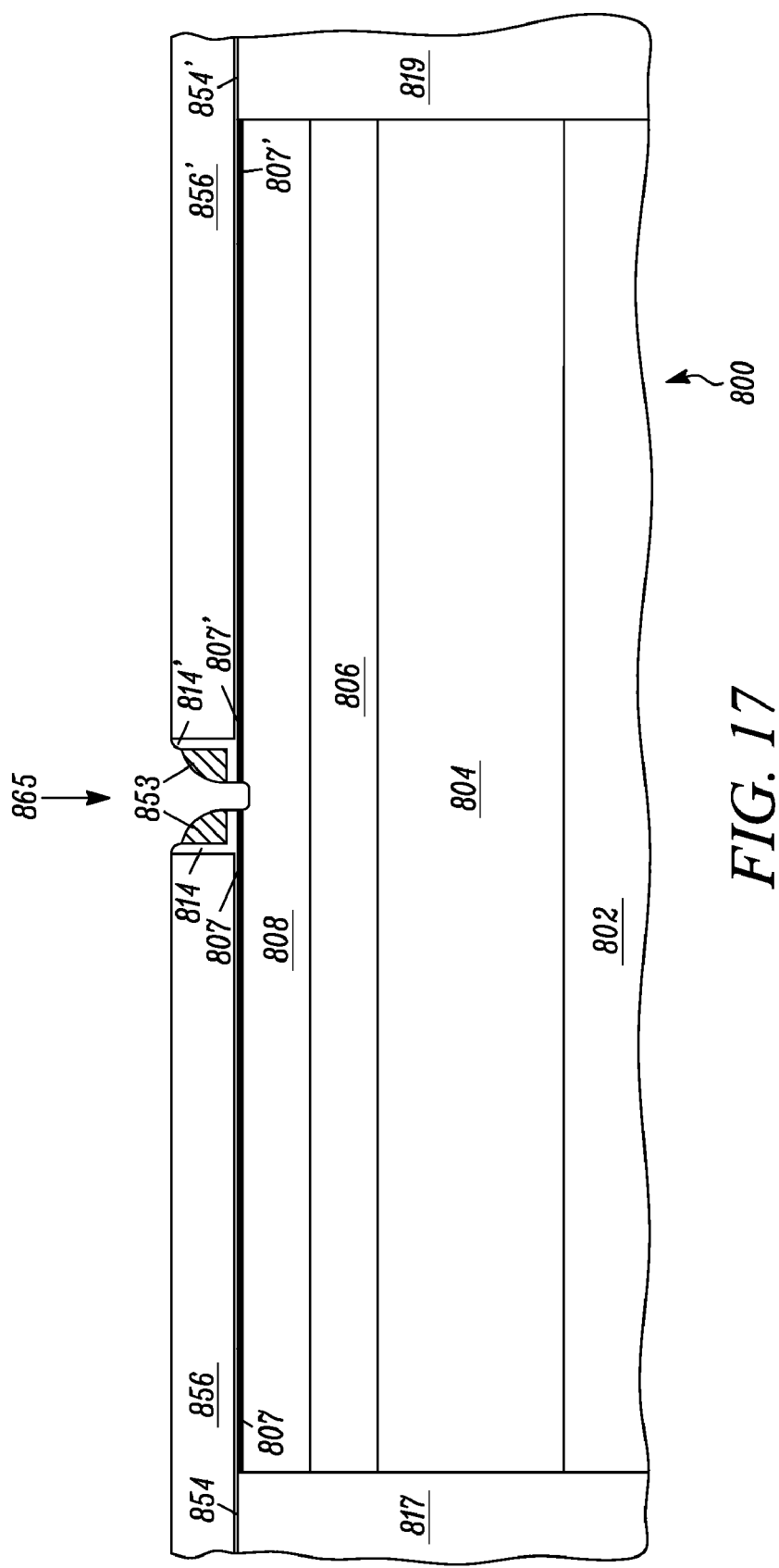
FIG. 17 is a cross section view of the structure shown in FIG. 16 at a subsequent stage of manufacturing in accordance with an embodiment of the present disclosure.

FIG. 17 is a cross section view of structure 800 at a subsequent stage in processing. FIG. 17 shows that another anisotropic etch operation is performed to extend opening 865 through the layer 814 (FIG. 16) and 807 (FIG. 16) and partially into the underlying layer 808. In one embodiment, the silicon nitride layer 814 (FIG. 16) is etched via conventional anisotropic plasma etching, such that exposed portions of the layer 814 atop the layers 856 and 856' have been stripped, to provide residual components or portions 814 and 814' shown in FIG. 17. The portion of the layer 807 (FIG. 16) exposed within the opening 865 is then etched to provide residual portions 807 and 807' shown in FIG. 17, and a portion of the material of the layer 808 exposed via etching of the layer 807 is also etched. Conventional etching techniques for silicon nitride and silicon dioxide provide a chemical selectivity of about 5:1 with respect to etching of polycrystalline silicon, and, as a result, residual portions 853 of the polycrystalline silicon sidewall spacers 853 of FIG. 16 are also etched to reduce the height of sidewall spacers 853.

Figure 18:
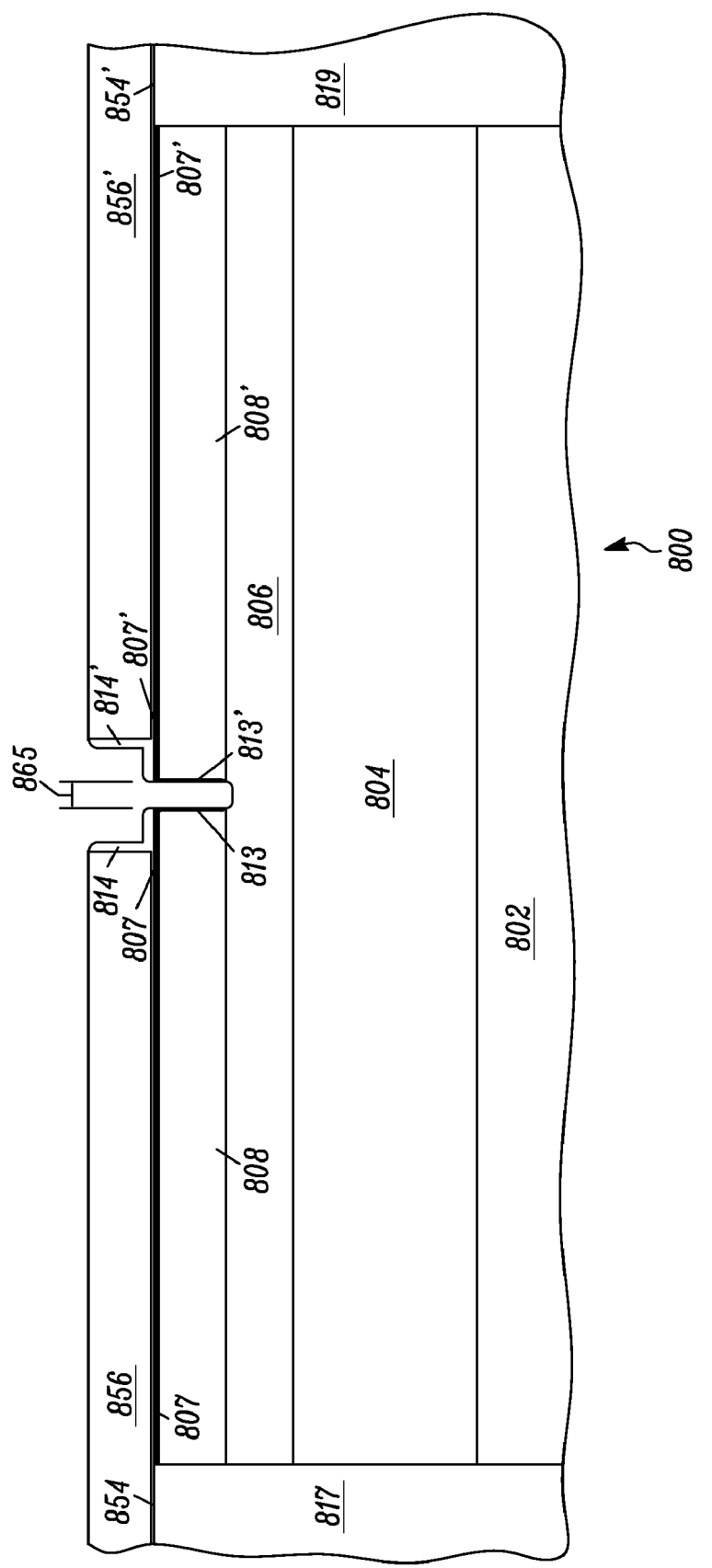
FIG. 18 is a cross section view of the structure shown in FIG. 17 at a subsequent stage of manufacturing in accordance with an embodiment of the present disclosure.

FIG. 18 is a cross section view of structure 800 at a subsequent stage in processing. FIG. 18 shows that a conventional anisotropic etch of layer 808 and some of the layer 806 has been performed through opening or trench 865, which has a width and nearly vertical sidewalls to extend completely through the layer 808 and stopping at or in buried n-type layer 806. During this etch, the residual portions or sidewall spacers 853 of FIG. 17 that had been formed during the acts described above with reference to FIGS. 15-17 are completely eroded. As a result, a narrow and relatively vertically-walled slot 865 is realized, which is self-aligned with respect to structures formed with reference to the opening 864 of FIG. 14.

Following the initial etch described with reference to FIG. 18, in some embodiments, an optional oxidation step and a subsequent anisotropic etch can provide silicon dioxide sidewalls 813 and 813' within the trench 865. The subsequent anisotropic etch will remove oxide at the bottom of trench 865 to expose surface 806 as shown in FIG. 18 so that the bottom of trench 865 is void of dielectric. Silicon dioxide sidewalls 813 and 813' function as barriers to migration of materials and/or defects such as dislocations from materials within the trench 865 to regions adjacent the trench 865. Other conventional processes also may be used to provide sidewalls 813 and 813' that provide migration barriers. In some embodiments, the dielectric sidewalls 813 and 813' range from about 100 Angstroms to several hundred Angstroms in thickness. Conventional anisotropic etching of silicon dioxide provides high chemical selectivity such that underlying or adjacent silicon nitride portions are not substantially etched and thus does not require particularly tight process control.

The optional barrier formation act to form silicon dioxide sidewalls 813 and 813', in turn, results in containment of dopant introduced later in processing, thus avoiding incurring increased dislocation density and the like by inhibiting propagation of such defects from material that is later deposited into the trench 865. In some embodiments, the trench 865 has a width on the order of about 4,000 Angstroms. The processes described result in the trench 865 being self-aligned respective to other features formed as a portion of the transient suppression device 105.

Figure 19:
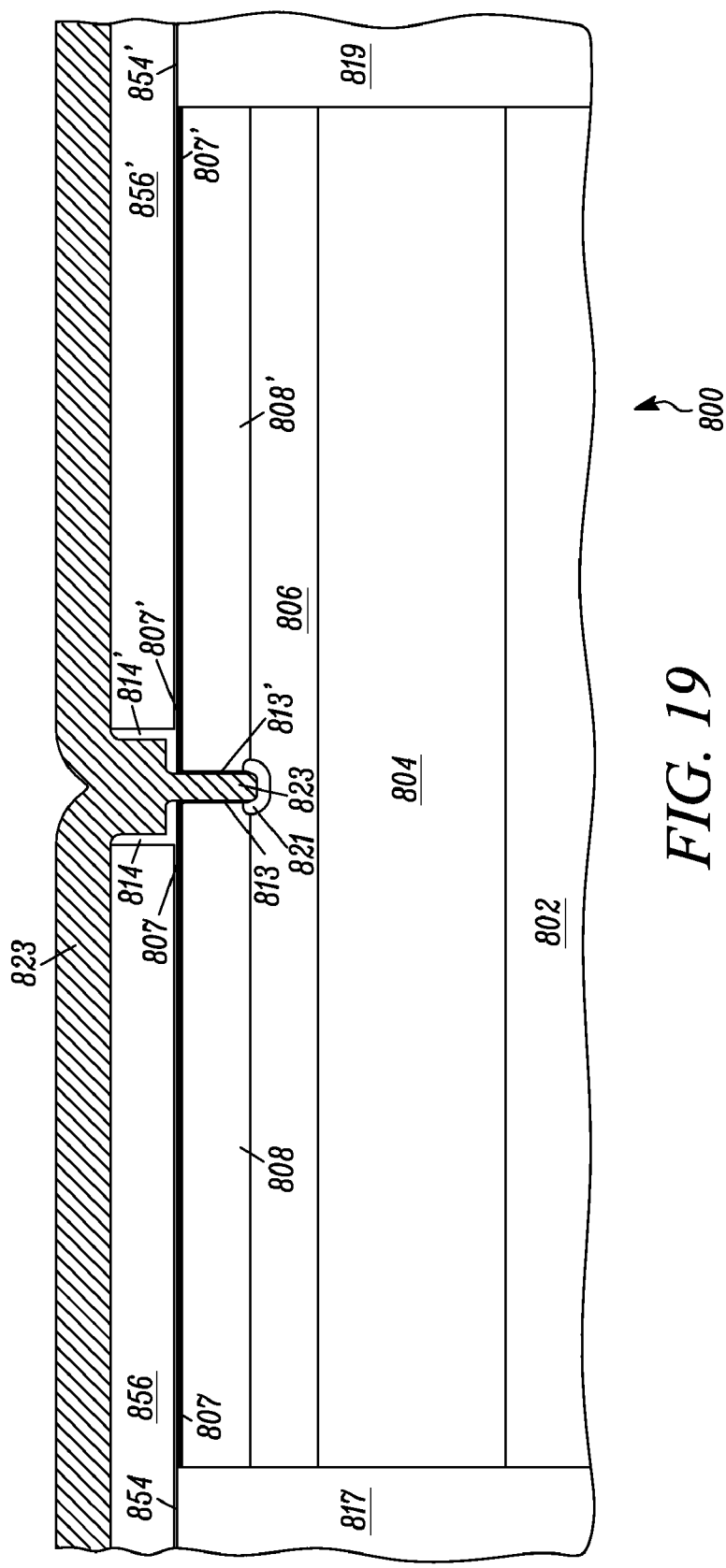
FIG. 19 is a cross section view of the structure shown in FIG. 18 at a subsequent stage of manufacturing in accordance with an embodiment of the present disclosure.

FIG. 19 is a cross section view of structure 800 at a subsequent stage in processing. FIG. 19 shows a doped region 821 beneath a tip of the bottom of the trench 865, and a layer 823 that has been deposited to a thickness of about 8,000 Angstroms. In some embodiments, the layer 823 comprises polycrystalline silicon, and may be doped or undoped as deposited. Dopant may be introduced, for example by ion implantation of arsenic or antimony at a dose of about $3 \times 10^{15}$ ions/cm$^3$, to dope the material forming the layer 823 n-type via subsequent heat treatment or anneal process, which also causes a portion of dopant from the layer 823 to dope the region 821 as well thereby increasing the n-type doping level in the proximity of the contact region of polysilicon region 823 to layer 806. As a result, the material forming the layer 823 is conductive and is electrically coupled to the layer 806 via an ohmic-type interconnection.

Arsenic diffuses less rapidly than many other types of n-type dopants in monocrystalline silicon such as, for example, phosphorus, and thus presents a relatively robust and well-defined location for the implanted species through subsequent thermal cycling associated with subsequent processing acts, and also tends to segregate at grain boundaries in polycrystalline silicon during subsequent heat treatments. In either case, when there are no sidewalls 813 and 813' forming a barrier within the trench 865, a doped region is formed in the semiconductive material, that is, layers 808 and 808', that surround portions of the layer 823. In other words, layers 813 and 813' serve as a way of preventing the dopant of layer 823 from doping regions of 808 and 808' adjacent to layer 823.

Figure 20:
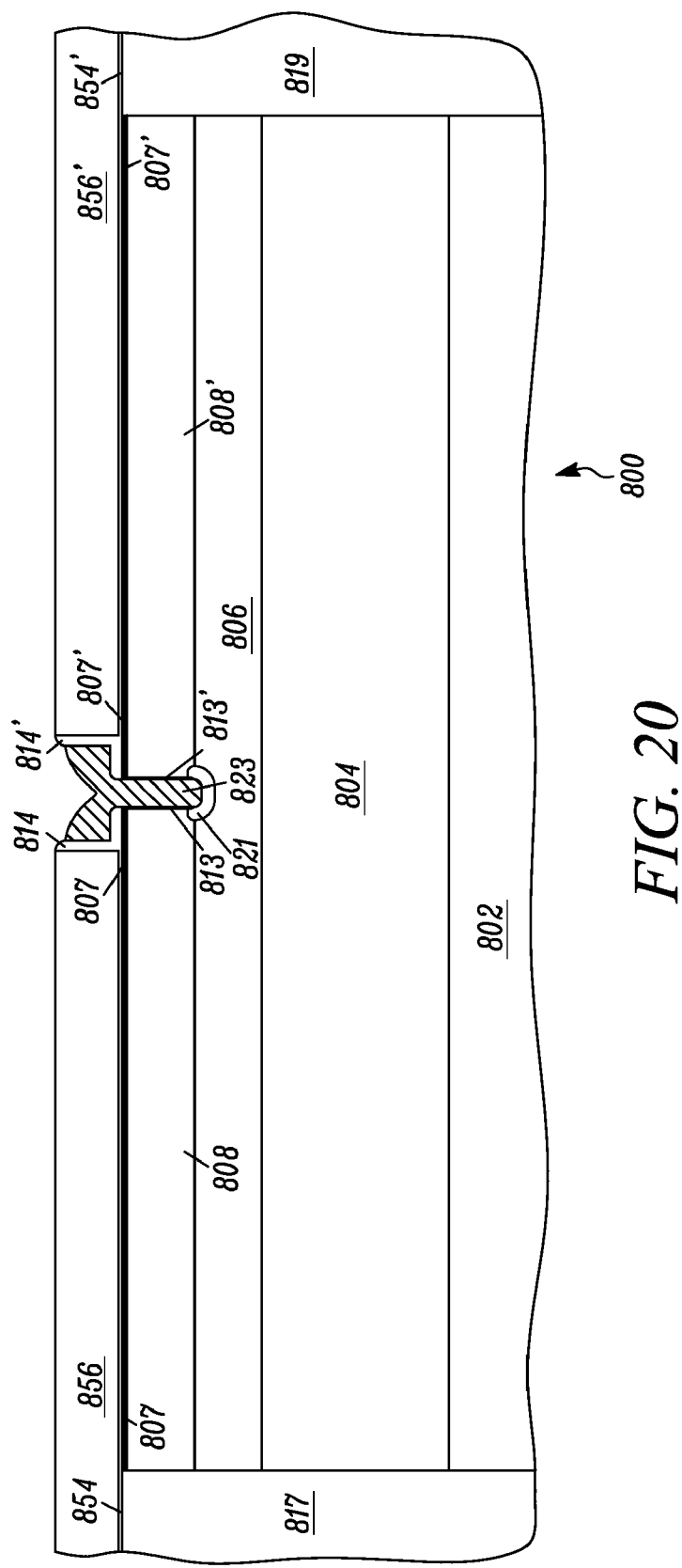
FIG. 20 is a cross section view of the structure shown in FIG. 19 at a subsequent stage of manufacturing in accordance with an embodiment of the present disclosure.

FIG. 20 is a cross section view of structure 800 at a subsequent stage in processing. FIG. 20 shows a result of an anisotropic etch of the layer 823 to provide a conductive plug 823 of conductive material such as, for example, doped polycrystalline silicon. As a result of the etching, the portions of layer 823 that are over the upper surfaces of layers 856 and 856', and over the upper portions of 814 and 814', are removed.

Figure 21:
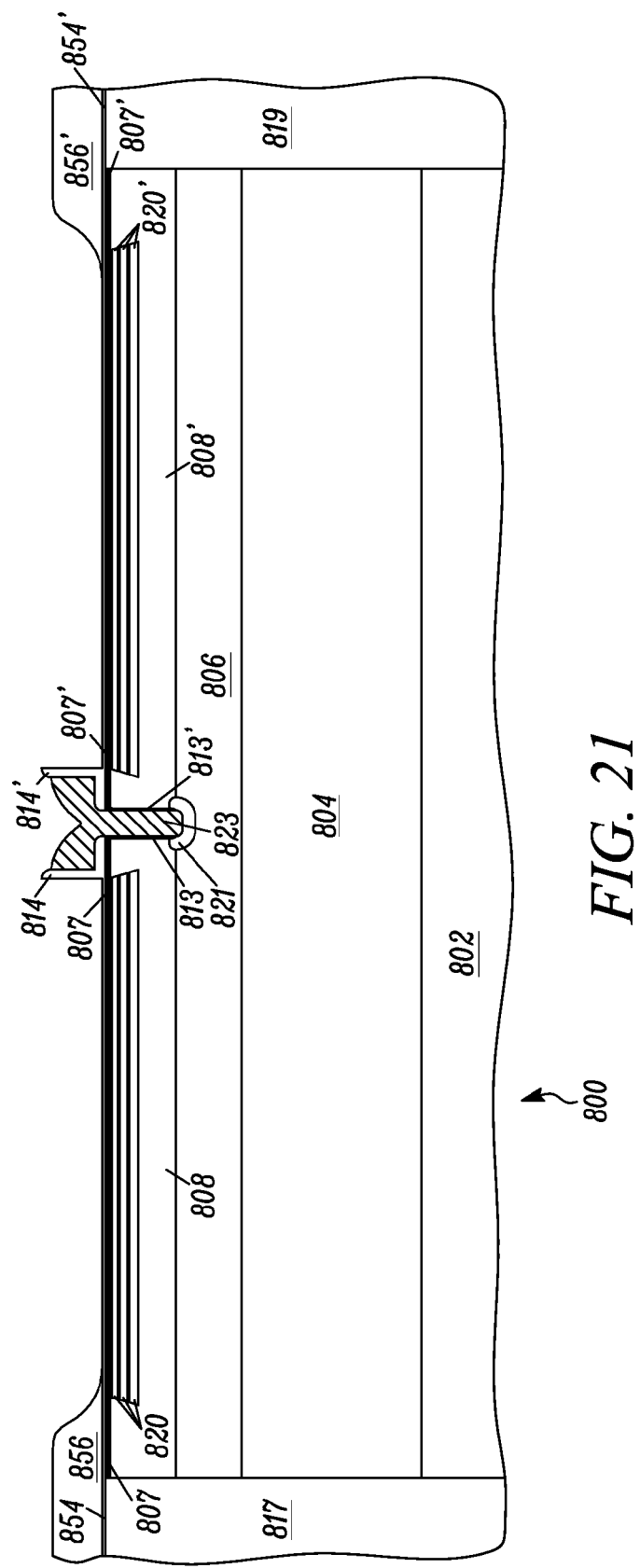
FIG. 21 is a cross section view of the structure shown in FIG. 20 at a subsequent stage of manufacturing in accordance with an embodiment of the present disclosure.

FIG. 21 is a cross section view of structure 800 at a subsequent stage in processing. FIG. 21 shows a result of a masking operation followed by an isotropic wet oxide etch of the materials or layers 856 and 856'. In some embodiments, the isotropic etch is a slight over-etching of the layers 856 and 856', that is, is performed for a period of time sufficient to remove exposed portions of the layers 856 and 856', and then includes enough additional time to ensure complete clearing of the portions of oxide layers 856 and 856' from exposed areas, but stopping at the nitride layers 854 and 854' because of chemical selectivity.

A chain implant has been performed to provide three p-type doping regions that will become region 820 after subsequent thermal processing. The upper region may be referred to as a surface implant, the middle region may be referred to as a central implant, and the lower region may be referred to as a lower implant.

For the surface, central, and lower implants corresponding to the resultant region 820, the dose employed for the surface implant is used to establish the threshold voltage $V_{TH}$ of the MOSFET 680' of FIG. 6. In particular, the dose employed for the upper region or surface implant is linearly related to the threshold voltage $V_{TH}$ of the MOSFET 680' of FIG. 6. As a result, adjustment of the dose of the implant used to provide the surface implant also provides a measure of control for the voltage at which the transient suppression device 105 displays nonlinear or voltage clamping behavior, without requiring modification to photomasks used to manufacture the transient suppression devices 105. The doses employed for the central implant and the lower implant corresponding to resultant p-type region 820 affect the current gain $\beta_{NPN}$ of the NPN transistor 640' and also affect the resistance of the resistor 668.

Similarly, for the surface, central, and lower implants corresponding to the resultant region 820', the dose employed for the surface implant is used to establish the threshold voltage $V_{TH}$ of the MOSFET 680 of FIG. 6. In particular, the dose employed for the upper region or surface implant is linearly related to the threshold voltage $V_{TH}$ of the MOSFET 680 of FIG. 6. The doses employed for the central implant and the lower implant corresponding to resultant p-type region 820' affect the current gain $\beta_{NPN}$ of the NPN transistor 640 and also affect the resistance of the resistor 668'.

A chain implant may be achieved by programming an implanter to do a series or chain of implants at different energies and doses. The higher the energy, the deeper the penetration for the implant. In some embodiments, the surface implants may be formed by a boron implant to a dose of about $1 \times 10^{13}$ ions/cm$^2$, at an energy of about 60 keV the central implants may be formed by a boron implant to a dose of about $2 \times 10^{13}$ ions/cm$^2$ at an energy of about 90 keV, and the lower implants may be formed by a boron implant to a dose of about $2 \times 10^{13}$ ions/cm$^2$, at an energy ranging from about 110 keV to about 120 keV.

The surface, central, and lower implants may be subsequently activated to form p-type regions 820 and 820' by some subsequent thermal processing such as, for example, a rapid thermal anneal (RTA) process. These implants will establish a doping profile that is reflected by their energies and dopant concentrations, and accordingly, this is a way of profiling and establishing characteristics that will become doped regions 820 and 820' out of three implants.

Figure 22:
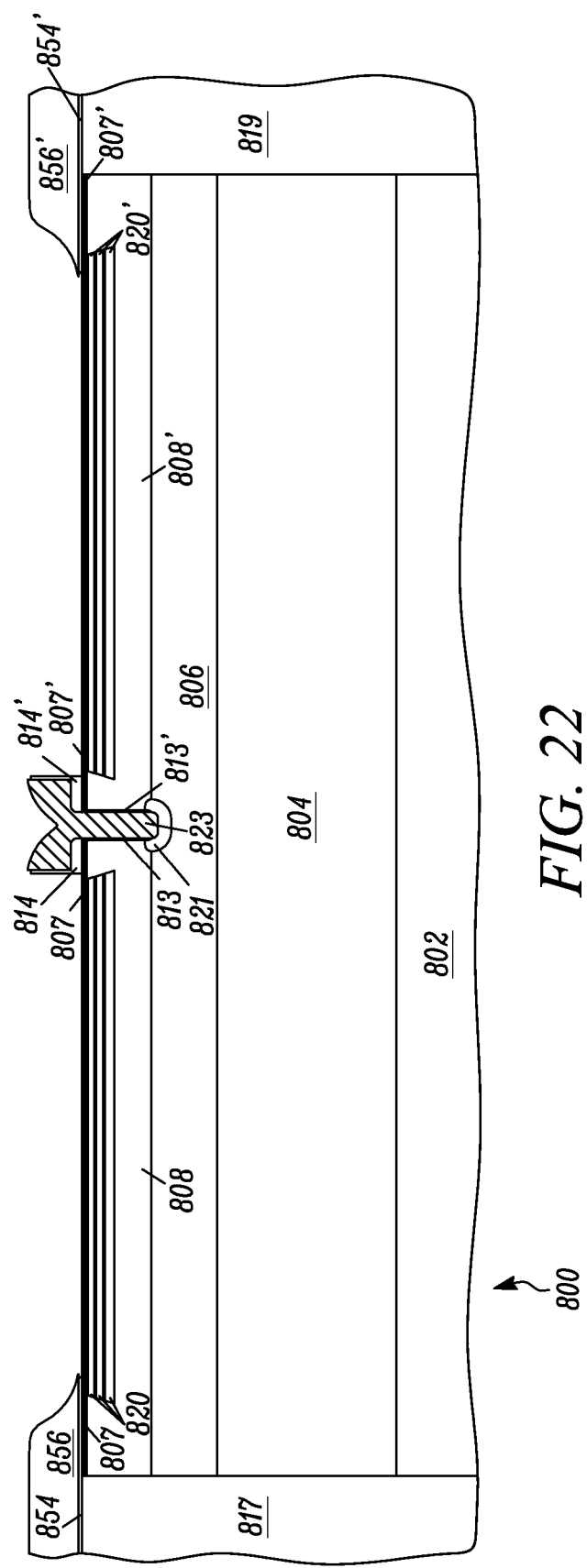
FIG. 22 is a cross section view of the structure shown in FIG. 21 at a subsequent stage of manufacturing in accordance with an embodiment of the present disclosure.

FIG. 22 is a cross section view of structure 800 at a subsequent stage in processing. FIG. 22 shows a result of an isotropic wet nitride etch of the materials 854 and 854' and 814 and 814'. In some embodiments, the etching is done using hot phosphoric acid and is timed to remove an amount of silicon nitride ranging from about 750 Angstroms to about 1250 Angstroms, and results in thinning of sidewalls formed of material 814 and 814' by that amount.

Figure 23:
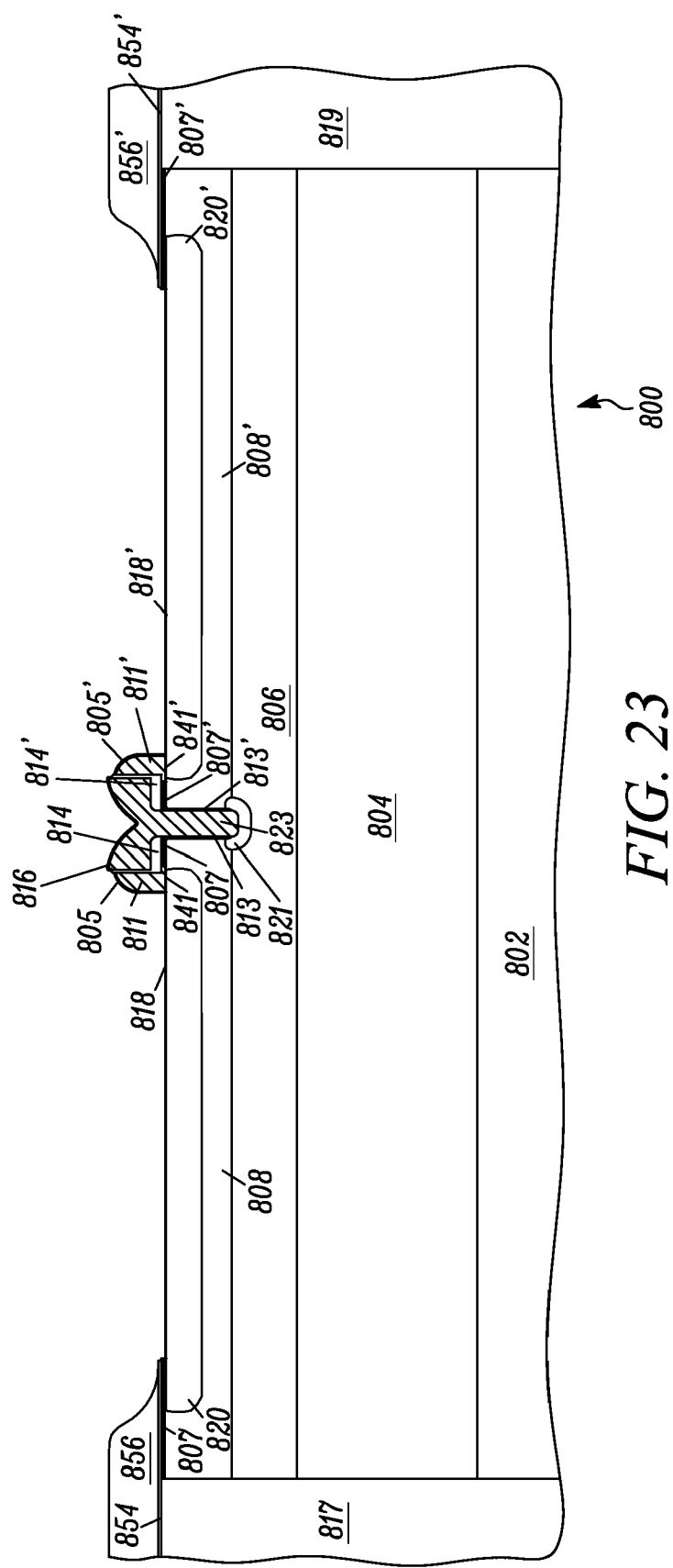
FIG. 23 is a cross section view of the structure shown in FIG. 22 at a subsequent stage of manufacturing in accordance with an embodiment of the present disclosure.

FIG. 23 is a cross section view of structure 800 at a subsequent stage in processing. A thermal treatment act is performed to anneal the structure 800 and activate the species implanted during the chain implant as described above with reference to FIG. 21, so that the three implants of the chain implant essentially merge together to form doped regions 820 and 820'. In addition, some of the processes described below with reference to FIG. 23, are thermal processes such as, for example, the thermal oxidation processes to form layers 805, 805', 816, 818, 818', 841, and 841', and these thermal processes will also activate the ion-implanted dopants implanted during the chain implant as described above with reference to FIG. 21 to form doped regions 820 and 820'.

An isotropic wet oxide etch is used to etch the material 807 and 807', and this etch will also etch the materials 856 and 856'. In some embodiments, the etched materials 807 and 807' comprise silicon dioxide and the etching is performed using hydrofluoric acid that is timed to remove an amount of oxide ranging from about 750 Angstroms to about 1250 Angstroms.

Layers of material 841 and 841' are formed. In some embodiments, the materials 841 and 841' comprise silicon dioxide formed via thermal oxidation of the silicon of the layers 808 and 808'. During this thermal oxidation act, the upper exposed surface of the plug material 823 is also oxidized to form a layer of silicon dioxide 816 at the upper exposed surface of the plug material 823. In some embodiments, the materials 841 and 841' are grown to a thickness ranging from about 100 to about 400 Angstroms, and may be grown to a thickness of about 200 Angstroms. The materials 841 and 841' ultimately form the gate dielectric material or gate oxide 841 and 841' for the MOSFETs 680' and 680 of FIG. 6, respectively. As a result, the thicknesses of the materials 841 and 841' are linearly related to the threshold voltages $V_{TH}$ of MOSFETs 680' and 680, respectively. Accordingly, control of the thicknesses of the materials 841 and 841' provides another mode for adjustment of the threshold voltages $V_{TH}$ of MOSFETs 680' and 680 which does not require alterations of masking tooling. A subsequent oxidization act ("gate re-oxide") may be performed to increase the thickness of the materials 841 and 841'.

A blanket layer of electrically conductive material is formed after the dielectric materials 841 and 841' have been formed. In some embodiments, a layer of polycrystalline silicon is deposited to a thickness of about 3,000 Angstroms and is then anisotropically etched, leaving polysilicon sidewalls 811 and 811'. In some embodiments, the layer of polysilicon deposited may range in thickness from about 2,000 Angstroms to about 5,000 Angstroms and the anisotropic etching is carried out as an "over-etch" act, that is, the time duration of the etch exceeds the time needed to substantially clear polysilicon from areas in which it forms horizontal sheets, by a factor of 1.1 or 1.2 (ten to twenty percent over etch). In some embodiments, the material forming sidewalls 811 and 811' is n-type polycrystalline silicon doped with phosphorous as deposited. As discussed above, sidewalls gate portion 811 functions as the gate 684' of FET 680'. Accordingly, in some embodiments, the gate 684' of the FET 680' comprises an electrically conductive material such as polysilicon and the gate 684' corresponding to sidewall gate 811 illustrated in FIG. 8 is formed so that the gate length of the FET 680' is approximately equal to a deposition thickness of the layer of electrically conductive material 811. Accordingly, in the embodiment discussed with reference to FIG. 23, the gate length of the MOSFETs 680 and 680' are determined non-photolithographically. The deposition of material such as polysilicon can be controlled with great accuracy in a wafer fabrication facility (wafer fab). The gate length of MOSFET 680' is determined by the thickness of deposited polysilicon layer 811. What this means is that a transistor can be produced with a state of the art gate length (for example, 0.2-0.3 microns or lower) in a wafer fab having photolithographic capabilities greater than 0.35 microns. The short channel length of the transistor may result in extended frequency response. The device 105 may be built at relatively lower cost since production cost is directly related to the photolithographic capability of the wafer fab. Moreover, tighter control over gate lengths may be achieved with lower variance because of the control wafer processing facilities have over material deposition thicknesses (such as polysilicon). Although the gate length of MOSFETs 680 and 680' are discussed as being determine non-photolithographically, the methods and apparatuses described herein are not limited in this regard. For example, in alternate embodiments, the gate lengths of MOSFETs 680 and 680' may be determined by the minimum feature size of the available photolithography equipment.

A subsequent thermal oxidation process is then performed that continues to form a layer of silicon dioxide 816 at the upper exposed surface of the plug material 823, and also forms layers of silicon dioxide 805 and 805' over the exposed surfaces of the polysilicon sidewalls 811 and 811', respectively. Further, this subsequent thermal oxidation process also thickens the silicon dioxide on p-type regions 820 and 820' to form silicon dioxide layers 818 and 818' that are thicker than layers 841 and 841'.

Figure 24:
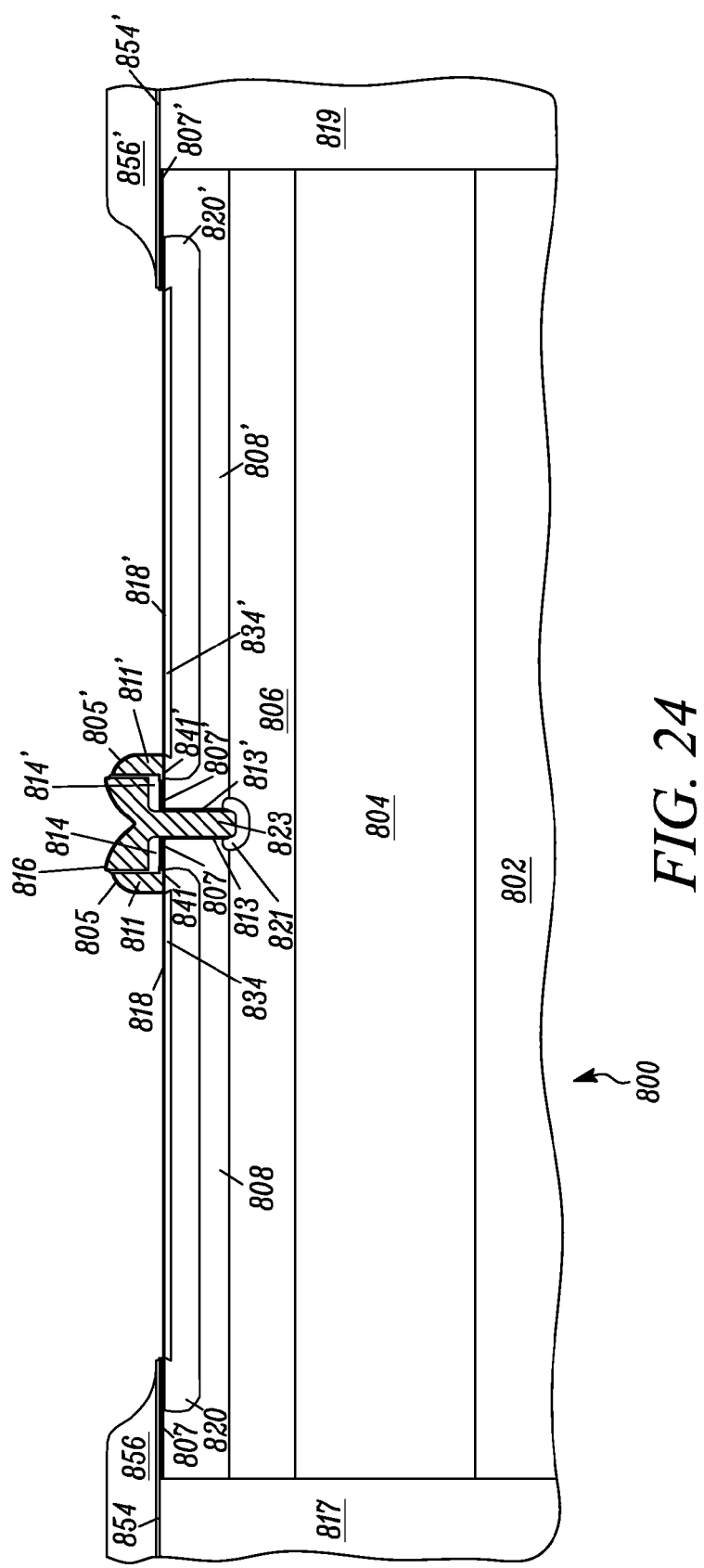
FIG. 24 is a cross section view of the structure shown in FIG. 23 at a subsequent stage of manufacturing in accordance with an embodiment of the present disclosure.

FIG. 24 is a cross section view of structure 800 at a subsequent stage in processing. FIG. 24 shows results of an ion implantation to provide dopant that forms n-type doped regions 834 and 834'. In some embodiments, the implantation includes implanting phosphorous or arsenic at a dose of about $2 \times 10^{14}$ ions/cm$^2$, at an energy of about 60 keV. Portions of the doped regions 834 and 834' respectively correspond to sources 682' and 682 of MOSFETs 680' and 680 of FIG. 6, to the emitters 642' and 642 of the NPN transistors 640' and 640, and to the resistors 650' and 650.

Figure 25:
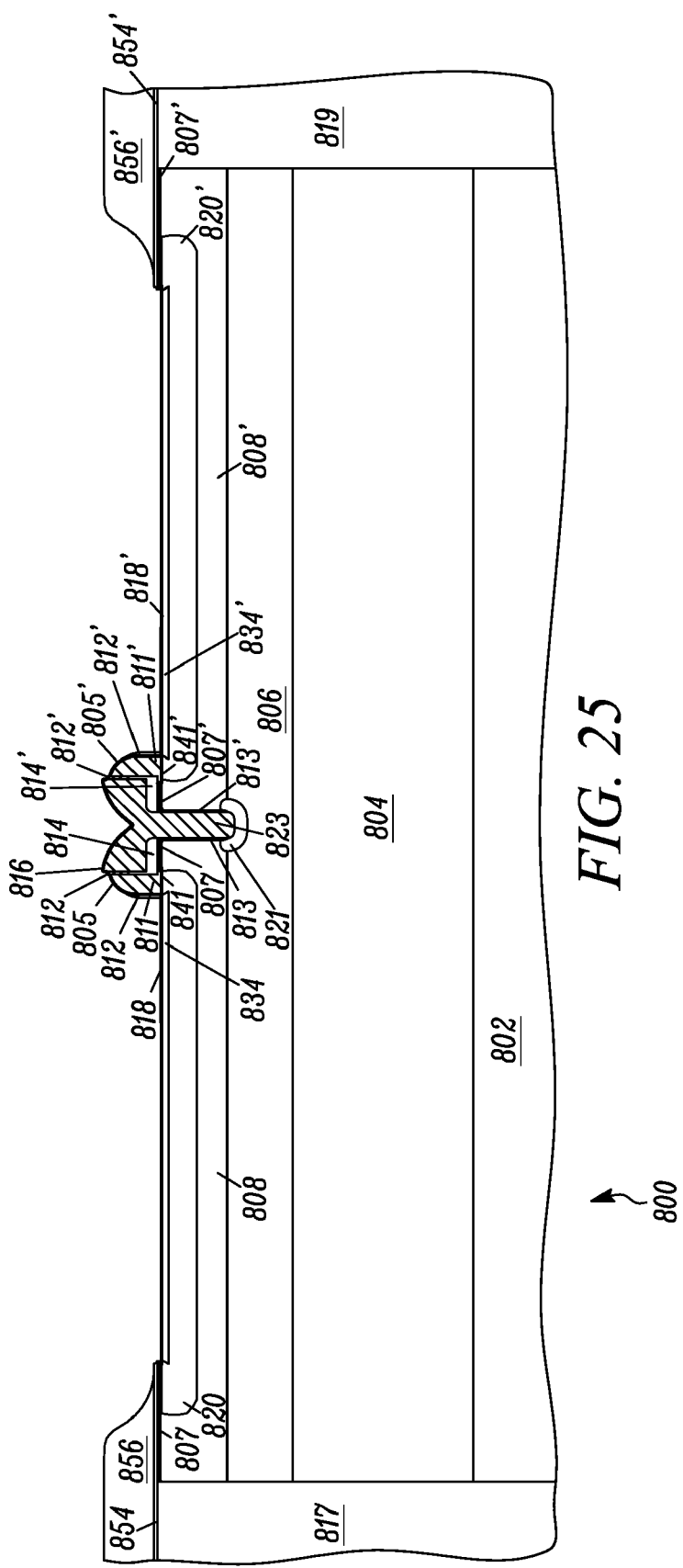
FIG. 25 is a cross section view of the structure shown in FIG. 24 at a subsequent stage of manufacturing in accordance with an embodiment of the present disclosure.

FIG. 25 is a cross section view of structure 800 at a subsequent stage in processing. In some embodiments, an etch is performed using hot phosphoric acid, to remove portions of material 814 and 814', leaving gaps (not shown in FIG. 25) between the materials 811 and 823 and between the materials 811' and 823. This etch may also etch a relatively small amount of layers 854 and 854'. In some embodiments, this etch may be timed to remove an amount of nitride ranging from about 2,000 Angstroms to about 3,000 Angstroms.

A layer of electrically conductive material such as, for example, polycrystalline silicon, is deposited and then is anisotropically etched, resulting in sidewall structures 812 and 812' on portions of dielectric layers 805 and 805' and also forming conductive portions 812 and 812' in the gaps between the materials 811 and 823, and between the materials 811' and 823, to form a "bridge" or coupling structure to electrically couple electrically conductive materials 811 and 823 and 811' and 823, wherein conductive materials 811, 811', 812, 812', and 823 form a homogeneous or contiguous electrically conductive structure or material such that a portion 823 extends to doped region 821 and a portion 811 is over dielectric layer 841. The sidewall structures 812 and 812' on the portions of layers 805 and 805' are floating structures that are electrically isolated from other electrically conductive materials of structure 800. In some embodiments, the materials 812 and 812' comprise phosphorous doped n-type polycrystalline silicon having a thickness of about 500 Angstroms and the anisotropic etch of the polycrystalline silicon may be timed to remove an amount of polysilicon ranging from about 750 Angstroms to about 1,250 Angstroms. In other embodiments, the deposited polycrystalline silicon may be undoped polycrystalline silicon, and subsequent thermal steps may dope the undoped polycrystalline silicon from the dopant that is present in materials 811, 811', and 823.

Figure 26:
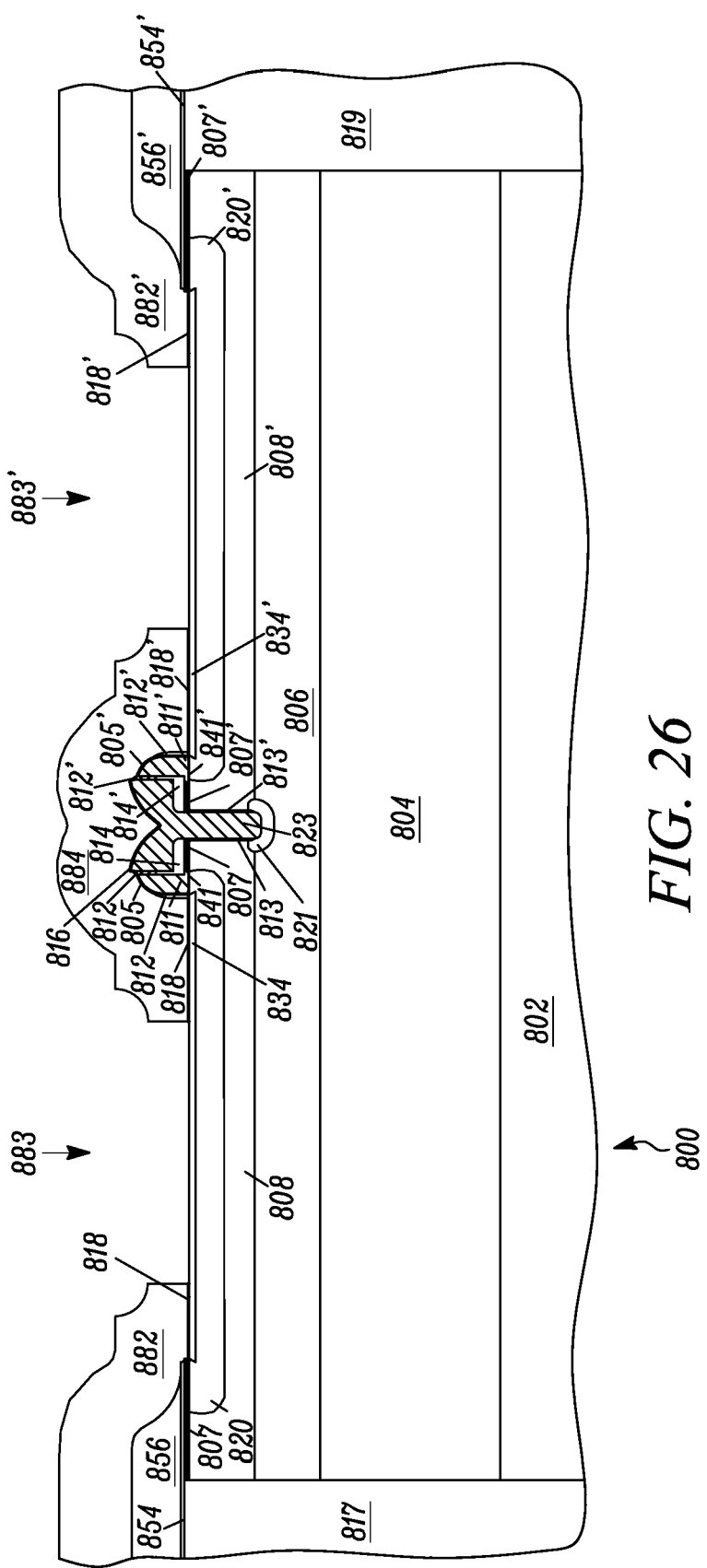
FIG. 26 is a cross section view of the structure shown in FIG. 25 at a subsequent stage of manufacturing in accordance with an embodiment of the present disclosure.

FIG. 26 is a cross section view of structure 800 at a subsequent stage in processing. FIG. 26 shows results of formation of a layer of dielectric material that is then pattered using photolithography and etching processes to form structures 882, 882', and 884 and to form openings 883 and 883'. In one embodiment, the material forming structures 882, 882', and 884 is silicon dioxide deposited to a thickness of about 11,000 Angstroms via a conventional TEOS process. In some embodiments, edges of the materials 882, 882', and 884 are "feathered" to enhance step coverage for later-deposited conductive materials, using conventional isotropic and anisotropic etching techniques. The processes to form structures 882, 882', and 884 may be relatively low temperature processes so that these processes have relatively little effect on regions 834 and 834' at this stage, so that the processes used to form structures 882, 882', and 884 do not cause diffusion of regions 834 and 834'.

Figure 27:
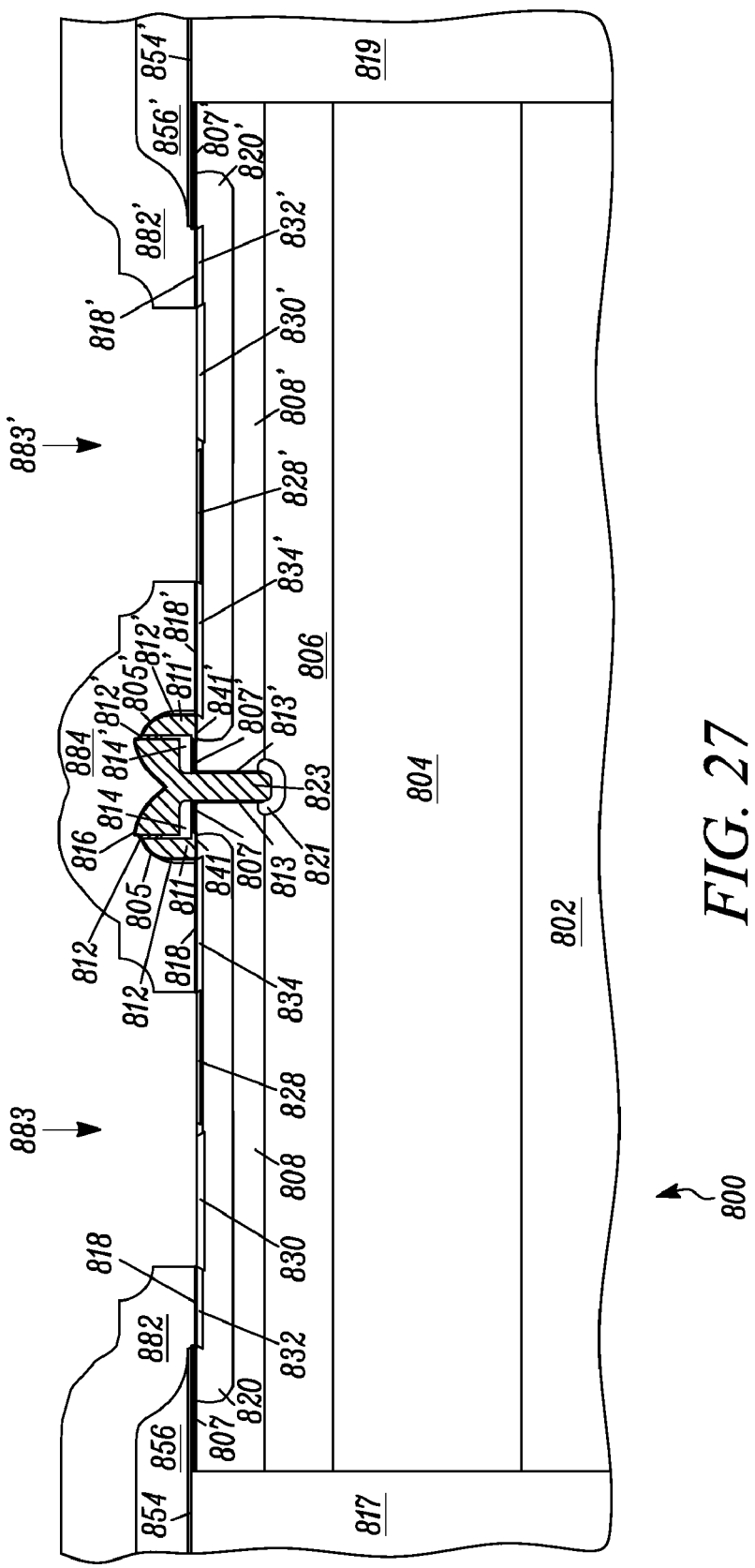
FIG. 27 is a cross section view of the structure shown in FIG. 26 at a subsequent stage of manufacturing in accordance with an embodiment of the present disclosure.

FIG. 27 is a cross section view of structure 800 at a subsequent stage in processing. FIG. 27 shows results of two sequential masking acts. The initial masking act defines areas that are then ion implanted to provide doped regions 830 and 830'. The subsequent masking act defines areas that are then ion implanted to provide doped regions 828 and 828'. More specifically, the initial masking act covers the central region of structure 800, proximate to structure 884, and exposes the portions of openings 883 and 883' outside of the central region. Then, a boron implant is performed at a dose ranging from about $3 \times 10^{14}$ ions/cm$^2$ to about $3 \times 10^{15}$ ions/cm$^2$, and at an energy of about 50 keV to form regions 830 and 830'. In some embodiments, the does of the boron implant is at about $1 \times 10^{15}$ ions/cm$^2$. After the boron implant, the subsequent masking act is performed to cover the outer region of structure 800 and to expose the portions of openings 883 and 883' proximate to structure 884, that is, to cover the regions where regions 830 and 830' are formed. Then, an arsenic implant is performed at a dose ranging from about $2 \times 10^{15}$ ions/cm$^2$ to about $1 \times 10^{16}$ ions/cm$^2$, and at an energy of about 75 keV to form regions 828 and 828'. In some embodiments, the does of the arsenic implant is at about $3 \times 10^{15}$ ions/cm$^2$.

Regions 832 and 832' result from the formation of regions 828, 828', 830, and 830'. Regions 832 and 832' are floating regions and are essentially inactive during the operation of device 105. As may be appreciated, doped regions 832, 832', 834 and 834' are formed from the same ion implant step discussed with reference to FIG. 24. As discussed above, in some embodiments, n-type doped regions 832, 832', 834 and 834' may be more lightly doped than n-type doped regions 828 and 828'.

Figure 28:
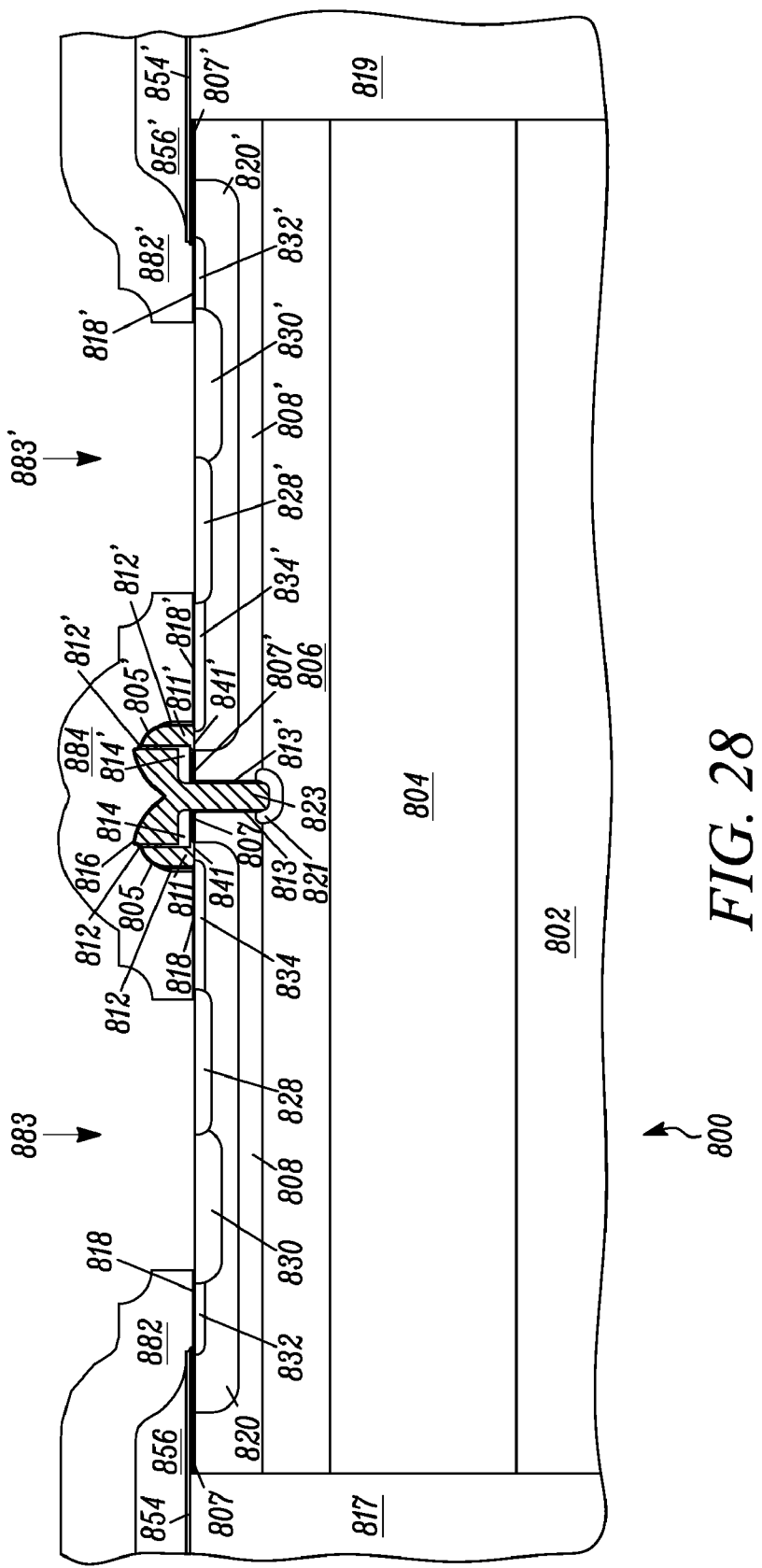
FIG. 28 is a cross section view of the structure shown in FIG. 27 at a subsequent stage of manufacturing in accordance with an embodiment of the present disclosure.

FIG. 28 is a cross section view of structure 800 at a subsequent stage in processing. FIG. 28 shows results of heat treatment of structure 800, for example via conventional rapid thermal annealing (RTA), that diffuses and activates the species implanted as described with respect to FIG. 27, providing doped regions 828, 828', 830, and 830'. Referring back to FIG. 8, after the RTA operation is performed as described with reference to FIG. 25, conductive layers 810 and 815 may be formed by depositing a layer of electrically conductive material such as, for example, a metal, and then patterning this layer of electrically conductive material using photolithography and etching processes to form contact regions 810 and 815.

Figure 29:
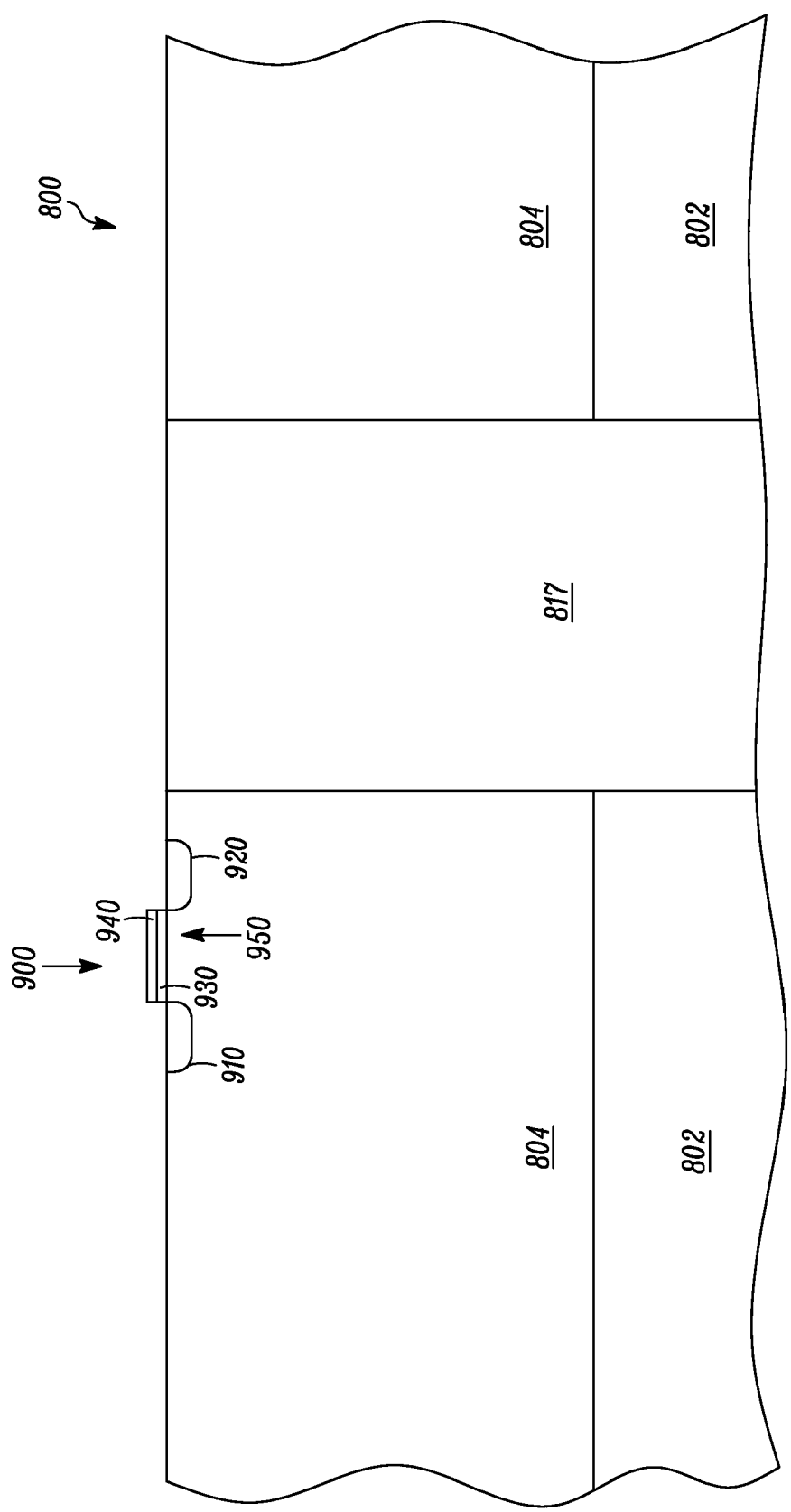
FIG. 29 is a cross section view of a structure in accordance with an embodiment of the present disclosure.

As mentioned above, transient suppression device 105 may be integrated with metal oxide semiconductor (MOS) devices on the same semiconductor substrate. As an example, FIG. 29 is a cross section view of structure 800 integrated with a n-channel MOSFET 900. Accordingly, together, structure 800 and MOSFET 900 form an integrated circuit (IC), wherein the integrated circuit comprises electrical transient suppression device 105 and MOSFET 900. For purposes of clarity, all the elements of structure 800 and MOSFET 900 are not shown. The n-channel MOSFET 900 includes a n-type source region 910 in a portion of p-type layer 804, a n-type drain region 920 in a portion of p-type layer 804, a gate oxide 930 over a portion of layer 804, at least a portion of a gate 940 over gate oxide 930, and a channel region 950 formed in a portion of layer 804 under gate oxide 930, and between regions 910 and 920. In this example, n-channel MOSFET 900 is isolated from the active area of device 105 by dielectric structure 817.

FIGS. 30 to 34 illustrate another embodiment for forming the gates 684 and 684' of FETs 680 and 680', respectively. The example method for forming gates 684 and 684' shown in FIGS. 30 to 34 is an alternative method compared to the method of forming gates 684 and 684' shown in FIGS. 23 to 25.

Figure 30:
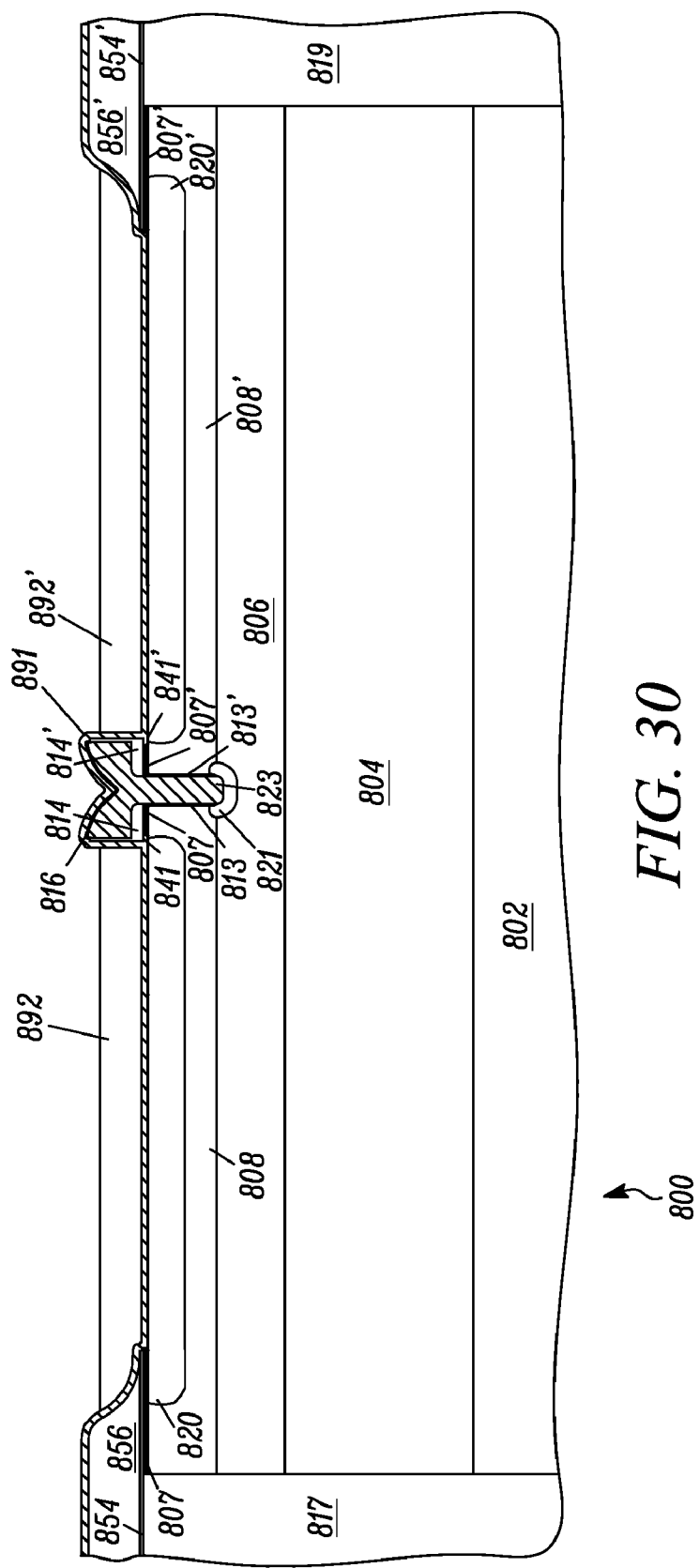
FIG. 30 is a cross section view of a portion of a structure at one stage during manufacturing in accordance with an embodiment of the present disclosure.

FIG. 30 is a cross section view of the structure 800 shown in FIG. 22 at a subsequent stage of manufacturing in accordance with an embodiment of the present disclosure. A thermal treatment act is performed to anneal the structure 800 and activate the species implanted during the chain implant as described above with reference to FIG. 21, SO that the three implants of the chain implant essentially merge together to form doped regions 820 and 820'.

An isotropic wet oxide etch is used to etch the material 807 and 807', and this etch will also etch the materials 856 and 856'. In some embodiments, the etched materials 807 and 807' comprise silicon dioxide and the etching is performed using a timed hydrofluoric acid etch.

Layers of material 841 and 841' are formed. In some embodiments, the materials 841 and 841' comprise silicon dioxide formed via thermal oxidation of the silicon of the layers 808 and 808'. During this thermal oxidation act, the upper exposed surface of the plug material 823 is also oxidized to form a layer of silicon dioxide 816 at the upper exposed surface of the plug material 823. In some embodiments, the materials 841 and 841' are grown to a thickness ranging from about 100 to about 400 Angstroms, and may be grown to a thickness of about 200 Angstroms. The materials 841 and 841' ultimately form the gate dielectric material or gate oxide 841 and 841' for the MOSFETs 680' and 680 of FIG. 6, respectively. As a result, the thicknesses of the materials 841 and 841' are linearly related to the threshold voltages $V_{TH}$ of MOSFETs 680' and 680, respectively. Accordingly, control of the thicknesses of the materials 841 and 841' provides another mode for adjustment of the threshold voltages $V_{TH}$ Of MOSFETs 680' and 680 which does not require alterations of masking tooling.

A blanket layer of electrically conductive material is formed after the dielectric materials 841 and 841' have been formed. In some embodiments, a layer of polycrystalline silicon 891 is conformally deposited to a thickness of about 1000 Angstroms. In addition, a layer of photoresist is spun on and baked over the layer of polycrystalline silicon 891, and then portions of this layer of photoresist are removed to form photoresist layers 892 and 892' and to expose portions of the layer of polycrystalline silicon 891.

Figure 31:
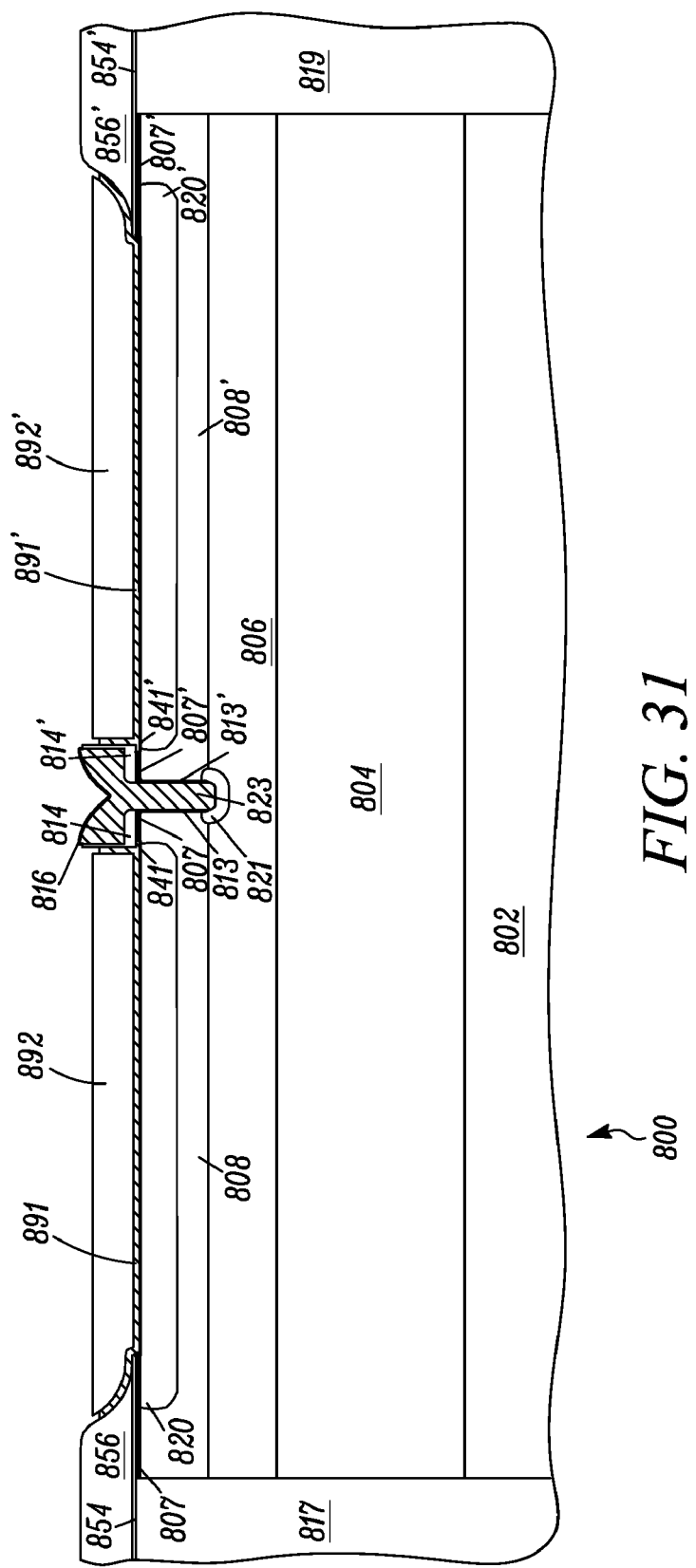
FIG. 31 is a cross section view of the structure shown in FIG. 30 at a subsequent stage of manufacturing in accordance with an embodiment of the present disclosure.

FIG. 31 is a cross section view of structure 800 at a subsequent stage in processing. The layer of polycrystalline silicon 891 is etched to remove portions of polycrystalline silicon 891, leaving polysilicon layers 891 and 891'.

Figure 32:
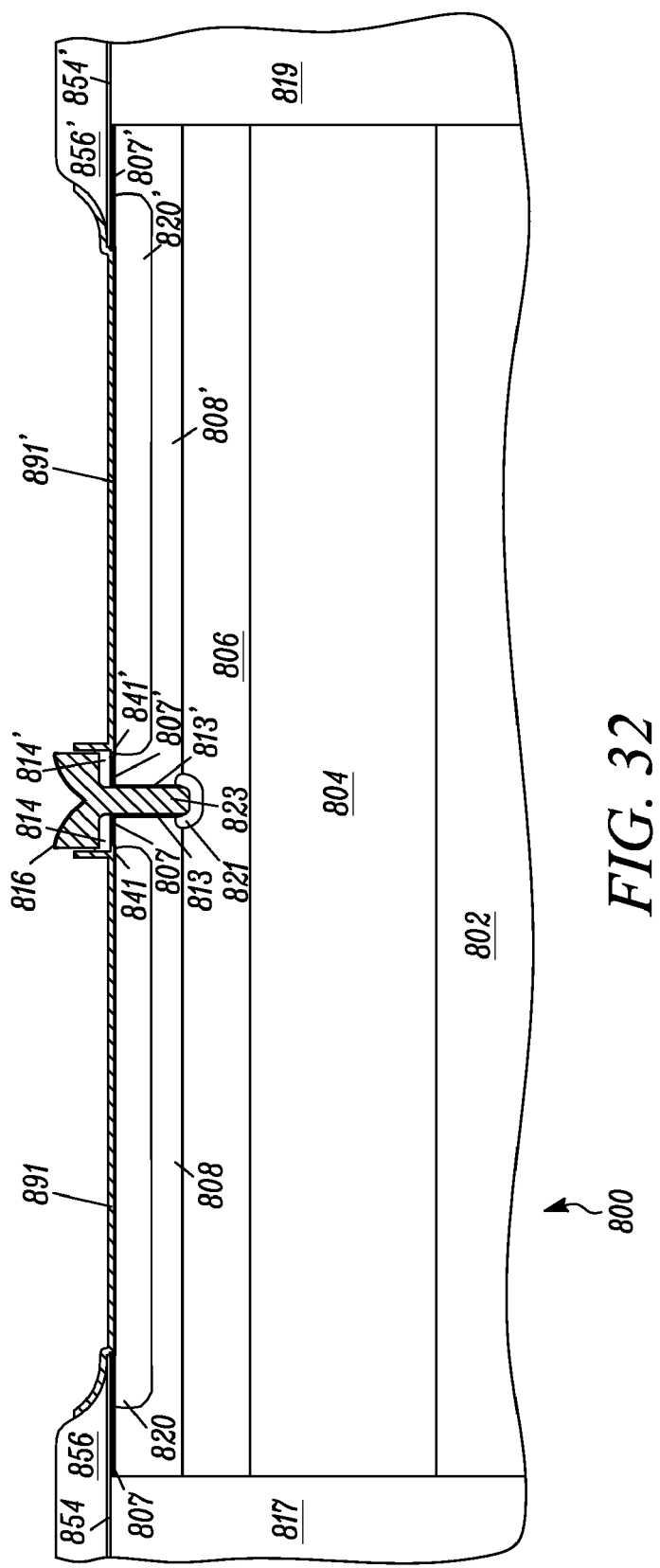
FIG. 32 is a cross section view of the structure shown in FIG. 31 at a subsequent stage of manufacturing in accordance with an embodiment of the present disclosure.

FIG. 32 is a cross section view of structure 800 at a subsequent stage in processing. FIG. 32 shows the result of removing the photoresist 892 and 892' and a result of an anisotropic wet nitride etch of the materials 814 and 814'. In some embodiments, the etching of materials 814 and 814' is done using a timed hot phosphoric acid etch to form gaps between the materials 891 and 823 and between the materials 891' and 823.

Figure 33:
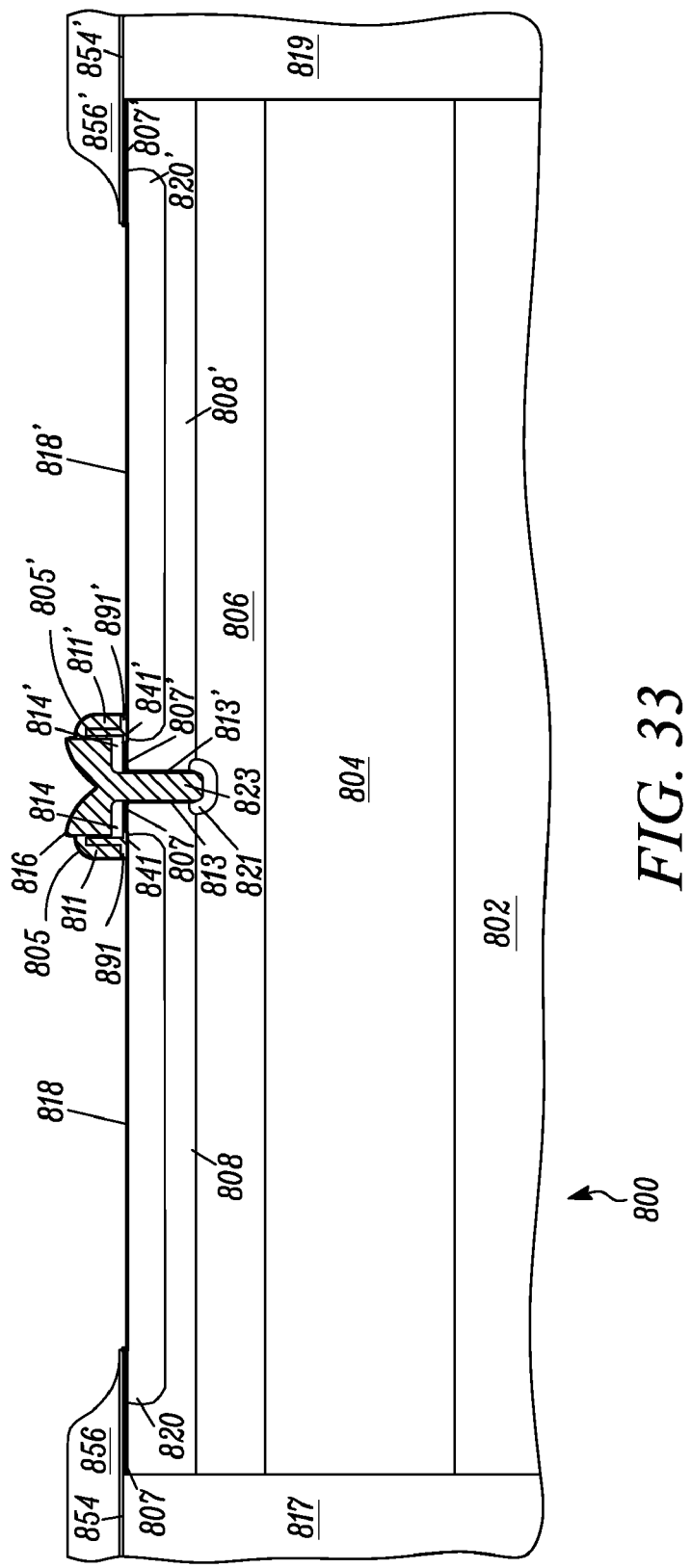
FIG. 33 is a cross section view of the structure shown in FIG. 32 at a subsequent stage of manufacturing in accordance with an embodiment of the present disclosure.

FIG. 33 is a cross section view of structure 800 at a subsequent stage in processing. Another layer of electrically conductive material such as, for example, polycrystalline silicon having a thickness of about 2000 Angstroms, is deposited and then is etched, resulting in sidewall structures 811 and 811' on portions of polysilicon materials 891 and 891'. Conductive polysilicon materials 811 and 811' also have portions in the gaps between the materials 891 and 823, and between the materials 891' and 823 to form a "bridge" or coupling structure to electrically couple electrically conductive materials 891 and 823 and 891' and 823, wherein conductive materials 891, 891', 811, 811', and 823 form a homogeneous or contiguous electrically conductive structure or material such that a portion 823 extends to doped region 821, portions 811 and 891 are over gate oxide layer 841, and portions 811' and 891' are over gate oxide layer 841'.

In some embodiments, the materials 811, 811', 891, and 891' comprise phosphorous doped n-type polycrystalline silicon. In other embodiments, materials 891 and 891' may be undoped polysilicon as deposited, and then may be doped by subsequent implant acts.

A subsequent thermal oxidation process is then performed that continues to thicken the layer of silicon dioxide 816 at the upper exposed surface of the plug material 823, and also forms layers of silicon dioxide 805 and 805' over the exposed surfaces of the polysilicon materials 811, 811', 891, and 891', respectively. Further, this subsequent thermal oxidation process also forms the silicon dioxide layers 818 and 818' on p-type regions 820 and 820', respectively. In some embodiments, layers 818 and 818' may be thicker than layers 841 and 841', respectively.

Figure 34:
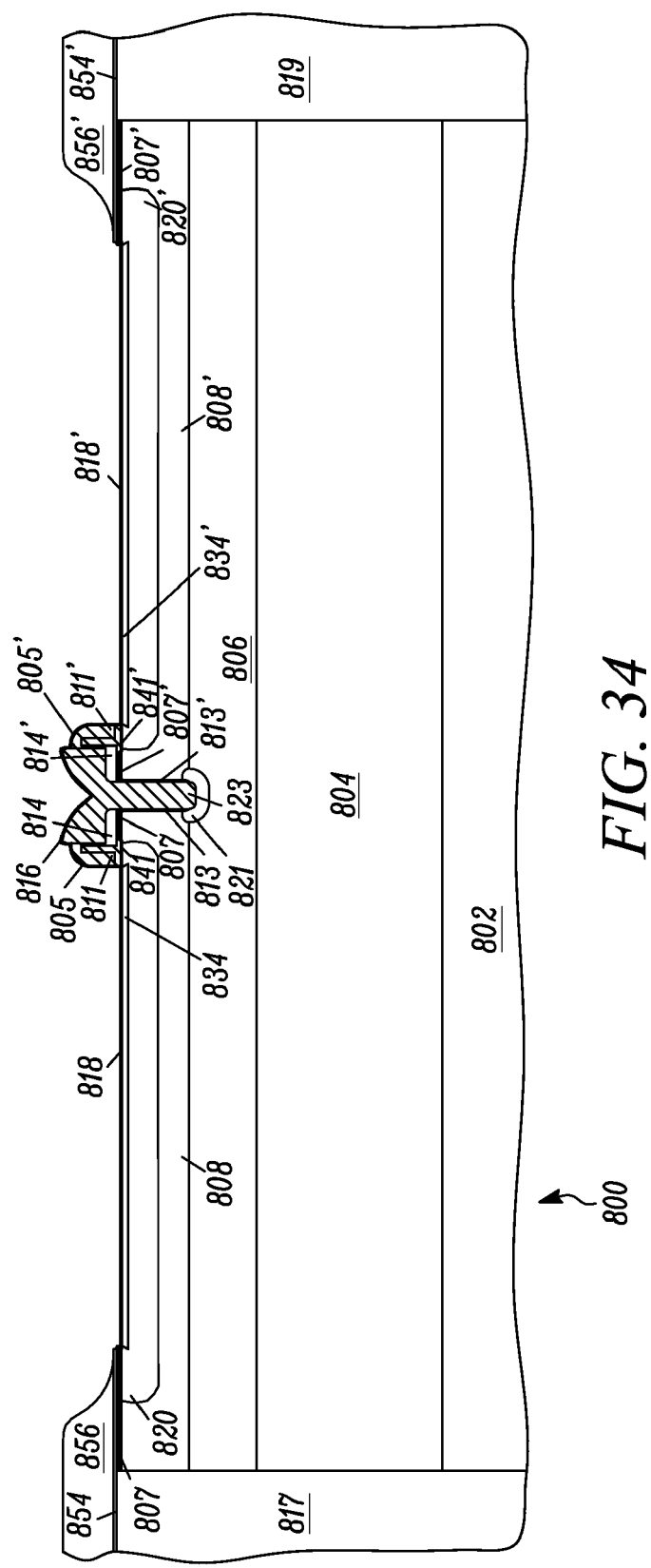
FIG. 34 is a cross section view of the structure shown in FIG. 33 at a subsequent stage of manufacturing in accordance with an embodiment of the present disclosure.

FIG. 34 is a cross section view of structure 800 at a subsequent stage in processing. FIG. 34 shows the result of an ion implantation to provide dopant that forms n-type doped regions 834 and 834'. In some embodiments, the implantation includes implanting phosphorous or arsenic at a dose of about $2 \times 10^{14}$ ions/cm$^2$, at an energy of about 60 keV. Portions of the doped regions 834 and 834' respectively correspond to sources 682' and 682 of MOSFETs 680' and 680 of FIG. 6, to the emitters 642' and 642 of the NPN transistors 640' and 640, and to the resistors 650' and 650. In some embodiments, the structure shown in FIG. 34 may be further processed using processes similar to those processes described above with reference to FIGS. 26 to 28.

In the preceding description, characteristics of transient suppression devices were described, and examples illustrating operation, circuit realization and fabrication aspects were discussed. In the following description, several applications for which the transient suppressor of the present disclosure is suited are presented. More particularly, applications in this section include a standalone component, an integrated circuit and an RF amplifier.

Figure 35:
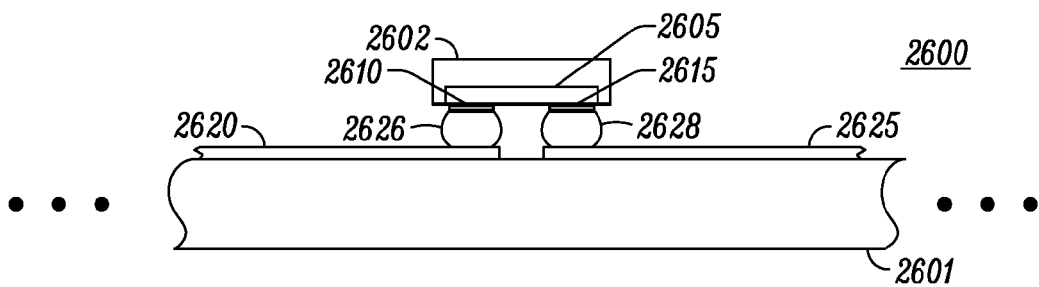
FIG. 35 is a cross section view of a stand-alone component embodiment incorporating at least one transient suppression device of the present disclosure.

FIG. 35 is a cross section view of a stand-alone, discrete component 2600 embodiment incorporating the transient suppression device of the present disclosure. FIG. 35 shows a substrate 2601 for an electronic device, optional dielectric packaging material 2602, and a transient suppression device 2605 formed in the material 2602. Transient suppression device 2605 may have similar structure, or the same structure, as the transient suppression device 105 described above. Transient suppression device 2605 includes a terminal 2610 and a terminal 2615 (analogous to first and second terminals 110, 115 of FIG. 1, for example) that are coupled to interconnections or interconnects 2626 and 2628. Interconnections 2626 and 2628 are coupled to conductors 2620 and 2625, respectively, wherein conductors 2620 and 2625 are formed on the substrate 2601.

In some embodiments, the substrate 2601 may be a ceramic or composite dielectric material such as materials conventionally employed in formation of hybrid circuits, or may be a printed circuit board (PCB) or other basal member. The first and second interconnections 2626 and 2628 may be bump interconnections forming conductive interconnections that may also provide mechanical stability, and may be formed using metals or metallic components that are melted to secure the various components together, or may be formed using conductive polymers such as conventional conductive epoxies. Bump Interconnects 2626 and 2628 are external interconnections for electrically coupling terminals 2610 and 2615 to interconnects or circuitry external to the discrete component 2600.

In some embodiments, when intended for such standalone applications, the transient suppression device 2605 may be formed using a silicon substrate that is heavily doped to be n-type. In other words, the example structure 800 of FIG. 8 was shown as employing a p+ type substrate 802 and lightly p-type doped mu layer 804. That embodiment addresses facilitation of formation of the transient suppression device, for example, together with some other types of integrated circuit elements, for example CMOS or bipolar transistors. That embodiment also includes capacitive isolation between various circuit elements, but these portions of that embodiment may not be needed in some applications. As discussed above, in some embodiments, p-type regions 802 and 804 may be optional. For example, in embodiments wherein device 105 is a discrete device that will be bump attached, epitaxial layer 808 could be formed on a heavily doped n-type substrate. In these embodiments, contact to device 105 would be through contact regions 810 and 815 and there would be no contact or attaching to the back of the die as the n-type substrate would be floating.

In the example of FIG. 35, when a voltage stress begins to manifest across the conductors 2620 and 2625, the transient suppression device 2605 begins to conduct, as described above with respect to FIGS. 2 through 10. As a result, one or more voltage-sensitive components that are also coupled to the conductors 2620 and 2625 are only exposed to voltage excursions limited to a predetermined range, with the result that an electronic assembly incorporating the transient suppression device 2605 is relatively more robust with respect to electrical disturbances compared to other transient suppression devices. While the example of FIG. 35 is illustrated in flip-chip form, it will be appreciated that other techniques for coupling the transient suppression device 2605 to a circuit element for which electrical stress protection is desirable may also be employed, such as pins that couple to sockets, zero insertion force or ZIF interconnections, bond wires and the like.

Figure 36:
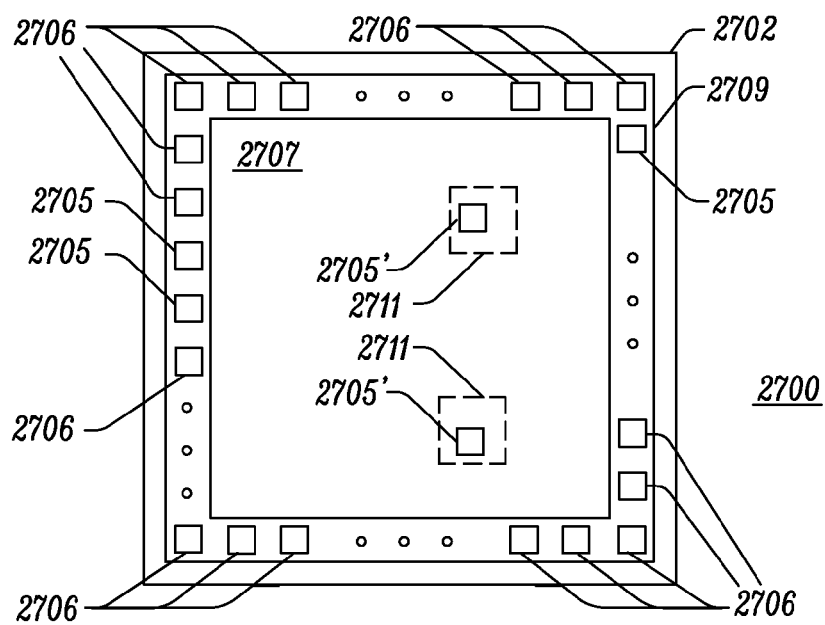
FIG. 36 is a simplified plan view of an integrated circuit embodiment incorporating one or more of the transient suppression devices of the present disclosure.

FIG. 36 is a simplified plan view of an integrated circuit embodiment 2700 incorporating one or more of the transient suppression devices of the present disclosure. FIG. 36 shows a substrate 2702 including semiconductive material, portions including one or more transient suppression devices 2705 and 2705', interconnection sites 2706, some of which may incorporate a transient suppression device 2705, a portion 2707 incorporating one or more transistors or electronic switching or amplification devices and an interconnection region 2709.

The portion 2707 may comprise digital circuitry, analog circuitry or both. At one or more selected points 2711 within the portion 2707 that otherwise could present liability or fragility with respect to transient electrical stresses, a transient suppression device 2705' may be incorporated. The peripheral interconnection region 2709 often presents particularized vulnerability to environmentally-related electrical voltage stresses or excursions, for example due to electrostatic discharge encountered in handling or mounting of the integrated circuit 2700, or causing electrical disturbance at an exterior connection point connected to the peripheral interconnection portion 2709. For at least this reason, one or more transient suppression devices 2705 may be incorporated in the interconnection region 2709.

When signals exchanged between the integrated circuit 2700 and electrical apparatus external to the integrated circuit 2700 are required to be high frequency RF signals or to have sharply-delineated time characteristics, such as rising or falling edges of high speed digital signals, capacitive or other RF loading of the interconnections is an important concern. In these types of applications, such loading may be reduced by forming the interconnections atop structures providing dielectric isolation of the interconnections from conductive portions of the integrated circuit 2700. As examples, the isolation structures 817 and 819 of FIG. 8 provide increased electrical isolation of the interconnections 810 and 815 from circuit elements formed using substrate 802 and also increased electrical isolation from the substrate 802 itself, in comparison to many other approaches. The isolation structures 817 and 819 may be formed to have a relative dielectric constant $\in_R$ of that of silicon dioxide or to have a relative dielectric constant $\in_R$ that is substantially less than that of silicon dioxide, and may be formed to have a depth extending into the substrate which may be several micrometers or which may be ten or more micrometers.

Figure 37:
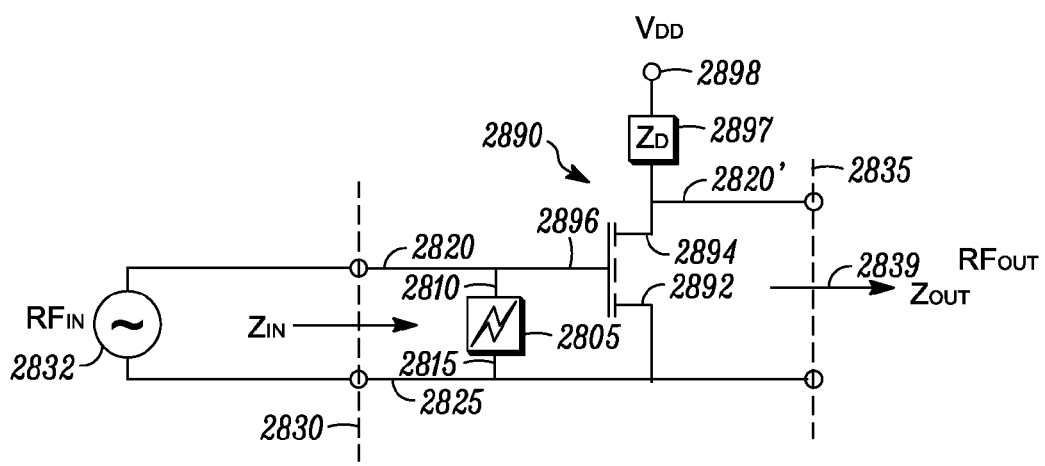
FIG. 37 is a simplified schematic diagram of a RF amplifier embodiment including at least one transient suppression device of the present disclosure.

FIG. 37 is a simplified schematic diagram of a RF amplifier 2800 embodiment including at least one transient suppression device of the present disclosure. FIG. 37 depicts the amplifier 2800 to include a transient suppression device 2805 having first and second conductors 2810 and 2815 that, in turn, are coupled to an input port 2830 (represented in part by a dashed vertical line). Transient suppression device 2805 may have similar structure, or the same structure, as the transient suppression device 105 described above. The input port 2830 couples an RF input signal 2832 $RF_{IN}$ to the amplifier 2800. The amplifier 2800 also includes an output port 2835 (represented in part by a dashed vertical line) that couples an output signal 2839 $RF_{OUT}$ to other circuitry (not shown). A FET 2890 having a first power electrode or source 2892 and a second power electrode or drain 2894 and a control or gate electrode 2896 is shown as being coupled in a common-source amplifier configuration, with the source 2892 being coupled to the conductor 2825 and the gate 2896 being coupled to the second conductor 2820. The drain 2894 is coupled through a suitable circuit $Z_D$ 2897 to terminal 2898 to receive a power supply voltage $V_{DD}$ and is also coupled to the output port 2835.

When the amplifier 2800 is intended to provide gain together with high linearity, such as a class A or a class AB amplifier, it is important that the transient suppression device 2805 not introduce clipping or otherwise distort the input signal 2832 $RF_{IN}$. One reason that a symmetric IV curve, such as shown in FIG. 2, is desirable in some applications for a transient suppression device 2805 is that the origin of the IV curve can be made to be coincident with the average of the input signal 2832 $RF_{IN}$, with the voltages $V_{TO}$ and $-V_{TO}$ falling outside of a region of maximum excursion for the input signal 2832 $RF_{IN}$.

Improved apparatuses, processes and techniques have been disclosed for electrical stress protection elements that may be utilized as a discrete component or co-integrated with other types of circuitry. The disclosed electrical stress protection devices have the capacity for repeated electrical stress relief that provide for relatively rapid and effective abatement of electrical stresses, appropriate peak current-carrying capacities, relatively high switching ON and OFF speeds, automatic capability for resetting to the OFF state when appropriate, bidirectional conduction properties, relative immunity or reduced sensitivity to false triggering, threshold voltages that are programmable during manufacturing that are realized via relatively few processing operations, relatively less electrical loading of other electrical circuitry that may result in reduced DC and RF signal loading characteristics, and threshold characteristics tailorable to specific criteria during manufacturing without necessarily requiring modification of tooling.

It will be appreciated that while the disclosure describes transient suppressor devices in the context of silicon integrated circuits, the concepts are equally applicable to other types of devices susceptible to electrical stress effects. For example, such transient suppressor devices find utility in large-scale integrated circuits and microprocessors, in electro-optical devices, and in microwave acoustic and micromechanical devices, and in other applications.

The disclosed MOS transient suppression device exemplifies advantages and characteristics fulfilling long apparent needs within the industry. These benefits include, among other things, programmability within appropriate ranges via simple adjustments during microfabrication, relatively high switching speed, relatively high peak current-carrying capability, bidirectionally symmetric performance, and ready compatibility with standard CMOS processing parameters, equipment and design rules.

Although the description above employs language specific to exemplary structural features and/or methodological acts, it is to be understood that the appended claims are not limited to the specific features or acts described. Rather, the specific features and acts are disclosed as exemplary forms of implementing these disclosed concepts.

What is claimed is:

1. A semiconductor device, comprising:
    a semiconductor substrate having a first surface and a second surface;
    an electrical stress protection device, wherein the electrical stress protection device comprises:
    a doped region having a first surface over the first surface of the semiconductor substrate; and
    a dielectric structure, wherein at least a portion of the dielectric structure is in a region separated from the doped region and is below a plane that is substantially coplanar to the first surface of the doped region, wherein the portion of the dielectric structure below the plane has a height of at least about three microns and a width of at least about five microns;
    wherein the semiconductor device is an integrated circuit comprising the electrical stress protection device and a field effect transistor (FET), wherein the FET has a gate, a gate oxide layer under at least a portion of the gate, a source region, a drain region, and a channel region between the source region and the drain region and below the gate oxide layer and wherein the dielectric structure is between the doped region of the electrical stress protection device and the channel region of the FET;
    wherein the semiconductor substrate is a p-type semiconductor substrate and further comprising:
    a p-type epitaxial semiconductor material over the semiconductor substrate, wherein the doping concentration of the p-type epitaxial semiconductor material is less than the doping concentration of the p-type semiconductor substrate;

a first n-type semiconductor material over the p-type epitaxial semiconductor material; a second n-type semiconductor material over the first n-type semiconductor material, wherein the doping concentration of the second n-type epitaxial semiconductor material is less than the doping concentration of the first n-type semiconductor material, wherein the first surface of the doped region is substantially coplanar to a first surface of the second n-type semiconductor material and wherein at least a portion of the dielectric structure extends from the plane into the semiconductor substrate.

2. The semiconductor device of claim 1, wherein the semiconductor device is a discrete component.

3. The semiconductor device of claim 1, wherein electrical stress protection device comprises a first conductor and a second conductor, wherein at least a portion of the first conductor is over the first surface of the doped region and at least a portion of the first conductor is over the dielectric structure, and wherein at least a portion of the first conductor contacts the doped region at the first surface of the doped region.

4. The semiconductor device of claim 3, further comprising a first external conductive interconnect coupled to the first conductor and a second external conductive interconnect coupled to the second conductor.

5. The semiconductor device of claim 4, wherein the first external conductive interconnect and the second external conductive interconnect are bump interconnections.

6. The semiconductor device of claim 1, wherein the electrical stress protection device is an electrical voltage transient suppression device.

7. The semiconductor device of claim 1, wherein the electrical stress protection device is a non-linear, voltage clipping mechanism.

8. The semiconductor device of claim 1, wherein the electrical stress protection device is a bidirectional electrostatic discharge (ESD) protection device.

9. The semiconductor device of claim 1, wherein the electrical stress protection device is a bidirectional polarity, voltage transient protection device comprising a first terminal and a second terminal and having at least two modes of operation comprising an OFF mode and an ON mode, wherein the amount of electrical current flowing through the electrical stress protection device is less in the OFF mode compared to the amount of electrical current flowing through the electrical stress protection device in the ON mode.

10. The semiconductor device of claim 9,
wherein the electrical stress protection device transitions from the OFF mode to the ON mode if a voltage difference approximately equal to, or greater than, a predetermined turn-on voltage is applied across the first and second terminals of the electrical stress protection device; and
wherein the electrical stress protection device transitions from the ON mode to the OFF mode if a voltage difference less than the predetermined turn-on voltage is applied across the first and second terminals of the electrical stress protection device.

11. The semiconductor device of claim 10, wherein the predetermined turn-on voltage is less than about seven volts.

12. The semiconductor device of claim 10, wherein the electrical stress protection device comprises a first bipolar transistor having a turn-on voltage of $V_{BE1}$, a second bipolar transistor having a turn-on voltage of $V_{BE2}$, and a field effect transistor (FET) having a threshold voltage of $V_{TH}$, wherein the predetermined turn-on voltage ($V_{TO}$) is approximately equal to the sum of $V_{BE1}$, $V_{BE2}$, and $V_{TH}$, that is, $V_{TO} \cong V_{BE1} + V_{BE2} + V_{TH}$, wherein the magnitude of the predetermined turn-on voltage is symmetric about a predetermined reference voltage.

13. The semiconductor device of claim 12,
wherein the first bipolar transistor is a bipolar PNP transistor;
wherein the second bipolar transistor is a bipolar NPN transistor; and
wherein a current gain of the first bipolar transistor, $\beta_{PNP}$, is less than the current gain of the second bipolar transistor, $\beta_{NPN}$.

14. The semiconductor device of claim 13, wherein the product of the current gains of the first bipolar transistor and the second bipolar transistor is less than unity, that is, $\beta_{NPN} * \beta_{PNP} < 1$.

15. The semiconductor device of claim 9, wherein the response time of the electrical stress protection device is about one nanosecond or less.

16. The semiconductor device of claim 9, wherein a turn-on time ($T_1$ to $T_2$) of the electrical stress protection device is less than about one nanosecond and wherein a turn-off time ($T_1'$ to $T_2'$) of the electrical stress protection device is less than about one nanosecond.

17. The semiconductor device of claim 1, wherein the dielectric constant of the dielectric structure is about 3.9 or less.

18. The semiconductor device of claim 1, wherein the dielectric constant of the dielectric structure is about 1.5 or less.

19. The semiconductor device of claim 1, wherein the dielectric constant of the dielectric structure is approximately equal to or less than the dielectric constant of silicon dioxide.

20. The semiconductor device of claim 1, wherein the dielectric structure comprises silicon dioxide.

21. The semiconductor device of claim 1, further comprising an active region, wherein the active region comprises the doped region, wherein the dielectric structure surrounds the active region, and wherein the dielectric structure comprises oxide.

22. The semiconductor device of claim 1, wherein the dielectric structure includes at least one air gap.

23. The semiconductor device of claim 1, wherein the dielectric structure includes a plurality of air gaps.

24. The semiconductor device of claim 1, wherein the dielectric structure includes a plurality of sealed air gaps.

25. The semiconductor device of claim 1, wherein the dielectric structure includes a plurality of closed cells.

26. The semiconductor device of claim 1, wherein the dielectric structure is a solid dielectric structure substantially devoid of any air gaps.

27. The semiconductor device of claim 1, wherein the dielectric structure includes a plurality of vertical structures.

28. The semiconductor device of claim 27, wherein the plurality of vertical structures support an electrical interconnect, a passive component, or an active device over the dielectric structure.

29. The semiconductor device of claim 1, wherein the dielectric structure is a dielectric support structure to support an electrical interconnect, a passive component, or an active device over the dielectric support structure.

30. The semiconductor device of claim 1, wherein the dielectric structure is formed prior to forming the doped region.

31. The semiconductor device of claim 1, further comprising an electrically conductive material comprising a metal over the doped region and over the dielectric structure, wherein the dielectric structure contacts the doped region at the first surface of the doped region.

32. The semiconductor device of claim 31, wherein the dielectric structure is between a majority of the electrically conductive material and the semiconductor substrate to reduce capacitance between the electrically conductive material and the semiconductor substrate.

33. The semiconductor device of claim 1, wherein all of, or substantially all of, the dielectric structure, is below the plane.

34. The semiconductor device of claim 1, further comprising a layer of semiconductor material over the semiconductor substrate, wherein a dielectric layer is over at least a portion of the layer of semiconductor material, wherein the dielectric layer has a first surface and a second surface, and wherein a first surface of the dielectric structure is substantially coplanar to the first surface of the dielectric layer, and wherein the second surface of the dielectric layer is substantially coplanar to the surface of the semiconductor material.

35. The semiconductor device of claim 1, wherein the height of the portion of the dielectric structure below the plane ranges from about three microns to about thirty microns.

36. The semiconductor device of claim 1, further comprising an active region, wherein the active region comprises the doped region, wherein the dielectric structure is adjacent to an outer portion of the active region, wherein the dielectric structure is a first dielectric structure and further comprising a second dielectric structure adjacent to another outer portion of the active region, wherein at least a portion of the second dielectric structure is below the plane that is substantially coplanar to the first surface of the doped region, and wherein the portion of the second dielectric structure below the plane has a height of at least about three microns and a width of at least about ten microns.

37. The semiconductor device of claim 36, wherein the first dielectric structure is separated from the second dielectric structure by about twenty microns or less.

* * * * *